United States Patent
Ito et al.

(10) Patent No.: US 7,312,400 B2
(45) Date of Patent: Dec. 25, 2007

(54) MULTILAYER WIRING BOARD, BASE FOR MULTILAYER WIRING BOARD, PRINTED WIRING BOARD AND ITS MANUFACTURING METHOD

(75) Inventors: Shoji Ito, Sakura (JP); Osamu Nakao, Sakura (JP); Reiji Higuchi, Sakura (JP); Masahiro Okamoto, Sakura (JP)

(73) Assignee: Fujikura Ltd., Tokyo (JP)

( * ) Notice: Subject to any disclaimer, the term of this patent is extended or adjusted under 35 U.S.C. 154(b) by 553 days.

(21) Appl. No.: 10/505,094

(22) PCT Filed: Feb. 21, 2003

(86) PCT No.: PCT/JP03/01916

§ 371 (c)(1),
(2), (4) Date: Aug. 19, 2004

(87) PCT Pub. No.: WO03/071843

PCT Pub. Date: Aug. 28, 2003

(65) Prior Publication Data

US 2005/0155792 A1    Jul. 21, 2005

(30) Foreign Application Priority Data

| Feb. 22, 2002 | (JP) | ............... 2002-046160 |
| Mar. 6, 2002 | (JP) | ............... 2002-060973 |
| Jun. 27, 2002 | (JP) | ............... 2002-188249 |
| Oct. 28, 2002 | (JP) | ............... 2002-313013 |
| Dec. 20, 2002 | (JP) | ............... 2002-370704 |
| Feb. 6, 2003 | (JP) | ............... 2003-029816 |
| Feb. 20, 2003 | (JP) | ............... 2003-043119 |

(51) Int. Cl.
*H05K 1/00* (2006.01)

(52) U.S. Cl. ............ 174/250; 174/255; 174/257; 174/258; 174/262; 174/264; 428/570; 428/209; 257/689; 257/252; 257/706; 257/637; 257/638; 438/639; 438/640; 324/765

(58) Field of Classification Search ........... 174/250, 174/255, 257, 258, 262–266, 261; 428/570, 428/209; 257/698, 252, 706, 637, 638; 438/639, 438/640; 361/792–795
See application file for complete search history.

(56) References Cited

FOREIGN PATENT DOCUMENTS

| JP | 04-094186 A | 3/1992 |
| JP | 06-006037 A | 1/1994 |
| JP | 2002-026520 A | 1/2002 |

*Primary Examiner*—Dean A. Reichard
*Assistant Examiner*—Xiaoliang Chen
(74) *Attorney, Agent, or Firm*—Sughrue Mion, PLLC

(57) ABSTRACT

A multilayer wiring board assembly component comprises: an insulating substrate component (the insulating resin layer 111); a conductive layer 112 formed on one surface of said insulating substrate component 111 in the form of an electrode pattern; an adhesive layer 113 formed on the other surface of said insulating substrate component 111; and a conductive resin composition 115 with which is filled a through hole passing through said insulating substrate component 111, said adhesive layer and said conductive layer in order to make interlayer interconnection. The bore diameter of the conductive layer portion 114b of the through hole 114 is smaller than the bore diameter of the insulating resin layer portion and the adhesive layer portion 114a to establish electrical connection between the conductive resin composition 115 and the conductive layer 112 by the rare surface 112a of the conductive layer 112.

35 Claims, 52 Drawing Sheets

FIG. 16
(a)
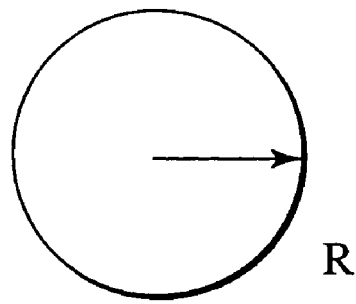
LASER PROCESSING PLANE
(b)
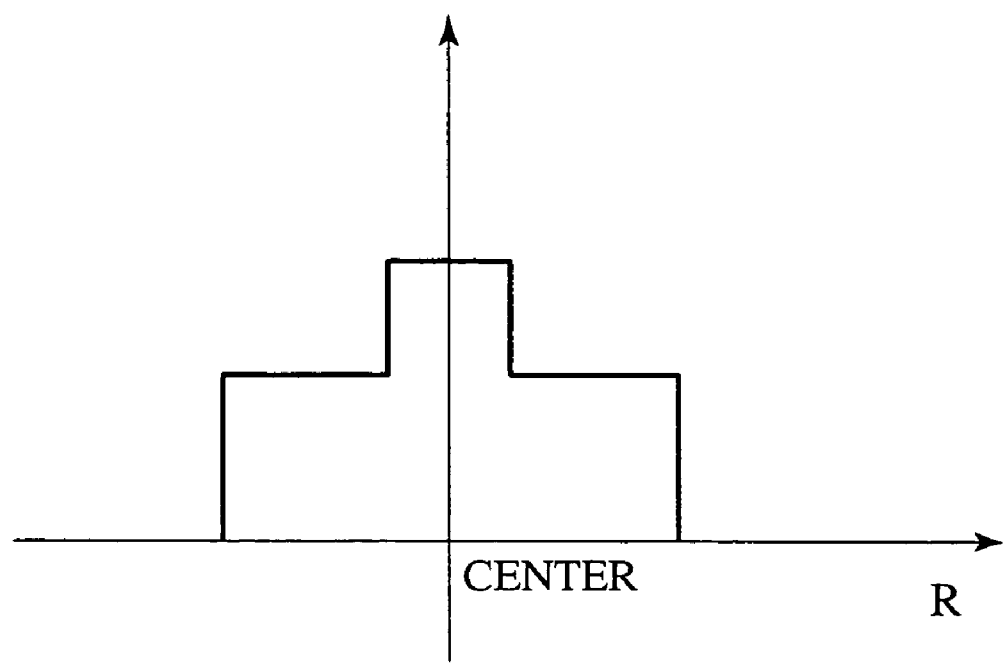

FIG. 25
(a)
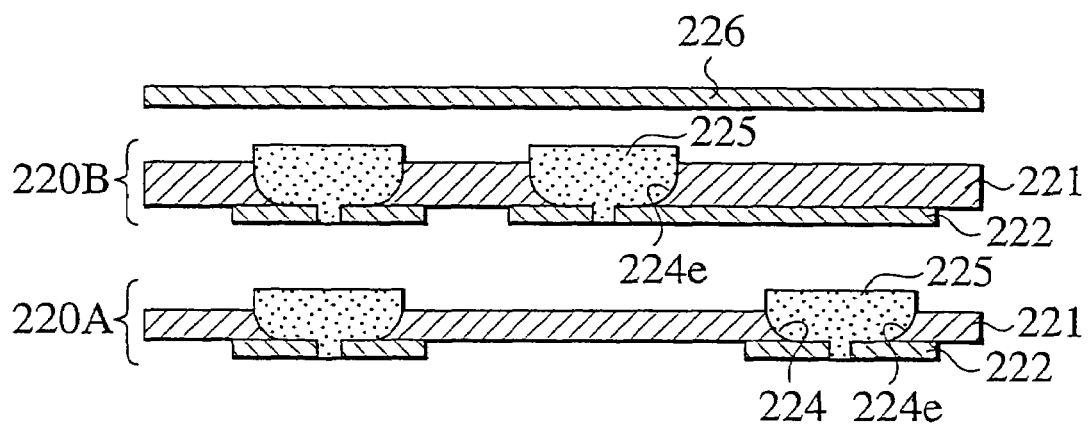
(b)
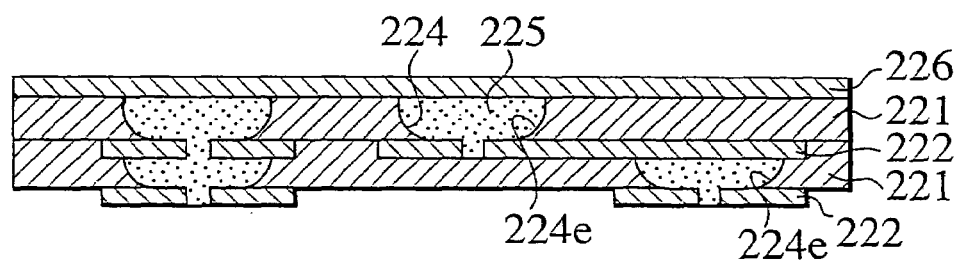
(c)
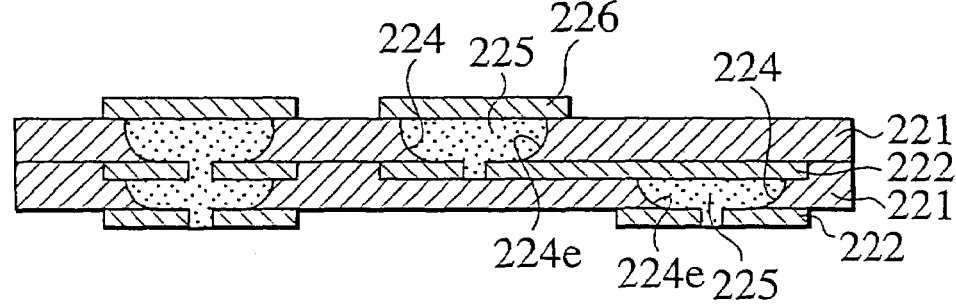

LOCATION WHERE VOIDS TEND TO BE TRAPPED

FIG. 32
(a)
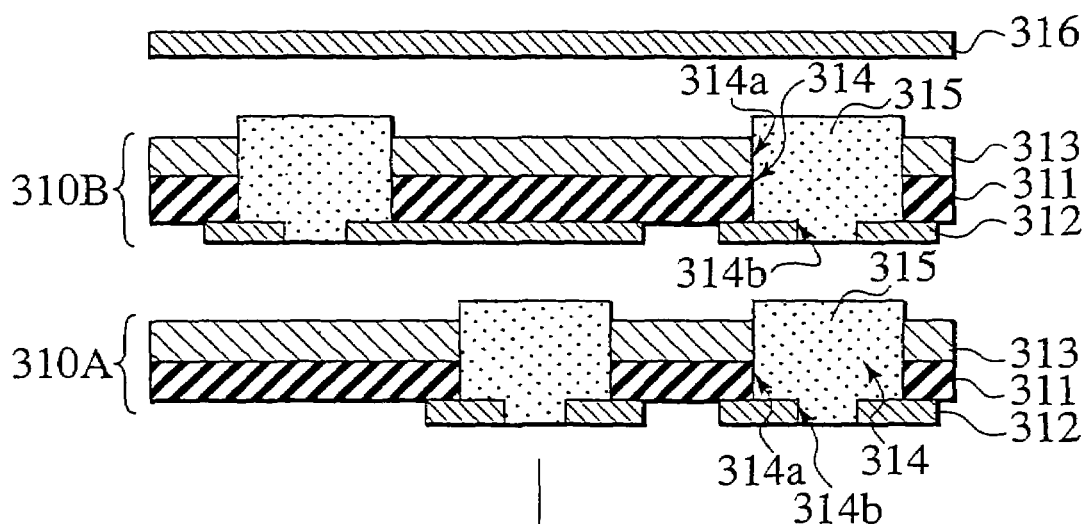
(b)
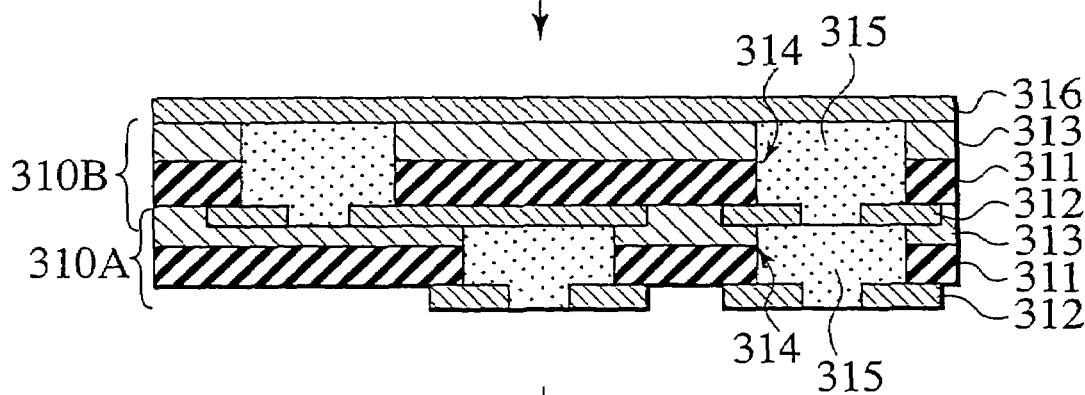
(c)
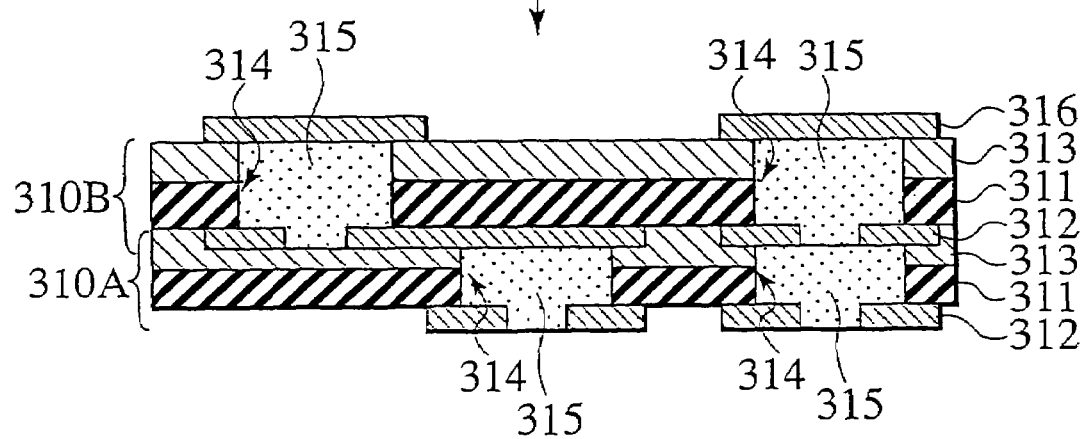

FIG. 45
(a) 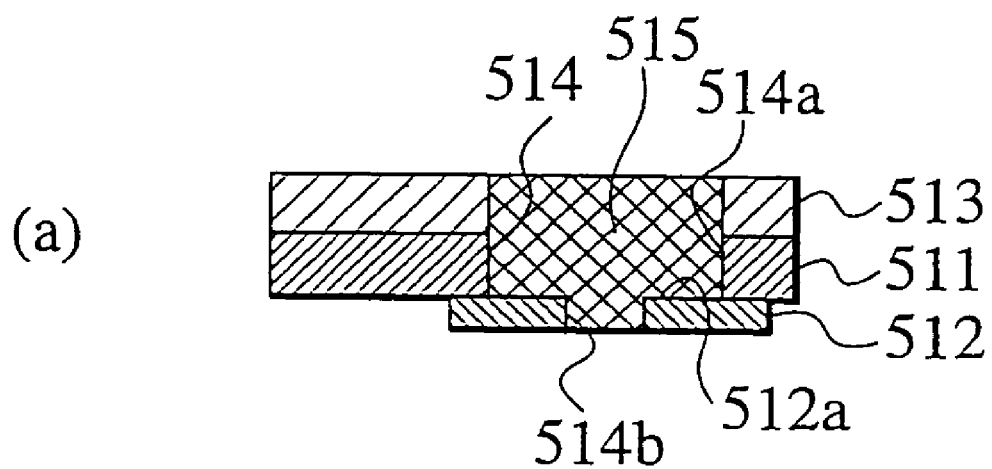
(b) 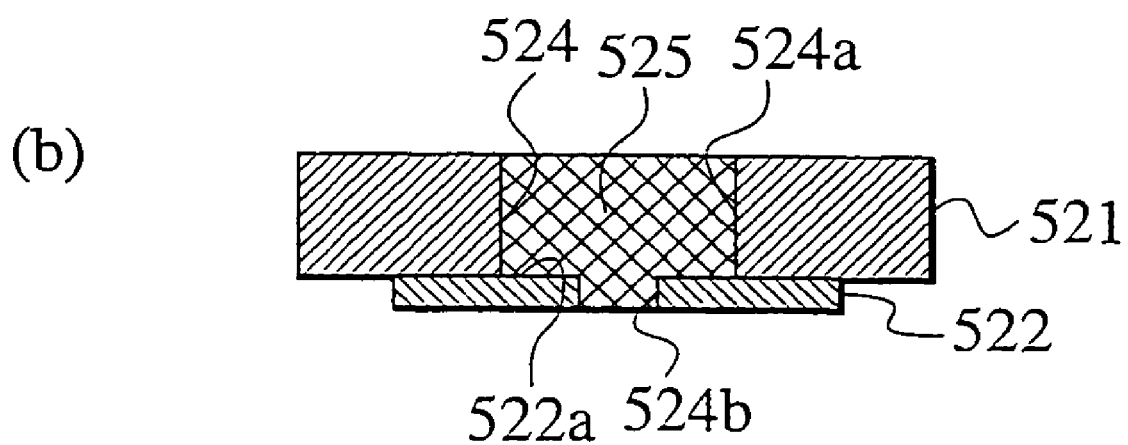

FIG. 50
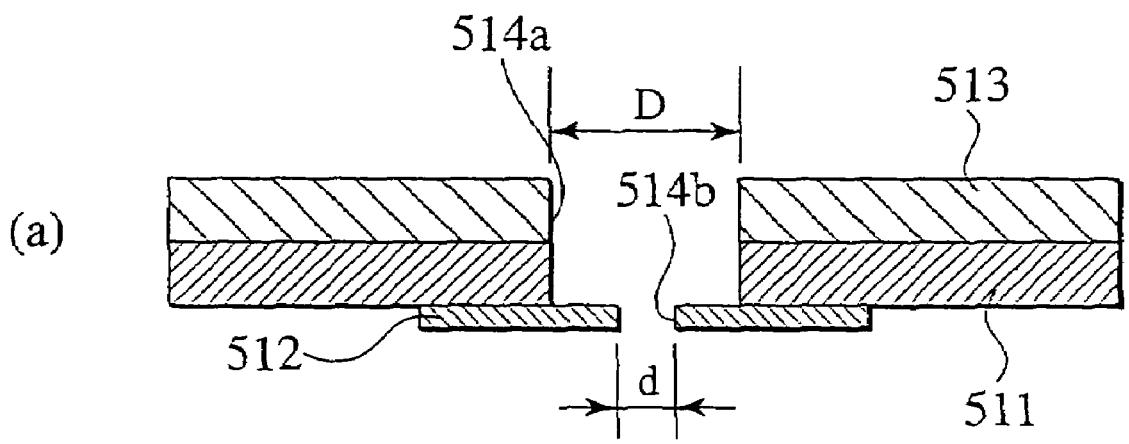
(a)
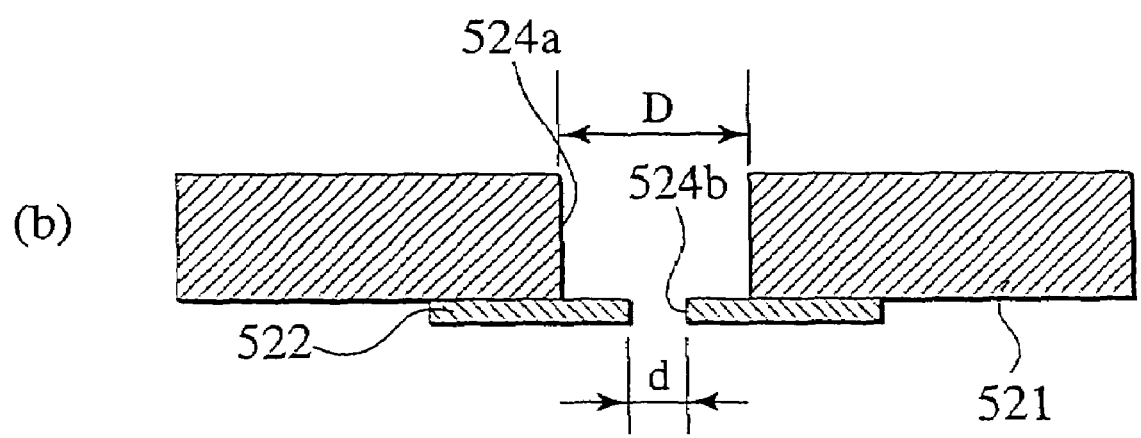
(b)

FIG. 53
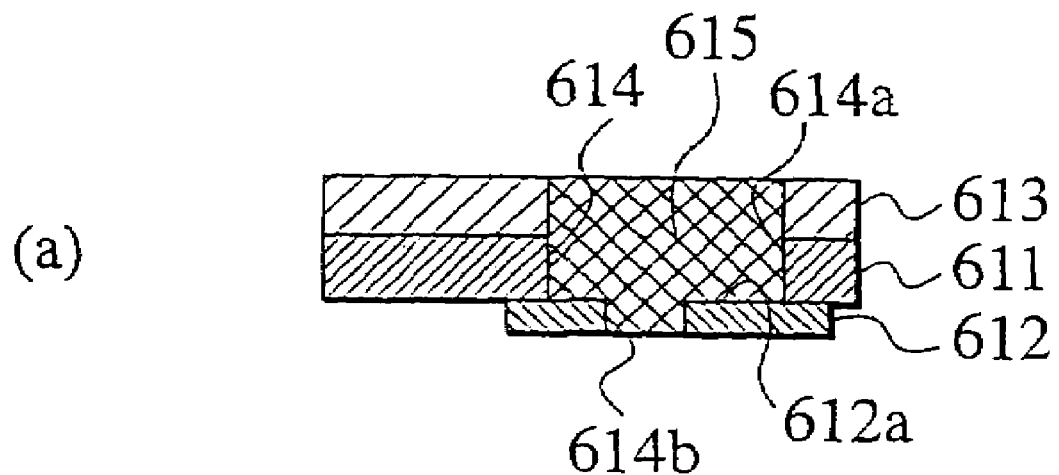
(a)
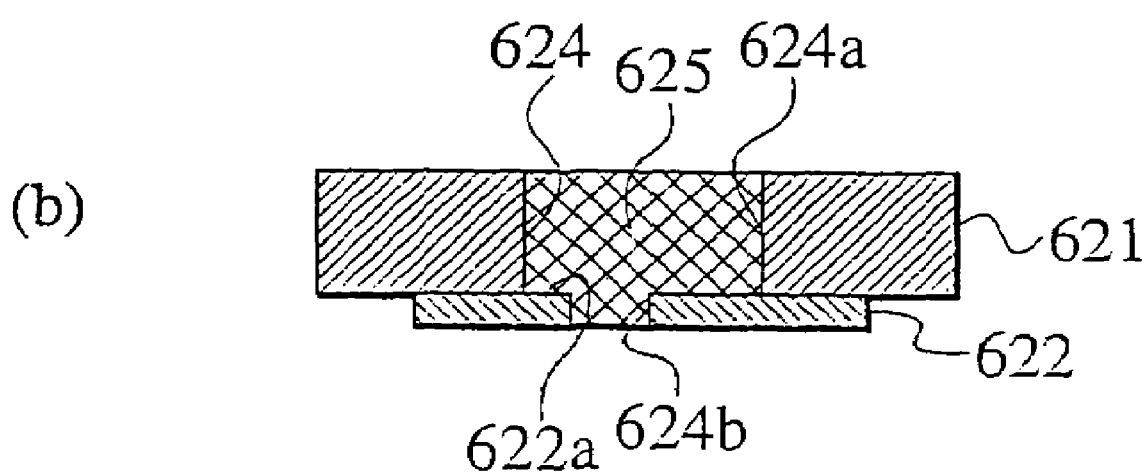
(b)

FIG. 59
(a) 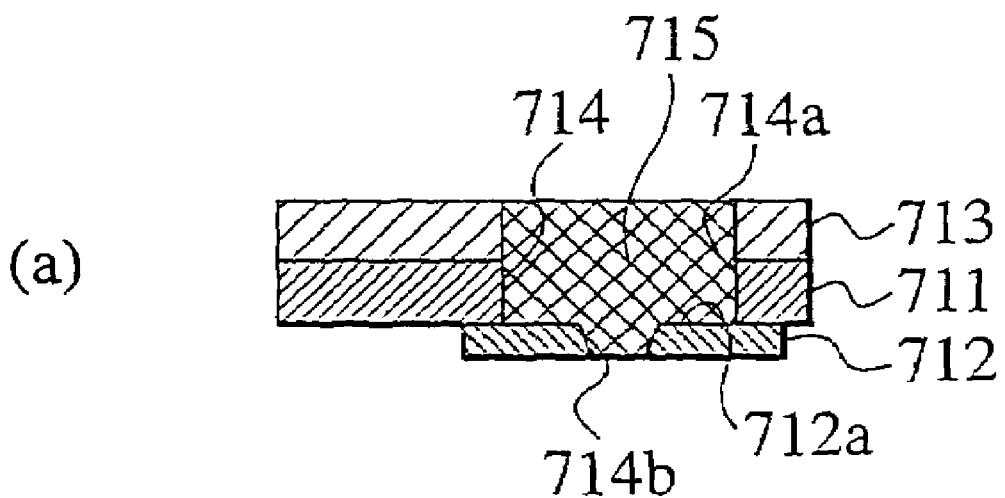
(b) 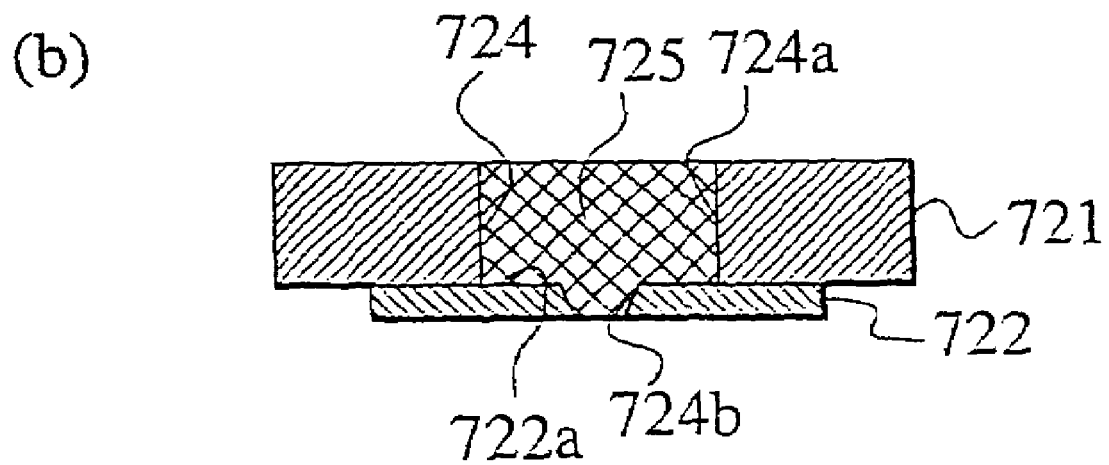

FIG. 65
(a)
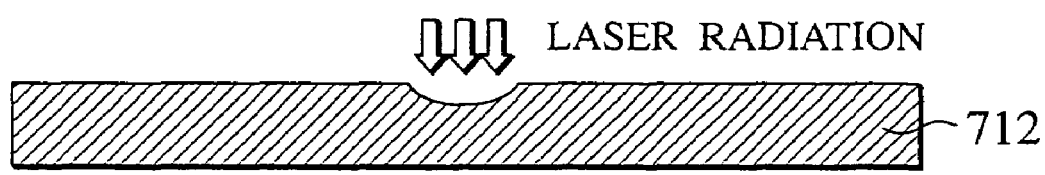
(b)
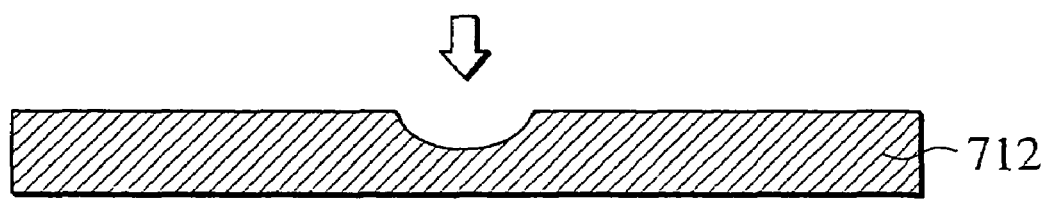
(c)
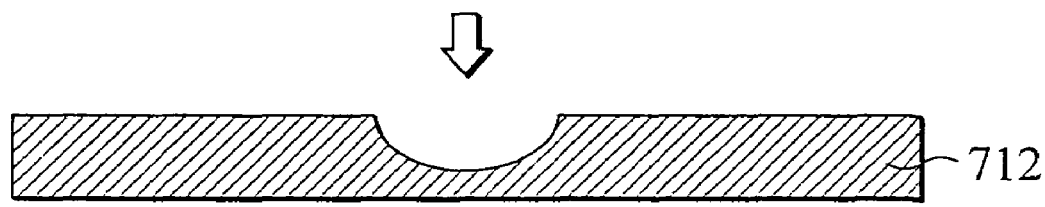
(d)
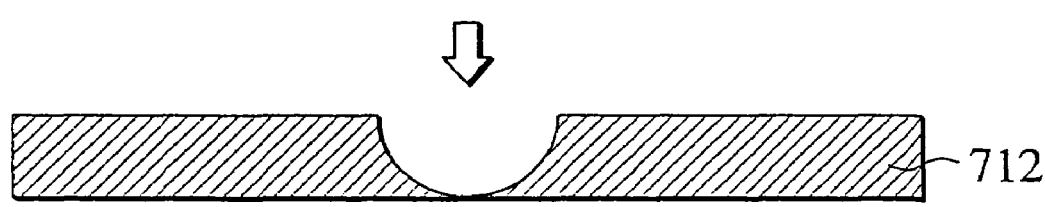
(e)
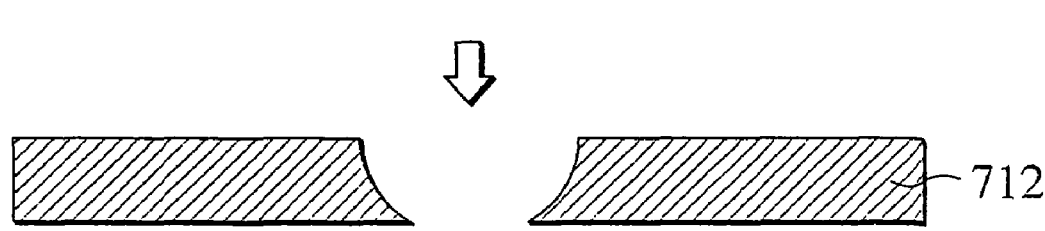

| d/a | <1 | 1~3 | 3< |
|---|---|---|---|
| | Incomplete Filling (No Paste in Small Opening) | Complete Filling | Incomplete Filling (Falling Out) | d: Small Opening Diameter, a: Maximum Diameter Of Metal Particles (b)

| d/D | <0.1 | 0.1~0.5 | 0.5< |
|---|---|---|---|
| | Incomplete Filling (Viods Remain) | Complete Filling | Incomplete Filling (Falling Out) |

D: Via Diameter, d: Small Opening Diameter (c)

| Location of Small Opening | Via Falls Within Small Opening | Via Does Not Falls Within Small Opening |
|---|---|---|
| | Complete Filling | Incomplete Filling (Viods Remain) |

(d)

| α | >90° | 90° | 85~15° | 15°> |
|---|---|---|---|---|
| | Incomplete Filling (No Paste in Small Opening) | Incomplete Filling (No Paste in Small Opening) | Complete Filling | Inferior Land Flatness |

α: Angle Between Substrate Surface And Small Opening Inner Wall

MULTILAYER WIRING BOARD, BASE FOR MULTILAYER WIRING BOARD, PRINTED WIRING BOARD AND ITS MANUFACTURING METHOD

TECHNICAL FIELD

The present invention is related to a multilayer wiring board assembly (a multilayer printed circuit board), a multilayer wiring board assembly component, a printed circuit board and a manufacturing method thereof. Particularly, the present invention is related to a multilayer wiring board assembly, a multilayer wiring board assembly component and a manufacturing method thereof in which the multilayer wiring board assembly can be implemented with a high packing density by the flip chip mounting technique and so forth.

Also, in particular, the present invention is related to a multilayer wiring board assembly, a multilayer wiring board assembly component and a manufacturing method thereof in which interlayer interconnection is established by the use of a conductive resin composition (conductive paste) with which a via hole is filled. Furthermore, the present invention is related to a printed circuit board for implementing a flip chip and the manufacturing method thereof.

BACKGROUND OF THE INVENTION

There have been known flexible printed circuit boards (FPC) in which a polyimide film is used as an insulating layer material having a high heat resistance, high electrically insulation performance, and high bending tenacity (Japanese Patent Published Application No. Hei 10-209593). Also, there have been developed FPCs in which FPCs are multilayered and formed with interlayer interconnection via through halls.

In the case of a multilayered FPC with through halls, it is impossible to mount a chip on a through hall to decrease the flexibility of designing circuit layouts due to the restriction on the location of the interlayer interconnection. Therefore, there is a definite ceiling to the implementation density, and it is impossible to meet the demands for high density packaging.

In order to cope with this situation, there has been resin multilayer printed circuit boards developed in which via-on-via is possible by interlayer interconnection via IVH (Interstitial Via Hole) in place of a through hall, for example, ALIVH (Any Layer Interstitial Via Hole) of Matsushita Electric Industrial Co., Ltd, or polyimide composite multilayer build up integrated circuit board (MOSAIC) of Sony Chemicals Corporation in which polyimide FPCs are built up in a multilayered structure without using a through hall (for example, refer to Japanese Patent Published Application No. Hei 06-268345 and Japanese Patent Published Application No. Hei 07-147464).

Also, proposed in Japanese Patent Application No. 2001-85224 assigned to the same assignee as the assignee of this application is a structure and a manufacturing method for obtaining a multilayered FPC having an IVH structure in accordance with a simple process making use of starting items of general purpose copper plated resin substrate components (copper plated polyimide substrate components) each of which is composed of a polyimide film as an insulating layer with a conductive layer of copper foil being attached to one of the surfaces thereof.

In the multilayer wiring board assembly component as proposed in Japanese Patent Application No. 2001-85224, an IVH structure is formed as illustrated in FIG. 1 in which, after opening a through hole in a copper plated resin film with a copper foil being attached to one surface of the insulating layer thereof, a conductive resin composition (a resin base conductive paste) is applied to fill the through hole from the copper foil side by a printing technique such as screen printing and the like. Meanwhile, in FIG. 1, numeral 1 designates an insulating layer; numeral 2 designates a copper foil member; numeral 4 designates a through hole; and numeral 5 designates a conductive resin composition with which the through hole 4 is filled.

Particularly, by designing the bore diameter of the opening of a mask (stencil) used during screen printing to be larger than the bore diameter of the IVH, there becomes available a margin in alignment during screen printing to some extent while a head shaped projection 5A is formed on the copper foil member 2 by the conductive resin composition 5 with a diameter corresponding to the bore diameter of the mask opening so that it is possible to increase the contact area between the copper foil member 2 and the conductive resin composition 5 filling the through hole 4. Also, it is possible to prevent the conductive resin composition 5 filling the through hole 4 from falling out from the through hole 4 by the existence of the head shaped projection 5A.

Furthermore, disclosed as a similar technique are a structure and a manufacturing method for obtaining an IVH multilayer substrate by one time lamination making use of starting items of general purpose copper plated resin substrate components each of which is composed of a polyimide film as an insulating layer with a conductive layer of copper foil being attached to one of the surfaces thereof (for example, disclosed in Shoji Ito and other three, "IVH Multilayer Substrate Laminated In Bulk With Polyimide Substrates Having Copper Foil", pp. 31 to 32 (Mar. 18, 2002), Japan Institute of Electronics Packaging 16th Microelectronics Show).

In this case, as illustrated in FIG. 2, the IVH structure of the IVH multilayer substrate laminated in bulk with polyimide substrates having copper foil is formed after opening a through hole (via hole 13) in a copper plated resin film with a copper foil 12 attached to one surface of an insulating layer (polyimide substrate) 11, a resin base conductive paste 14 is applied to fill the through hole by a printing technique such as screen printing and the like from the copper foil 12.

In accordance with this type of IVH multilayer substrate, it is possible to increase the margin in alignment during screen printing to some extent, to form a brim member 15 on the copper foil member 12 by using the conductive paste 14 with a diameter corresponding to the bore diameter of the mask opening so that it is possible to increase the contact area between the copper foil member 12 and the conductive paste 14 filling the through hole 4.

Furthermore, for example, the technique as illustrated in FIG. 3 is also provided (Japanese Patent Published Application No. Hei 9-828325).

However, in the case of the multilayer wiring board assembly component as proposed in Japanese Patent Application 2001-85224, when lamination adhesion is performed for multilayering after hardening the conductive resin composition 5, because of the thickness of the conductive resin composition 5 (the head shaped projection 5A) located above the copper foil, it is necessary to form the adhesive layer with sufficient thickness to accept the electrode thickness of the copper foil and the thickness of the conductive resin composition 5 (the head shaped projection 5A) located above the copper foil. The smoothness of the surface of the multilayer wiring board assembly degrades unless a thicker adhesive layer is used.

Because of this, in the case of the general purpose copper plated resin substrate components, each of which is composed of a polyimide film as an insulating layer with a conductive layer of copper foil being attached to one of the surfaces thereof, it is necessary to form an adhesive layer having a thickness of the order of 15 to 30 µm when the insulating layer has a thickness of the order of 15 to 30 µm and the copper foil has a thickness of the order of 5 to 20 µm, resulting in increasing the thickness of the substrate due to the increased thickness of the adhesive layer. This problem is true in the case of the IVH multilayer substrate as illustrated in FIG. 2.

On the other hand, in order to make close contact between the conductive resin composition and the copper foil of an adjacent layer, it is suggested to laminate the conductive resin composition in a soft condition before hardening.

However, if this technique is applied to the structure as proposed in Japanese Patent Application No. 2001-85224, a portion of the conductive resin composition 5 (the head shaped projection 5A) located above the copper foil 2 is excessively squashed and extended as illustrated in FIG. 4 under the lamination pressure P during multilayer lamination so that it is difficult to make the dimensions of the respective head shaped projection 5A even, as seen from the surface of the substrate, therefore, in addition to this, a short-circuit would be formed. This problem is also true in the case of the IVH multilayer substrate as illustrated in FIG. 2.

The present invention has been made in light of the circumstances described above. It is an object of the present invention to provide a multilayer wiring board assembly component and a manufacturing method thereof and a multilayer wiring board assembly in which the multilayer wiring board assembly can be made thin without compromising the contact reliability between a conductive resin composition and a conductive circuit member and without compromising the smoothness of the substrate.

Also, it is another object of the present invention to provide a multilayer wiring board assembly component and a manufacturing method thereof and a multilayer wiring board assembly in which film peeling or separation does not occur even if a reliability test is carried out by exposure to a high temperature while the contact area between the conductive circuit member and the conductive paste filling a via hole can be increased.

On the other hand, along with the increasing density of circuitry, the implementation practice of electric elements on the printed circuit board tends to be shifted from those based on the wire bonding technique to those based on the flip chip implementation by means of the bump connection using electrodes formed on the bottom surface of a chip. The flip chip implementation is an implementation technique for making electric connection in bulk by providing conductive bumps (projections) 2 on the surface of a substrate located opposite to a chip 1, and mounting the chip 1 on the substrate 3 in order so that the chip electrodes 4 are located opposite to substrate electrodes 5 through the bumps 2 as illustrated in FIG. 5.

There have been known several implementation techniques for the flip chip implementation such as a technique that makes use of solder bumps for making connection between a chip and a circuit board, a technique that makes use of a conductive adhesive for making connection, a technique that makes use of gold (Au) for making connection between a chip and a circuit board and so forth ("Electronic Industry Material", vol. 39, No. 9, September, 2000, Kogyo Chosakai Publishing Co., Ltd. as published in Sep. 1, 2000, pp. 36 to 40).

In the case of the flip chip implementation that makes use of solder bumps for making connection, there is a problem in that the chip may be disconnected from the substrate due to stress generated at the connection interface between the substrate and the chip by mechanical shock or heat as generated by the operation of the chip. This causes the bump connection method to lose it's advantage over the wire bonding technique.

In the case of the flip chip implementation that makes use of solder bumps for making connection, it is estimated that the disconnection of the chip from the substrate starts from the slenderest portion of the bump by the shearing stress between the bump and the substrate electrode due to the differential coefficient of thermal expansion between the bump and the substrate electrode (pad member). This estimation has been confirmed by simulation on the basis of the finite element method.

As illustrated in the expanded view of FIG. 6, in the case of the bump 2 of a solder ball connected to a flat pad (substrate electrode) 5, a locally deformed portion A forms at the boundary surface between the bump 5 and the pad 5 where the stress is concentrated so that destruction is likely at this location. Namely, defects due to contact between different materials are concentrated at the boundary surface therebetween at which a mechanically fragile composition layer of tin and copper is segregated and which is estimated to be the starting point of destruction.

In the case of the technique that makes use of solder bumps, while a self alignment effect is known as automatic alignment of a chip with a substrate by solder wetting on the electrode during the reflow process for melting the solder, the self alignment effect can not be expected in the case of gold bumps so it is difficult to align a chip to a substrate.

Accordingly, it is another objective of the present invention to provide a printed circuit board and a manufacturing method thereof for mounting a flip chip in which the reliability of connection between a chip and a substrate with the self alignment effect, can be expected even in the case of gold bumps.

DISCLOSURE OF THE INVENTION

In order to accomplish the objective as described above, the multilayer wiring board assembly component in accordance with the present invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, and wherein both the portion of said through hole passing through said insulating substrate component and the portion of said through hole passing through said conductive layer are filled with said conductive resin composition.

In accordance with this multilayer wiring board assembly component, the electrical connection between a conductive layer and a conductive resin composition is made by the use of the differential bore diameter of a through hole between the insulating substrate component and the conductive layer portion thereof, and therefore it is possible to solve the respective problems originating from the requirement of securing the contact area between the conductive layer and the portion of the conductive resin composition located above the conductive layer.

Also, since the conductive resin composition is inserted into not only the insulating substrate component portion (the via hole) of the through hole but also to the conductive layer portion thereof to fill it therewith, no air hole is formed after lamination and therefore film peeling or separation does not occur even if a reliability test is carried out by exposure of the multilayer wiring board assembly to a high temperature. In addition to this, it is possible to increase the contact area between the conductive layer and the conductive paste filling the via hole by the area of the inner peripheral wall of the conductive layer portion.

Also, in order to accomplish the objective as described above, the multilayer wiring board assembly component in accordance with the present invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the portion of said through hole passing through said insulating substrate component, the portion of said through hole passing through said adhesive layer and the portion of said through hole passing through said conductive layer are filled with said conductive resin composition.

In accordance with this multilayer wiring board assembly component, the electrical connection between a conductive layer and a conductive resin composition is made by the use of the differential bore diameter of a through hole between the insulating substrate component or the adhesive layer portion and the conductive layer portion thereof, and therefore it is possible to solve the respective problems originating from the requirement of securing the contact area between the conductive layer and the portion of the conductive resin composition located above the conductive layer.

Also, since the conductive resin composition is inserted into not only the insulating substrate component portion and the adhesive layer portion (the via hole) of the through hole but also to the conductive layer portion thereof to fill it therewith, no air hole is formed after lamination and therefore film peeling or separation does not occur even if a reliability test is carried out by exposure of the multilayer wiring board assembly to a high temperature. In addition to this, it is possible to increase the contact area between the conductive layer and the conductive paste filling the via hole by the area of the inner peripheral wall of the conductive layer portion.

In the case of the multilayer wiring board assembly component being in accordance with this invention, it is possible to make an insulating component by using a flexible resin film such as a polyimide film and to use, as a starting item, general purpose copper plated resin substrate components with a conductive layer of copper foil being attached to one of the surfaces of each general purpose copper plated resin substrate component. Also, the adhesive layer can be formed by a thermoplastic polyimide or a thermoplastic polyimide to which a thermosetting property is given.

Furthermore, it is preferred to extend the conductive resin composition filling the through hole through the interlayer adhesive surface in the form of a projection of the conductive resin composition. This projection serves to decrease the electrical resistance of the connection by compression bonding or piercing itself to an adjacent conductive layer.

The multilayer wiring board assembly component in accordance with this invention includes at least one multilayer wiring board assembly component in accordance with the invention as described above.

Furthermore, in order to accomplish the objective as described above, the manufacturing method of manufacturing a multilayer wiring board assembly component in accordance with the present invention comprises: an opening step of opening a through hole in a laminate member comprising an insulating substrate component and a conductive layer formed on one surface of said insulating substrate component in the form of an electrode pattern, wherein said through hole has a bore diameter at said conductive layer which is smaller than a bore diameter at said insulating substrate component; and a filling step of filling both the portion of said through hole passing through said insulating substrate component and the portion of said through hole passing through said conductive layer with a conductive resin composition.

Still further, in order to accomplish the objective as described above, the manufacturing method of manufacturing a multilayer wiring board assembly component in accordance with the present invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein said through hole has a bore diameter at said conductive layer which is smaller than a bore diameter at said insulating substrate component and said adhesive layer; and a filling step of filling the portion of said through hole passing through said insulating substrate component, the portion of said through hole passing through said adhesive layer and the portion of said through hole passing through said conductive layer with a conductive resin composition.

As a process of opening holes in the case of the manufacturing method of manufacturing a multilayer wiring board assembly component in accordance with this invention, it can be selected to open a hole having a larger bore diameter in a resin member other than a conductive layer portion by laser beam irradiation followed by opening a hole having a smaller bore diameter in the conductive layer portion after completion of forming the larger hole in order to form a through hole, or to open a hole having a larger bore diameter in a resin member other than a conductive layer portion and open a hole having a smaller bore diameter in the conductive layer portion in the same step in order to form a through hole by radiating a laser beam to the surface opposing the conductive layer with strength distribution of the laser beam in the radial direction of the beam.

Also, in the case of the manufacturing method of a multilayer wiring board assembly component in accordance with this invention, it is preferred to perform a desmearing process after the opening step by laser beam irradiation in order to remove smear generated during the laser opening process.

In the manufacturing method of the multilayer wiring board assembly component in accordance with this invention, said through hole is filled with the conductive resin composition from the opposite side to said conductive layer by squeezing.

In order to accomplish the objective as described above, the multilayer wiring board assembly component in accordance with the present invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, and wherein the inner wall surface of said through hole at said insulating component portion has a curved profile as seen in a vertical cross section view. Alternatively, the multilayer wiring board assembly component in accordance with the present invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the inner wall surface of said through hole at said insulating component portion has a curved profile as seen in a vertical cross section view.

Since the inner wall surface of the through hole at the insulating component is circular as seen in the vertical cross section, the insulating substrate component portion of the through hole has a mortar like surface in order that the inner wall surface of the through hole is smoothly connected to the rare surface of the conductive layer without forming a rectilinear locally deformed portion, while the air release from the through hole is sufficiently performed during filling the through hole with the conductive resin composition so that no air bubble remains within the conductive resin composition filling the through hole.

Furthermore, more specifically speaking, it is preferred that the inner wall surface of the through hole is smoothly connected to the rare surface of said conductive layer by an arc-like surface and that in the case where the through hole is formed by etching and where (Insulating Component Thickness T)/(Side Etch Depth L)=(Etching Factor) the etching factor is no higher than 1.

In the case of the multilayer wiring board assembly component in accordance with this invention, it is possible to make an insulating component with a flexible resin film such as a polyimide film and to use, as a starting item, general purpose copper plated resin substrate components with a conductive layer of copper foil being attached to one of the surfaces of each general purpose copper plated resin substrate component. Also, the adhesive layer can be made of a thermoplastic polyimide.

The multilayer wiring board assembly in accordance with the present invention comprises a plurality of multilayer wiring board assembly components which are laminated and joined together and each of which is constructed as set forth in any of the above inventions.

In order to accomplish the objective as described above, the manufacturing method of manufacturing a multilayer wiring board assembly component in accordance with the present invention comprises: an opening step of opening a through hole in a laminate member comprising an insulating substrate component and a conductive layer formed on one surface of said insulating substrate component in the form of an electrode pattern, wherein said through hole has a bore diameter at said conductive layer which is smaller than a bore diameter at said insulating substrate component; and wherein the portion of said through hole passing through said insulating substrate component has an arc-like cross section; and a filling step of filling said through hole with a conductive resin composition.

Also, in order to accomplish the objective as described above, the manufacturing method of manufacturing a multilayer wiring board assembly component in accordance with the present invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein said through hole has a bore diameter at said conductive layer which is smaller than a bore diameter at said insulating substrate component; and wherein the portion of said through hole passing through said insulating substrate component has an arc-like cross section; and a filling step of filling said through hole with a conductive resin composition.

As a process of opening holes in the case of the manufacturing method of manufacturing a multilayer wiring board assembly component in accordance with this invention, the through hole in the insulating component can be formed by etching while, in the case where the insulating component is a flexible resin film such as a polyimide film, the through hole is formed by etching with a liquid etchant.

In the case where the through hole is formed by etching with a liquid etchant, it has been well known in the art that the cavity profile of the etching becomes arc-like in accordance with the viscosity, isotropic movement and reaction of the liquid etchant whereas this fact is applied to the manufacturing method of a multilayer wiring board assembly component in accordance with the present invention.

Also, in the case where the insulating component is made of a polyimide resin while the adhesive layer is also made of a polyimide substance, the etching process can be easily performed by the use of a commercially available polyimide etchant solution to achieve improved heat resistant and chemical resistant characteristics, improved insulation performance and so forth.

In the case where the through hole is formed by such etching, the etching factor of the through hole in the insulating component portion can no higher than 1 wherein (Insulating Component Thickness T)/(Side Etch Depth L)= (Etching Factor).

Also, in accordance with another aspect, the manufacturing method of manufacturing a multilayer wiring board assembly component in accordance with the present invention comprises: an opening step of opening a through hole in a laminate member comprising an insulating substrate component and a conductive layer formed on one surface of said insulating substrate component in the form of an electrode pattern, wherein said through hole has a bore diameter at said conductive layer which is smaller than a bore diameter at said insulating substrate component; and wherein the portion of said through hole passing through said insulating substrate component has an arc-like cross section; and a filling step of filling said through hole with a conductive resin composition.

Furthermore, in accordance with another aspect, the manufacturing method of manufacturing a multilayer wiring board assembly component in accordance with the present invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein said through hole has a bore diameter at said conductive layer which is smaller than a bore diameter at said insulating substrate component; and wherein the portion of said through hole passing through said insulating substrate component has an arc-like cross section; and a filling step of filling said through hole with a conductive resin composition.

In order to accomplish the objective as described above, the multilayer wiring board assembly component in accordance with the present invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole comprising an insulating layer through hole which is opened through said insulating component, at least one conductive layer through hole which is opened through said conductive layer in order to communicate with said insulating layer through hole, wherein the horizontal cross sectional area of said conductive layer through hole is smaller than the horizontal cross sectional area of said insulating layer through hole while the total area of the inner side wall of said conductive layer through hole is larger than the horizontal cross sectional area of said conductive layer through hole, and wherein both said insulating layer through hole and said conductive layer through hole are filled with said conductive resin composition.

In accordance with the multilayer wiring board assembly component of this invention, since the electrical connection between the conductive layer and the conductive resin composition filling the through hole is made by the rare surface of the conductive layer with the horizontal cross sectional area of the conductive layer through hole being smaller than the horizontal cross sectional area of the insulating layer through hole while the total area of the inner side wall of the conductive layer through hole is greater than the horizontal cross sectional area of that conductive layer through hole, the electrical contact area between the conductive layer and the conductive resin composition is increased.

Furthermore, in order to accomplish the objective as described above, the multilayer wiring board assembly component in accordance with the present invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole comprising an insulating layer through hole which is opened through said insulating component and said adhesive layer, at least one conductive layer through hole which is opened through said conductive layer in order to communicate with said insulating layer through hole, wherein the horizontal cross sectional area of said conductive layer through hole is smaller than the horizontal cross sectional area of said insulating layer through hole while the total area of the inner side wall of said conductive layer through hole is larger than the horizontal cross sectional area of said conductive layer through hole, and wherein both said insulating layer through hole and said conductive layer through hole are filled with said conductive resin composition.

Also, in accordance with the multilayer wiring board assembly component of the other invention, since the electrical connection between the conductive layer and the conductive resin composition filling the through hole is made by the rare surface of the conductive layer with the horizontal cross sectional area of the conductive layer through hole being smaller than the horizontal cross sectional area of the insulating layer through hole while the total area of the inner side wall of the conductive layer through hole is greater than the horizontal cross sectional area of that conductive layer through hole, the electrical contact area between the conductive layer and the conductive resin composition is increased.

The multilayer wiring board assembly component in accordance with another invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole comprising an insulating layer through hole which is opened through said insulating component, at least one conductive layer through hole which is opened through said conductive layer in order to communicate with said insulating layer through hole, wherein said insulating layer through hole and said conductive layer through hole are filled with the conductive resin composition in order so that the total contact area of said conductive resin composition with said conductive layer in the case where said conductive layer through hole is formed is larger than that in the case where the formation of said conductive layer through hole is dispensed with.

In the case where the conductive layer through hole is a through hole having a cylindrical profile of a circular horizontal cross section while the diameter of the conductive layer throughhole is no larger than four times the layer thickness of the conductive layer, it is possible to satisfy the requirement that the area of the inner side wall of the conductive layer through hole is greater than the horizontal cross sectional area of the conductive layer through hole.

Accordingly, in the case where the conductive layer through hole is a through hole having a cylindrical profile of a circular horizontal cross section, the diameter of the conductive layer through hole is determined to be no larger than four times the layer thickness of the conductive layer.

The multilayer wiring board assembly component in accordance with another invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole comprising an insulating layer through hole which is opened through said insulating component, at least one conductive layer through hole which is opened through said conductive layer in order to communicate with said insulating layer through hole, wherein said insulating layer through hole and said conductive layer through hole are filled with the conductive resin composition in order so that the total contact area of said conductive resin composition with said conductive layer in the case where said conductive layer through hole formed is larger than that in the case where the formation of said conductive layer through hole is dispensed with.

In the case of the multilayer wiring board assembly component in accordance with said another invention, it is possible to make an insulating component by a flexible resin film such as a polyimide film and to use, as a starting item, general purpose copper plated resin substrate components with a conductive layer of copper foil being attached to one of the surfaces of each general purpose copper plated resin substrate component. Also, the adhesive layer can be made of a thermoplastic polyimide.

The multilayer wiring board assembly in accordance with the present invention comprises a plurality of multilayer wiring board assembly components which are laminated and joined together and each of which is constructed as set forth in any of the above inventions.

In the case of the multilayer wiring board assembly component in accordance with said another invention, where said conductive layer through hole has a vertical wall (the inner sidewall), the perimeter length of said conductive layer through hole multiplied by the height of said conductive layer through hole is greater than the horizontal cross sectional area of said conductive layer through hole at the opening end.

Also, in the case of the multilayer wiring board assembly component in accordance with said another invention, said conductive layer through hole is provided with a wall (tapered surface) that is slanted relative to the plan surface.

Furthermore, in the case of the multilayer wiring board assembly component in accordance with said another invention, said conductive layer through hole is provided in a plurality of locations.

In order to accomplish the objective as described above, the multilayer wiring board assembly component in accordance with the present invention comprises: an insulating substrate component; a conductive layer formed on one surface of said insulating substrate component in the form of an electrode pattern; a through hole opened through said insulating component and said conductive layer and has a bore diameter at said conductive layer which is smaller than a bore diameter at said insulating substrate component; a conductive resin composition with which said through hole is filled in order to make interlayer interconnection; and a metallic layer formed on the surface of said conductive layer in order to cover said conductive resin composition exposed through an opening of said through hole in said conductive layer.

In accordance with the multilayer wiring board assembly component of this invention, a metallic layer is formed on the conductive layer in order to cover the conductive resin composition exposed to the opening end at the conductive layer with the metallic layer so that the entire surface of the conductive layer is made a uniform metallic surface by the metallic layer. Preferred metals suitable for forming the metallic layer include gold on which an oxide film is hardly formed, silver having a low resistivity, copper having an excellent ion migration-proof characteristic, and the like.

The multilayer wiring board assembly component in accordance with this invention may be provided with an adhesive layer on the opposite surface thereof to the conductive layer for the purpose of interlayer connection while said insulating component may be made of a flexible resin film such as a polyimide film. The adhesive layer can be formed by a thermoplastic polyimide or a thermoplastic polyimide to which a thermosetting property is given.

Also, in the case of the multilayer wiring board assembly component in accordance with this invention, said insulating component can be formed by a thermoplastic polyimide or a thermoplastic polyimide to which a thermosetting property is given. In this case, the insulating component itself has interlayer adhesivity therefore a separate adhesive layer need not be provided.

Also, in order to accomplish the objective as described above, the multilayer wiring board assembly in accordance with this invention comprises a plurality of multilayer wiring board assembly components which are laminated and joined together and each of which is constructed as set forth in any of the above inventions. A metallic layer is formed on the conductive layer in order to cover the conductive resin composition exposed to the opening end at the conductive layer with the metallic layer so that the entire surface of the conductive layer is made a uniform metallic surface by the metallic layer.

Furthermore, in order to accomplish the objective as described above, the multilayer wiring board assembly in accordance with this invention comprises: an insulating substrate component; a conductive layer formed on one surface of said insulating substrate component in the form of an electrode pattern; a through hole opened through said insulating component and said conductive layer and has a bore diameter at said conductive layer which is smaller than a bore diameter at said insulating substrate component; and a conductive resin composition with which said through hole is filled in order to make interlayer interconnection, wherein a metallic layer is formed on the surface of said conductive layer in order to cover said conductive resin composition exposed through an opening of at least the most outer through hole of the through holes of said insulating components in the corresponding conductive layer.

In accordance with the multilayer wiring board assembly in accordance with this invention, a metallic layer is formed on at least the surface of the conductive layer exposed as the outermost layer, i.e., on at least the surface of the conductive layer on which an electric part is mounted in order to cover the conductive resin composition exposed to the opening end at the conductive layer with the metallic layer so that the entire surface of the conductive layer is made a uniform metallic surface by the metallic layer.

The metallic layer is formed uniformly on the entirety of the surface of the conductive layer by electrolytic plating, electroless plating, sputtering or the like.

Also, if the metallic layer and the conductive layer are formed of the same metal, it is possible to form said metallic layer on the surface of said conductive layer in advance of patterning a circuit by lamination followed by forming an electrode pattern on the conductive layer and the metallic layer at the same time by etching.

In order to accomplish the objective as described above, the multilayer wiring board assembly component in accordance with this invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, wherein said conductive resin composition is composed of a resin binder, metal particles dispersed in said resin binder, and wherein the bore diameter of said through hole at said conductive layer is larger than the maximum diameter of said metal particles and smaller than three times the maximum diameter of said metal particles.

The multilayer wiring board assembly component in accordance with this invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the bore diameter of said through hole at said conductive layer is larger than the maximum diameter of said metal particles and smaller than three times the maximum diameter of said metal particles.

The bore diameter of the through hole at said conductive layer is larger than the maximum diameter of said metal particles and smaller than three times the maximum diameter of said metal particles, and therefore the air release from the through hole is sufficiently performed during filling of the through hole with the conductive resin composition so that no air bubbles remain within the conductive resin composition filling the through hole.

Specifically speaking, the multilayer wiring board assembly component in accordance with this invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole preferably has a bore diameter at said conductive layer which is larger than $1/10$ and smaller than $1/2$ of a bore diameter at said insulating substrate component.

Furthermore, in order to accomplish the objective as described above, the multilayer wiring board assembly component in accordance with this invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is larger than $1/10$ and smaller than $1/2$ of a bore diameter at said insulating substrate component.

Still further, the multilayer wiring board assembly component in accordance with this invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is larger than $1/10$ and smaller than $1/2$ of a bore diameter at said insulating substrate component.

By satisfying the requirement that a through hole has a bore diameter at a conductive layer which is larger than $1/10$ and smaller than $1/2$ of a bore diameter at an insulating substrate component, it becomes possible to sufficiently perform the air release from the through hole during filling of the through hole with a conductive resin composition so that no air bubbles remain within the conductive resin composition filling the through hole without compromising the flexibility of designing the manufacturing process.

Still further, the multilayer wiring board assembly component in accordance with this invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, and wherein the center position of said through hole at said insulating component falls within said through hole at said conductive layer.

Still further, the multilayer wiring board assembly component in accordance with this invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the center position of said through hole at said insulating component falls within said through hole at said conductive layer.

By satisfying the requirements that a through hole has a bore diameter at a conductive layer which is smaller than a bore diameter at said insulating substrate component and that the center position of said through hole at said insulating component falls within said through hole at said conductive layer, the air release from the through hole is sufficiently performed during filling of the through hole with the conductive resin composition so that no air bubbles remain within the conductive resin composition filling the through hole.

Still further, the multilayer wiring board assembly component in accordance with this invention comprises: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, and wherein the bore diameter of said through hole at the surface of said conductive layer facing said insulating component is larger than the bore diameter of said through hole at the opposite surface of said conductive layer which is not facing said insulating component.

Still further, the multilayer wiring board assembly component in accordance with this invention comprises: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component, and wherein the bore diameter of said through hole at the surface of said conductive layer facing said insulating component is larger than the bore diameter of said through hole at the opposite surface of said conductive layer which is not facing said insulating component.

By satisfying the requirements that a through hole has a bore diameter at a conductive layer which is smaller than a bore diameter at said insulating substrate component and that the bore diameter of said through hole at the surface of said conductive layer facing said insulating component is larger than the bore diameter of said through hole at the opposite surface of said conductive layer which is not facing said insulating component, it becomes possible to sufficiently perform the air release from the through hole during filling of the through hole with a conductive resin composition so that no air bubbles remain within the conductive resin composition filling the through hole without compromising the flexibility of designing the manufacturing process.

Also, in order to accomplish the objective as described above, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein a bore diameter at said conductive layer is smaller than a bore diameter at said insulating substrate component and said adhesive layer; and a filling step of filling both the portion of said through hole passing through said insulating substrate component and the portion of said through hole passing through said conductive layer with a conductive resin composition, wherein said through hole has a bore diameter at said conductive layer which is smaller than a bore diameter at said insulating substrate component, wherein said conductive resin composition is composed of a resin binder, metal particles dispersed in said resin binder, and wherein the bore diameter of said through hole at said conductive layer is larger than the maximum diameter of said metal particles and smaller than three times the maximum diameter of said metal particles.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein a bore diameter at said conductive layer is smaller than a bore diameter at said insulating substrate component and said adhesive layer; and a filling step of filling both the portion of said through hole passing through said insulating substrate component and the portion of said through hole passing through said conductive layer with a conductive resin composition, wherein said through hole has a bore diameter at said conductive layer which is smaller than a bore diameter at said insulating substrate component, wherein said conductive resin composition is composed of a resin binder, metal particles dispersed in said resin binder, and wherein the bore diameter of said through hole at said conductive layer is larger than the maximum diameter of said metal particles and smaller than three times the maximum diameter of said metal particles.

By satisfying the requirement that the bore diameter of a through hole at a conductive layer is larger than the maximum diameter of said metal particles and smaller than three times the maximum diameter of said metal particles, it becomes possible to sufficiently perform the air release from the through hole during filling of the through hole with a conductive resin composition so that no air bubbles remain within the conductive resin composition filling the through hole without compromising the flexibility of designing the manufacturing process.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein a bore diameter at said conductive layer is smaller than a bore diameter at said insulating substrate component and said adhesive layer; and a filling step of filling both the portion of said through hole passing through said insulating substrate component and the portion of said through hole passing through said conductive layer with a conductive resin composition, wherein said through hole has a bore diameter at said conductive layer which is larger than $\frac{1}{10}$ and smaller than $\frac{1}{2}$ of a bore diameter at said insulating substrate component.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein a bore diameter at said conductive layer is smaller than a bore diameter at said insulating substrate component and said adhesive layer; and a filling step of filling both the portion of said through hole passing through said insulating substrate component and the portion of said through hole passing through said conductive layer with a conductive resin composition, wherein said through hole has a bore diameter at said conductive layer which is larger than $\frac{1}{10}$ and smaller than $\frac{1}{2}$ of a bore diameter at said insulating substrate component.

By satisfying the requirement that a through hole has a bore diameter at a conductive layer which is larger than $\frac{1}{10}$ and smaller than $\frac{1}{2}$ of a bore diameter at said insulating substrate component, it becomes possible to sufficiently perform the air release from the through hole during filling of the through hole with a conductive resin composition so that no air bubbles remain within the conductive resin composition filling the through hole without compromising the flexibility of designing the manufacturing process.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein said through hole has a bore diameter at said conductive layer which is smaller than a bore diameter at said insulating substrate component and said adhesive layer; and a filling step of filling said through hole with a conductive resin composition, wherein said through hole has a bore diameter at said conductive layer which is smaller than a bore diameter at said insulating substrate component wherein the center position of said through hole at said insulating component falls within said through hole at said conductive layer.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein said through hole has a bore diameter at said conductive layer which is smaller than a bore diameter at said insulating substrate component and said adhesive layer; and a filling step of filling said through hole with a conductive resin composition, wherein said through hole has a bore diameter at said conductive layer which is smaller than a bore diameter at said insulating substrate component wherein the center position of said through hole at said insulating component falls within said through hole at said conductive layer.

By satisfying the requirements that a through hole has a bore diameter at a conductive layer which is smaller than a bore diameter at said insulating substrate component and that the center position of said through hole at said insulating component falls within said through hole at said conductive layer, the air release from the through hole is sufficiently performed during filling of the through hole with the conductive resin composition so that no air bubbles remain within the conductive resin composition filling the through hole.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein a bore diameter at said conductive layer is smaller than a bore diameter at said insulating substrate component and said adhesive layer; and a filling step of filling both the portion of said through hole passing through said insulating substrate component and the portion of said through hole passing through said conductive layer with a conductive resin composition, wherein said through hole has a bore diameter at said conductive layer which is smaller than a bore diameter at said insulating substrate component, and wherein the bore diameter of said through hole at the surface of said conductive layer facing said insulating component is larger than the bore diameter of said through hole at the opposite surface of said conductive layer which is not facing said insulating component.

Still further, the manufacturing method of manufacturing a multilayer wiring board assembly component in accordance with this invention comprises: an opening step of opening a through hole in a laminate member comprising an insulating substrate component, a conductive layer formed on one surface of said insulating substrate component in the form of an electrode pattern and an adhesive layer formed on the other surface of said insulating substrate component, wherein a bore diameter at said conductive layer is smaller than a bore diameter at said insulating substrate component and said adhesive layer; and a filling step of filling both the portion of said through hole passing through said insulating substrate component and the portion of said through hole passing through said conductive layer with a conductive resin composition, wherein said through hole has a bore diameter at said conductive layer which is smaller than a bore diameter at said insulating substrate component, and wherein the bore diameter of said through hole at the surface of said conductive layer facing said insulating component is larger than the bore diameter of said through hole at the opposite surface of said conductive layer which is not facing said insulating component.

By satisfying the requirements that a through hole has a bore diameter at a conductive layer which is smaller than a bore diameter at said insulating substrate component and that the bore diameter of said through hole at the surface of said conductive layer facing said insulating component is larger than the bore diameter of said through hole at the opposite surface of said conductive layer which is not facing said insulating component, it becomes possible to sufficiently perform the air release from the through hole during filling of the through hole with a conductive resin composition so that no air bubbles remain within the conductive resin composition filling the through hole without compromising the flexibility of designing the manufacturing process.

More specifically speaking, as said process of opening holes, a hole having a larger bore diameter is opened in a resin member other than a conductive layer portion by laser beam irradiation followed by opening a hole having a smaller bore diameter in the conductive layer portion after completion of forming the larger hole in order to form a through hole.

Alternatively, as said process of opening holes, a hole having a larger bore diameter in a resin member other than a conductive layer portion and a hole having a smaller bore diameter in the conductive layer are opened in the conductive layer portion in the same step in order to form a through hole by radiating a laser beam to the surface opposing the conductive layer with a strength distribution of the laser beam in the radial direction of the beam.

Also, it is preferred to perform a desmearing process after the opening step by the laser beam irradiation in order to remove smear generated during the laser opening process.

Furthermore, in said filling step, said through hole is filled with the conductive resin composition preferably from the opposite side to said conductive layer by squeezing.

In order to accomplish the objective as described above, the printed circuit board in accordance with this invention is provided with a substrate electrode whose surface is concave in a mortar form or the like.

On the other hand, in accordance with the printed circuit board of this invention, where connection is made by a solder bump, the solder bump is melted and bonded to the substrate electrode in a form conforming to the concave surface of the substrate electrode and therefore the deformation of the locally deformed portion in the boundary surface between the solder bump and the substrate electrode is alleviated as compared with that in accordance with the prior art technique. Accordingly, the concentration of stress to the locally deformed portion is alleviated to improve the connection reliability between the chip and the substrate. In the case of a gold bump, a self alignment effect appears while the bump is aligned with the location by means of the concave surface of the substrate electrode.

Also, in accordance with the printed circuit board of this invention, a printed circuit board for use in a multilayer substrate is provided with interlayer interconnection by means of a conductive paste filling via holes wherein a substrate electrode is provided with a small opening therethrough which is a tapered hole having a larger diameter near the surface of the electrode than that near the via hole.

Furthermore, in accordance with the printed circuit board of this invention, where connection is made by a solder bump, the solder bump is melted and bonded to the substrate electrode in a form conforming to the small opening of the substrate electrode and therefore the deformation of the locally deformed portion in the boundary surface between the solder bump and the substrate electrode is alleviated as compared with that in accordance with the prior art technique. Accordingly, the concentration of stress to the locally deformed portion is alleviated to improve the connection reliability between the chip and the substrate. In the case of a gold bump, a self alignment effect appears while the bump is aligned with the location by means of the small opening of the substrate electrode.

Also, in accordance with the printed circuit board of this invention, a printed circuit board for use in a multilayer substrate is provided with interlayer interconnection by means of a conductive paste filling via holes in which a substrate electrode is provided with a small opening therethrough which is a tapered hole having a larger diameter near the surface of the electrode than that near the via hole while the surface of said substrate electrode is coated with a metallic layer, such as an electrolytic plating layer, having a concave surface corresponding to the small opening.

On the other hand, in accordance with the printed circuit board of this invention, where connection is made by a solder bump, the solder bump is melted and bonded to the metallic layer in a form conforming to the concave surface of the metallic layer and therefore the deformation of the locally deformed portion in the boundary surface between the solder bump and the substrate electrode is alleviated as compared with that in accordance with the prior art technique. Accordingly, the concentration of stress to the locally deformed portion is alleviated to improve the connection reliability between the chip and the substrate. Also, the solder bump does not contact with the conductive paste filling the via hole but contacts with only the metallic layer therefore, the solder wetting becomes uniform and improves. In the case of a gold bump, a self alignment effect appears while the bump is aligned with the location by means of the concave surface of the substrate electrode.

Also, in accordance with the printed circuit board of this invention, said substrate electrode is formed on an insulating substrate component which is made of a polyimide film to form a flexible printed circuit board.

Furthermore, in order to accomplish the objective as described above, the manufacturing method of manufacturing a printed circuit board in accordance with this invention includes a step of forming a substrate electrode by chemical etching to make the surface profile thereof concave.

Still further, in accordance with this invention, the manufacturing method of manufacturing a printed circuit board for use in a multilayer substrate with interlayer interconnection by means of a conductive paste filling via holes includes a step of forming a substrate electrode in a location aligned with the via hole; and a step of opening a small opening in said substrate electrode by chemical etching in order so that said small opening is a tapered hole having a larger diameter at the surface of said substrate electrode than a diameter at said via hole.

Still further, in accordance with this invention, the manufacturing method of manufacturing a printed circuit board for use in a multilayer substrate with interlayer interconnection by means of a conductive paste filling via holes includes a step of forming a substrate electrode in a location aligned with the via hole; a step of opening a small opening in said substrate electrode by chemical etching in order so that said small opening is a tapered hole having a larger diameter at the surface of said substrate electrode than a diameter at said via hole; and a step of covering the surface of said substrate electrode with a metallic layer in order to make said metallic layer have a concave surface corresponding to the small opening.

Said metallic layer can be formed by any of electrolytic plating, electroless plating or sputtering.

Also, in accordance with this invention, the manufacturing method of manufacturing a printed circuit board for use in a multilayer substrate with interlayer interconnection by means of a conductive paste filling via holes is carried out by performing the step of covering the surface of a conductive layer, to function as a substrate electrode, with a metallic layer in advance of the substrate electrode formation step, which is thereafter performed by patterning the substrate electrode on the double layer of the conductive layer and the metallic layer.

Furthermore, the substrate electrode is formed in a circuit formation step by chemical etching.

BRIEF DESCRIPTION OF DRAWINGS

The novel features believed to be characteristic of the invention are set forth in the appended claims. The invention itself, however, as well as other features and advantages thereof, will be best understood by reference to the detailed description of specific embodiments which follow, when read in conjunction with the accompanying drawings, wherein:

FIG. 16(a) is an explanatory view for showing the laser processing surface in the step of opening a hole in the multilayer wiring board assembly component in accordance with the present embodiment while FIG. 16(b) is an explanatory view for showing the laser strength distribution in the same step.

FIG. 25 is a process chart showing an embodiment of the method of manufacturing the multilayer wiring board assembly in accordance with the third embodiment of the present invention.

FIG. 32 is a process chart showing an embodiment of the method of manufacturing the multilayer wiring board assembly in accordance with the fourth embodiment of the present invention.

FIG. 45 is a cross sectional view showing the basic configuration of a multilayer wiring board assembly component in accordance with an eighth embodiment of the present invention.

FIG. 50 is an explanatory view for explaining an appropriate relationship between a small hole opened through the conductive layer and a through hole opened through the insulating resin layer in the case of the manufacturing method of the multilayer wiring board assembly component in accordance with the eighth embodiment of the present invention.

FIG. 53 is a cross sectional view showing the basic configuration of a multilayer wiring board assembly component in accordance with a ninth embodiment of the present invention.

FIG. 59 is a cross sectional view showing the basic configuration of a multilayer wiring board assembly component in accordance with a tenth embodiment of the present invention.

FIG. 65 is an explanatory view for explaining a small opening which is formed through the conductive layer by a laser boring process with its profile which is controlled by changing the strength or the scanning pattern of a laser beam.

FIG. 68 is a view for explaining the experimental results obtained by examining the condition of the through hole filled with the conductive resin composition by screen printing while changing the process of forming a small opening through the conductive layer in the case of the manufacturing method of the multilayer wiring board assembly component.

PREFERRED EMBODIMENTS OF THE INVENTION

In the following, several embodiments of the present invention will be explained in conjunction with the accompanied drawings.

Figure 1:
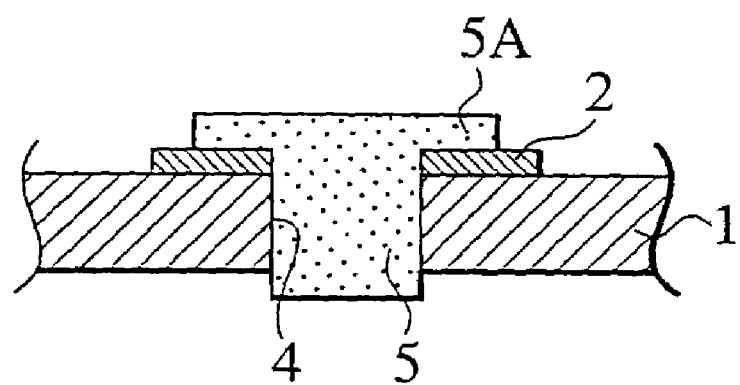
FIG. 1 is a cross sectional view showing the IVH structure of a multilayer wiring board assembly component in accordance with a conventional technique.
Figure 2:
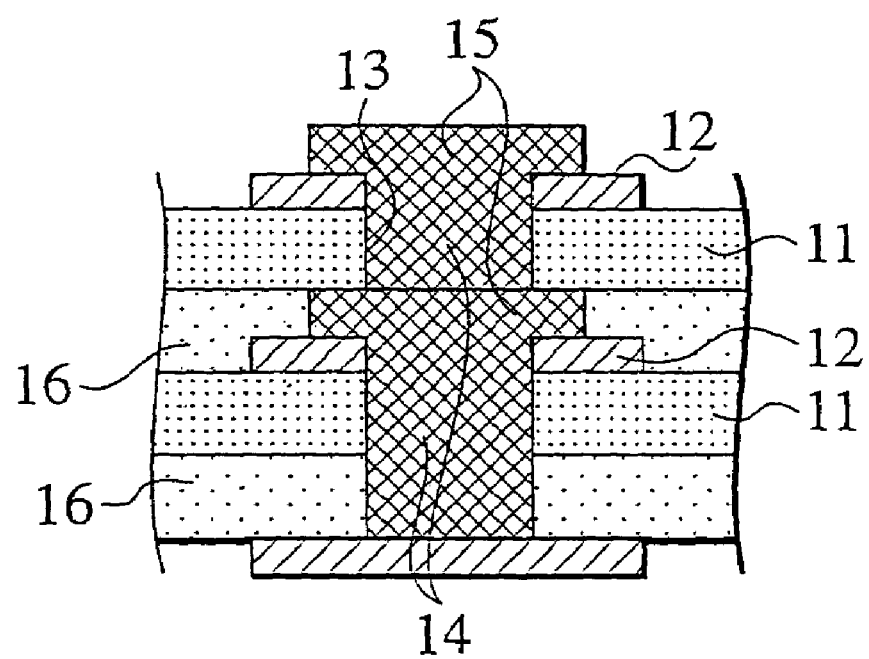
FIG. 2 is a cross sectional view showing the IVH structure of a multilayer wiring board assembly component in accordance with a conventional technique.
Figure 3:
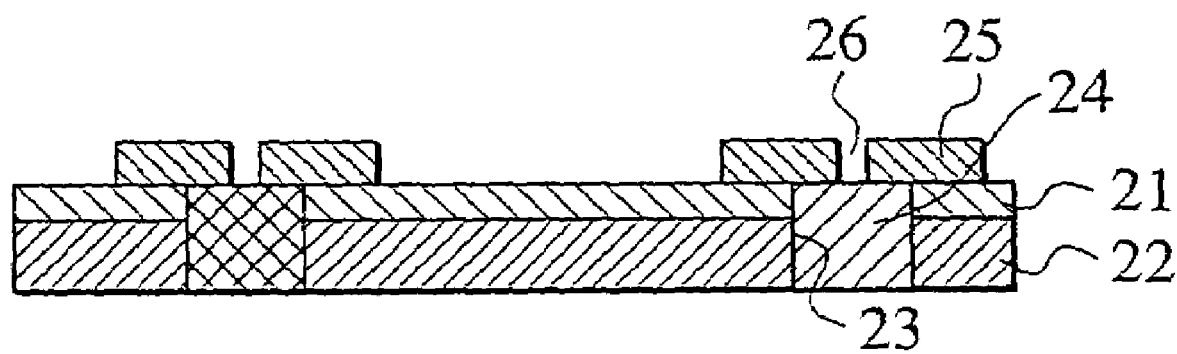
FIG. 3 is a cross sectional view showing the IVH structure of a multilayer wiring board assembly component in accordance with a conventional technique.
Figure 4:
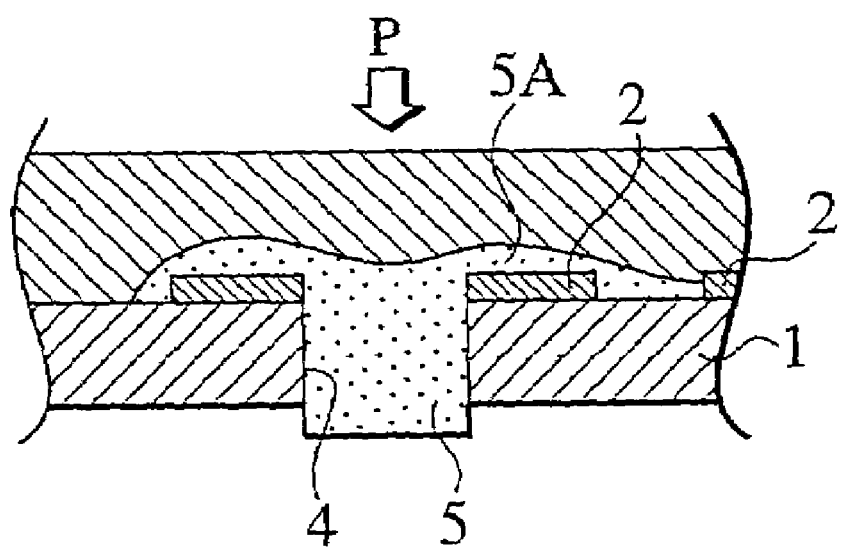
FIG. 4 is a cross sectional view showing the shortcomings of the IVH structure of a multilayer wiring board assembly component in accordance with a conventional technique.
Figure 5:
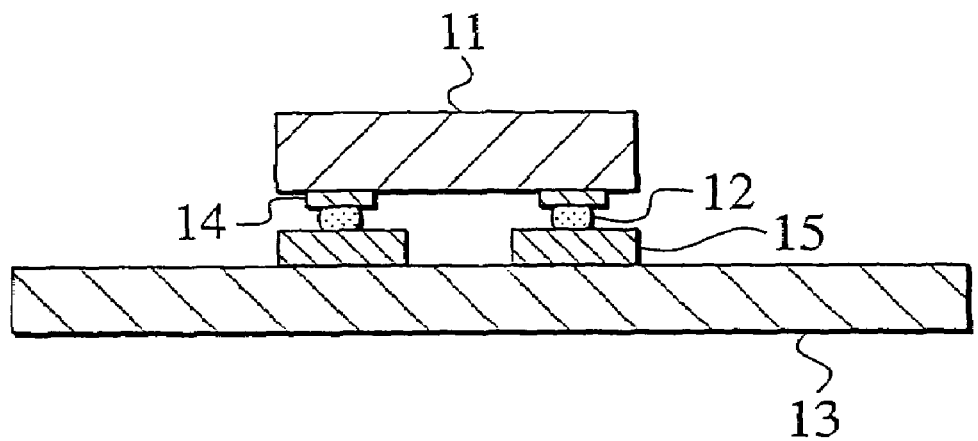
FIG. 5 is a cross sectional view showing an exemplary prior art technique of mounting a flip chip.
Figure 6:
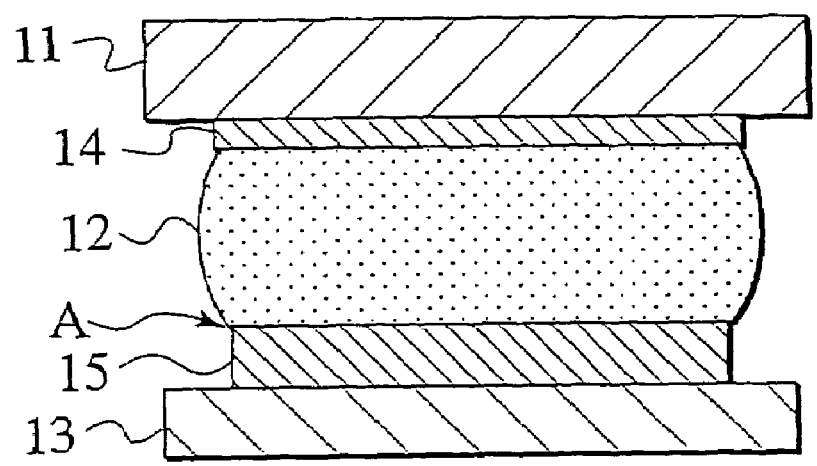
FIG. 6 is a cross sectional view showing the major portion of an exemplary prior art technique of mounting a flip chip.
Figure 7:
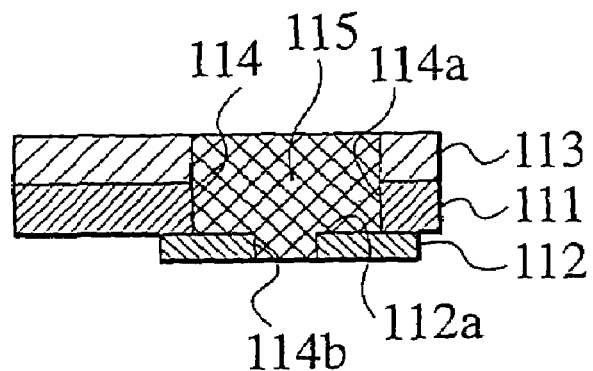
FIG. 7 is a cross sectional view showing the basic configuration of a multilayer wiring board assembly component in accordance with a first embodiment of the present invention.
Figure 8:
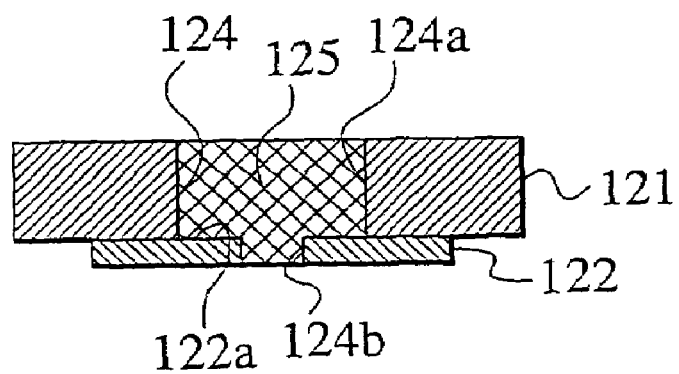
FIG. 8 is a cross sectional view showing the basic configuration of a multilayer wiring board assembly component in accordance with the first embodiment of the present invention.

FIG. 7 and FIG. 8 show the basic configuration of multilayer wiring board assembly components in accordance with the first embodiment of the present invention.

The multilayer wiring board assembly component as illustrated in FIG. 7 is composed of an insulating resin layer 111 as an insulating substrate component which is provided with a conductive layer 112 made of copper foil and the like as an electrode pattern on one surface of the insulating resin layer 111 and an adhesive layer 113 for interlayer connection on the other surface respectively with a through hole 114 formed that passes through the adhesive layer 113, the insulating resin layer 111 and the conductive layer 112. The through hole 114 is filled with a conductive resin composition 115 in order to form an IVH (via hole).

In the case of an FPC, the insulating resin layer 111 is composed of a flexible resin film such as a polyimide film, a polyester film or the like made of a wholly aromatic polyimide (API) and the like in order to form a triple layered structure of the insulating resin layer 111, the conductive layer 112 and the adhesive layer 113 in which a polyimide base adhesive material used as the adhesive layer 113, is attached to the surface of the polyimide member (the insulating resin layer 111) of the general purpose single sided copper plated polyimide component compared to opposite the surface contacting the copper foil (the conductive layer 112).

The through hole 114 formed through the multilayer wiring board assembly component includes a portion 114a which is opened through the adhesive layer 113 and the insulating resin layer 111 and a portion 114b which is opened through the conductive layer 112. The bore diameter of the portion 114a is a conventional via hole diameter while the bore diameter of the portion 114b is smaller than the bore diameter of the portion 114a passing through the adhesive layer 113 and the insulating resin layer 111.

The adhesive layer 113 can be formed by not only the application of an adhesive material but also by attaching a thermoplastic polyimide film or a film which is made by giving a thermosetting property to a thermoplastic polyimide film. In the case of a thermoplastic polyimide film being used, taking into consideration the heat resistance of the substrate, it is preferred that a material having a high glass transition temperature is used. Meanwhile, the insulating resin layer 111 can be formed of not only a polyimide film but also of an insulating material such as an imide base or epoxy base prepreg. In the latter case, the insulating resin layer 111 can function as an adhesive so that it is possible to dispense with the adhesive layer 113 which otherwise has to be separately formed.

The conductive resin composition 115 is prepared by mixing a resin binder and a metal powder having electrical conductivity with a viscous agent including a solvent in the form of a paste, and used to fill the through hole 114 from the insulating resin layer 111 by squeezing to completely stop the hole. Namely, the portion 114a of the through hole 114 passing through the adhesive layer and the insulating resin layer and the portion 114b passing through the conductive layer are evenly filled with the conductive resin composition 115.

The conductive resin composition 115 is used to make electric contact with the conductive layer 112 by means of the rare surface 112a of the conductive layer 112 rather than the outer surface of the conductive layer 112 therefore, there is no need for provision of the extended portion of the conductive resin composition 115 to extend in the outer direction.

Figure 9:
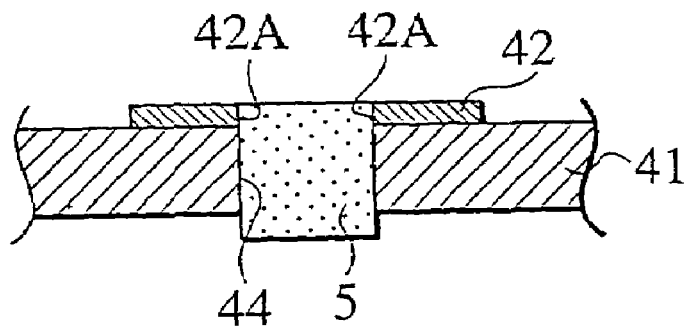
FIG. 9 is a cross sectional view showing the IVH structure of a multilayer wiring board assembly component in accordance with a conventional technique in which the bore diameter of a copper foil member is equal to the bore diameter of an insulating layer.
Figure 10:
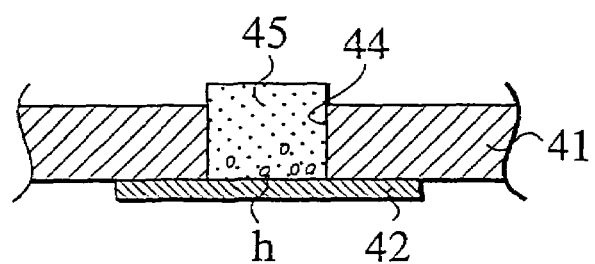
FIG. 10 is a cross sectional view showing the IVH structure of a multilayer wiring board assembly component in accordance with a conventional technique in which no hole is opened through a copper foil member.

The conductive layer 112, i.e., the copper foil member is provided with a small hole 114b which is smaller than that opened through the resin portion (the insulating resin layer 111+the adhesive layer 113). This is because, if the bore diameter of the copper foil member 42 is equal to the bore diameter of the resin portion (the insulating layer 41) as illustrated in FIG. 9, the contact area between the copper foil member 42 and the conductive resin composition 45 is only the side surface 42A of the hole therefore, the reliability of electrical connection becomes insufficient, and also if the hole is formed only through the resin insulating layer 41 as illustrated in FIG. 10, air release from the IVH can not be sufficiently performed because when filling the hole with the conductive paste by squeezing leaves air bubbles in the IVH therefore, the contact area between the copper foil member 42 and the conductive resin composition 45 can not be guaranteed.

The small hole 114b opened through the conductive layer 112 functions as an air bleeder aperture through which air bubbles are surely exhausted, when filling the hole with the conductive paste, in order to ensure a sufficient contact area between the conductive layer 112 and the conductive resin composition 115.

In the multilayer wiring board assembly component as illustrated in FIG. 8, the insulating resin layer 121 itself, as an insulating substrate component, has adhesivity for interlayer connection and is provided with a conductive layer 122 made of a copper foil and the like as an electrode pattern on one surface of the insulating resin layer 121 while the through hole 124 is opened through the insulating resin layer 121 and the conductive layer 122. The through hole 124 is filled with the conductive resin composition 125 in order to form an IVH (via hole).

In the case of an FPC, the insulating resin layer 121 having adhesivity is formed of a thermoplastic polyimide (TPI) or a thermoplastic polyimide to which a thermosetting property is given. In the case of the use of a thermoplastic polyimide film, taking into consideration the heat resistance of the substrate, it is preferred to use a material having a high glass transition temperature.

The through hole 124 includes a portion 124a which is opened through the insulating resin layer 121 and a portion 124b which is opened through the conductive layer 122. The bore diameter of the portion 124a is a conventional via hole diameter while the bore diameter of the portion 124b is smaller than the bore diameter of the portion 124a passing through the insulating resin layer 121.

The conductive resin composition 125 is prepared by mixing a resin binder and a metal powder having electrical conductivity with a viscous agent including a solvent in the form of a paste, and used to fill the through hole 124 from the insulating resin layer 121 by squeezing to completely stop the hole. Namely, the portion 124a of the through hole 124 passing through the insulating resin layer and the portion 124b passing through the conductive layer are evenly filled with the conductive resin composition 125.

The conductive resin composition 125 is used to make electric contact with the conductive layer 122 by means of the rare surface 122a of the conductive layer 122 rather than the outer surface of the conductive layer 122 therefore, there is no need for provision of the extended portion of the conductive resin composition 125 to extend in the outer direction.

The small hole 124b opened through the conductive layer 122 functions as an air bleeder aperture through which air bubbles are surely exhausted, when filling the hole with the conductive paste, in order to ensure a sufficient contact area between the conductive layer 122 and the conductive resin composition 125.

In the case of either multilayer wiring board assembly component as illustrated in FIG. 7 or FIG. 8, the large holes 114a and 124a and the small holes 114b and 124b can be formed as the through holes 114 and 124 by laser beam irradiation to perform a laser boring process, or alternatively by etching or a combination of etching and laser beam irradiation.

In the case of the laser boring process, the process is initiated by opening the large hole 114a through the insulating resin layer 111 and the adhesive layer 113 or opening the large hole 124a through the insulating resin layer 121 by laser beam irradiation, followed by opening the small hole 114b through the conductive layer 112 or opening the small hole 124b through the conductive layer 122 also by laser beam irradiation. Thereafter, the conductive resin composition (the conductive paste) 115 or 125 is used to fill the through hole 114 or 124. In this case, however, the strength of the laser beam (laser strength) is usually higher (stronger) in the center of the beam and lower (weaker) near the periphery of the beam as seen in the radial direction of the beam. Therefore it is possible to make use of this fact in order to form, in one step, the small hole 114b or 124b through the conductive layer 112 or 122 and the large hole 114a or 124a through the resin member. By this process, the via hole of the above described structure can be efficiently formed in a shorter amount of time.

Furthermore, the IVH can surely be formed of the above described structure by making use of a laser beam having a two-step profile of the beam strength within the processing plane as illustrated in FIG. 16(a) and FIG. 16(b) where the laser beam is stronger near the center of the beam and weaker near the periphery of the beam. The laser beam having such a two-step strength profile can be prepared by passing a laser beam through a filter having a beam transmission efficiency which is high at the center position and low near the periphery of the beam in advance of restricting the laser beam.

Figure 11:
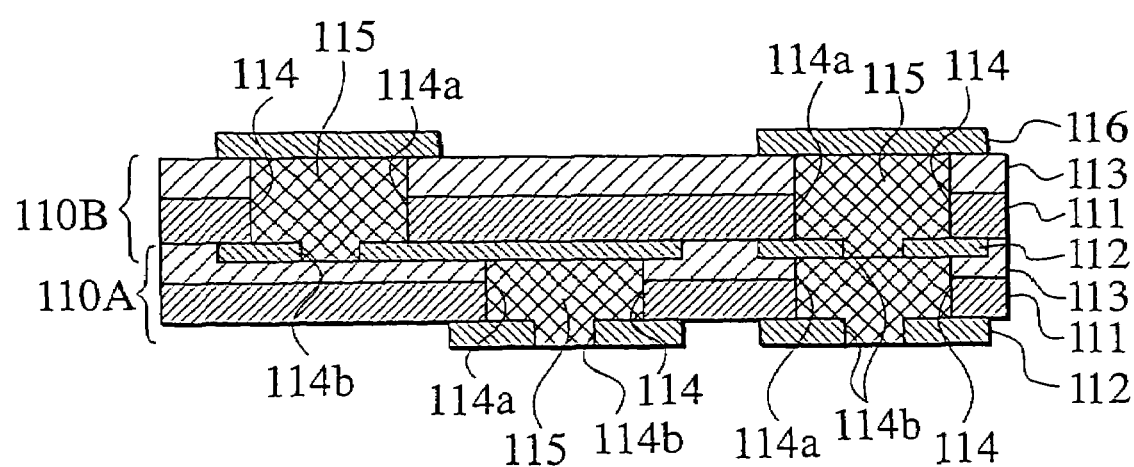
FIG. 11 is a schematic diagram showing an embodiment of a multilayer wiring board assembly in accordance with the first embodiment of the present invention.

FIG. 11 is a schematic diagram showing an embodiment of a multilayer wiring board assembly making use of a multilayer wiring board assembly component in accordance with the first embodiment of the present invention. This multilayer wiring board assembly is formed by adhesively joining together two multilayer wiring board assembly components each of which has been designed as illustrated in FIG. 7 as a first board assembly component 110A and a second layer substrate 110B by making the adhesive layer 113 of the first layer substrate 110A adhere to the second layer substrate 110B. A conductive layer 116 made of a copper foil serving to provide an electrode of the upper surface is formed on the adhesive layer 113 of the second board assembly component 110B.

The respective through hole 114 functions as an IVH filled with the conductive resin composition 115 with which interlayer interconnection is established between the conductive layers 112 of the respective layers and between the conductive layer 115 and the conductive layer 116.

Since the conductive resin composition 115 is used to fill not only the portion 114a of the through hole 114 passing through the adhesive layer and the insulating resin layer but also the conductive layer portion 114b, there are no air holes formed inside of the multilayer wiring board assembly therefore, separation or peeling off shall not occur even if a reliability test in which a multilayer wiring board assembly is exposed to a high temperature is conducted.

Also, since the conductive layer portion 114b is filled with the conductive resin composition 115, there is an advantage that the contact area between the conductive layer 115 and the conductive resin composition 115 filling the via hole is furthermore increased.

Furthermore, since the conductive layer portion 114b is filled with the conductive resin composition 115, there is an advantage of anchoring effects. By this configuration, it is possible to increase the ruggedness and reliability while the conductive resin composition 115 hardly comes off the insulating resin layer 111 and the adhesive layer 113.

Meanwhile, a plurality of multilayer wiring board assembly components each of which has been designed as illustrated in FIG. 8 can be adhesively joined to each other in the same manner in order to obtain a multilayer wiring board assembly having the same characteristics.

Figure 12:
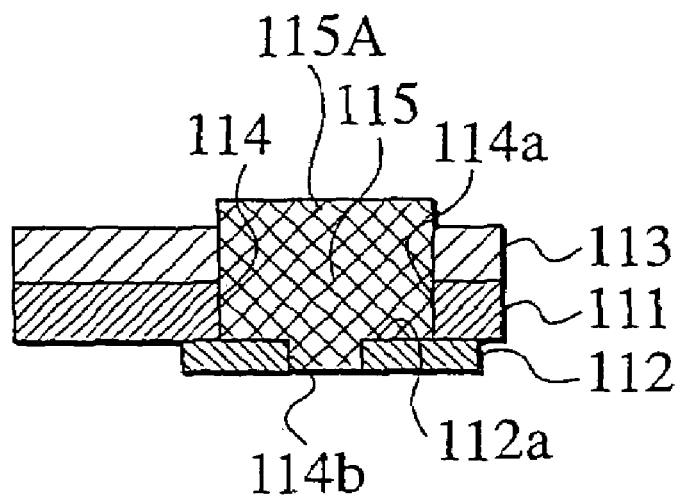
FIG. 12 is a cross sectional view showing another example of a multilayer wiring board assembly component in accordance with the first embodiment of the present invention.
Figure 13:
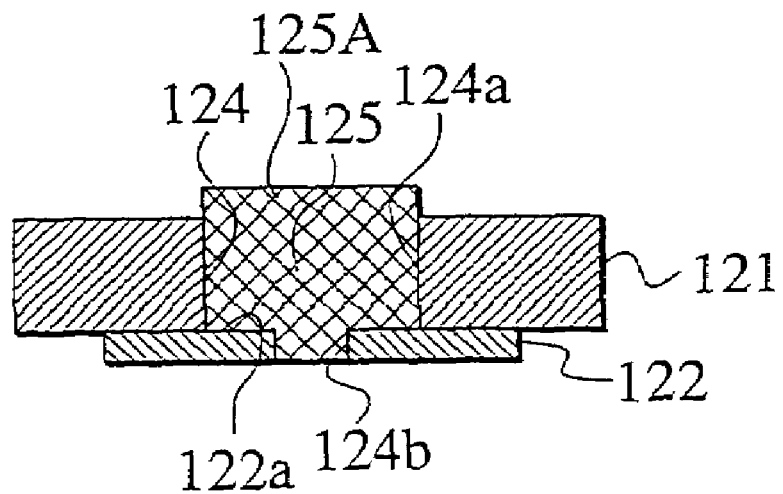
FIG. 13 is a cross sectional view showing a further example of a multilayer wiring board assembly component in accordance with the first embodiment of the present invention.

Furthermore, as illustrated in FIG. 12 and FIG. 13, the conductive resin composition 115 or 125 filling the through hole 114 or 124 is preferably formed with the projection 115A or 125A of the conductive resin composition by extending the conductive resin composition beyond the interlayer adhesive surface.

The projection 115A or 125A serves to decrease the electrical resistance of the connection by compression bonding or piercing itself to an adjacent conductive layer.

Figure 14:
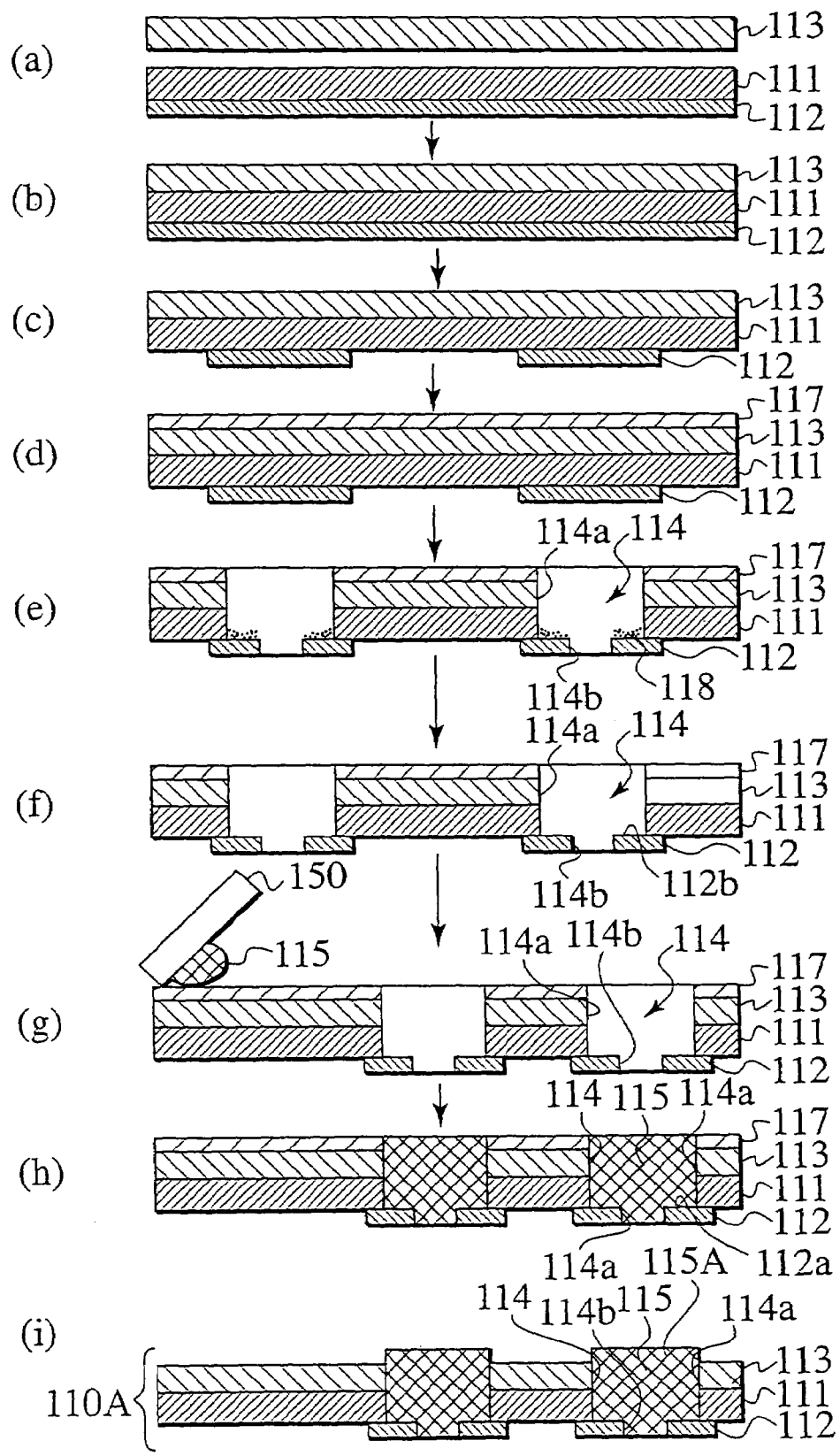
FIG. 14 is a cross sectional view showing the multilayer wiring board assembly component for use in constituting a multilayer wiring board assembly in accordance with the first embodiment of the present invention in the order of the manufacturing steps.
Figure 15:
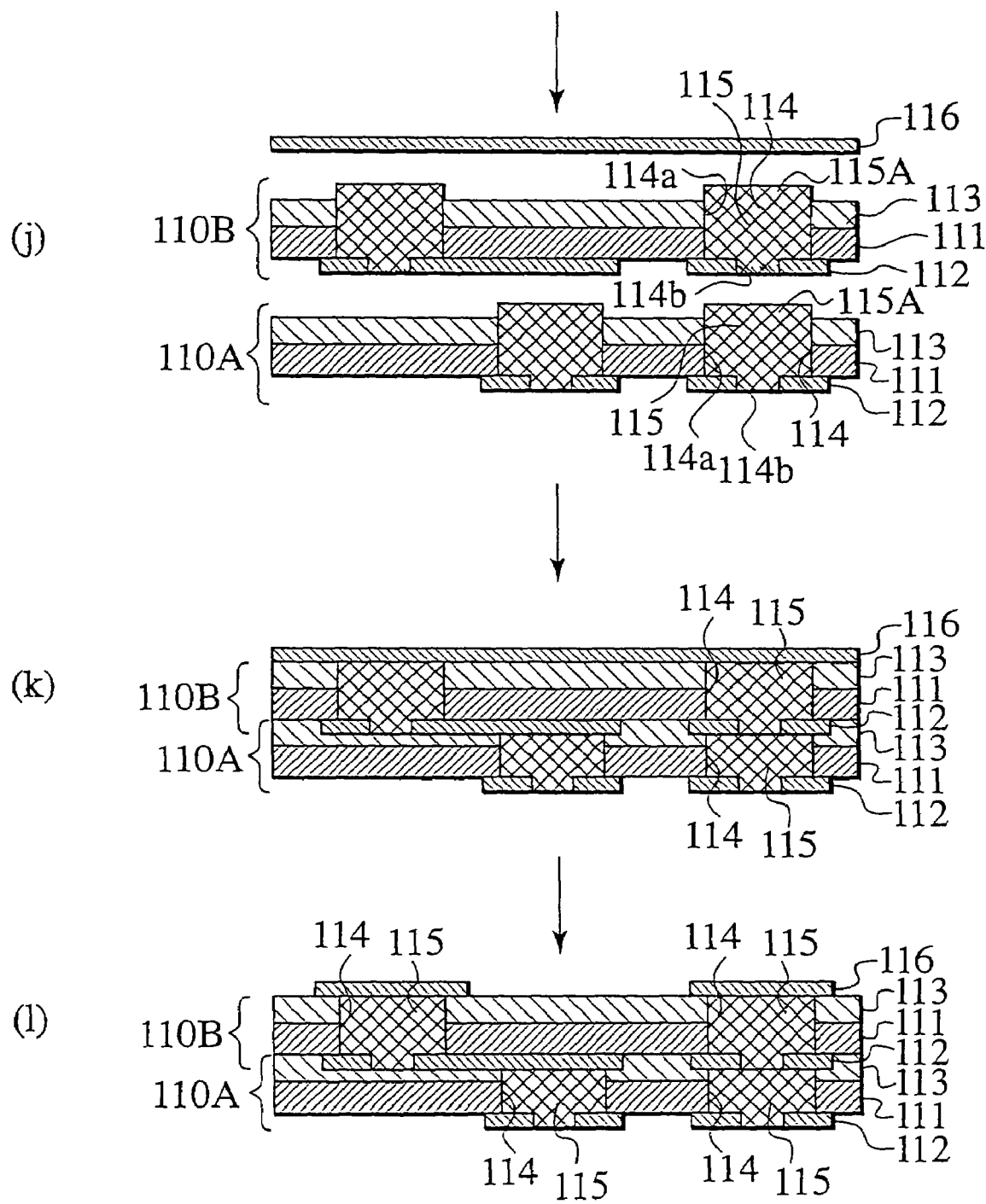
FIG. 15 is a cross sectional view showing the multilayer wiring board assembly in accordance with the first embodiment of the present invention in the order of the manufacturing steps.

Next, an embodiment of the method of manufacturing the multilayer wiring board assembly component as illustrated in FIG. 12 and an embodiment of the method of manufacturing the multilayer wiring board assembly making use of the multilayer wiring board assembly component will be explained with reference to FIG. 14 and FIG. 15.

With a starting item of a single sided copper clad laminate (CCL) comprising an insulating resin layer (polyimide film) 111 which is provided with a conductive layer 112 of a copper foil to be an electrode pattern on one surface of the insulating resin layer 111 as illustrated in FIG. 14(a), a film made of a plastic polyimide or a thermoplastic polyimide to which is given a thermosetting property is attached to the insulating resin layer 111 in order to form an adhesive layer 113 as illustrated in FIG. 14(b).

Next, as illustrated in FIG. 14(c), an electrode pattern (circuit pattern) of the conductive layer 112 is formed by etching the conductive layer 112.

Next, a PET masking tape 117 is put on the adhesive layer 113 as illustrated in FIG. 14(d), followed by opening a through hole 114 through the PET masking tape 117, the adhesive layer 113, the insulating resin layer 111 and the conductive layer 112 as illustrated in FIG. 14(e).

This through hole 114 comprises a portion 114a which is opened through the PET masking tape 117, the adhesive layer 113 and the insulating resin layer 111 and has a conventional via hole diameter, for example, a diameter of 100 µm, and a portion 114b which is opened through the conductive layer 112 and has a diameter smaller than the via hole diameter of the order of 30 to 50 µm.

After completion of opening the through hole 114, a desmearing process is performed to eliminate the lingering smear 118 of resins, oxides of the copper foil and so forth generated during opening of the through hole. The desmearing process is performed by soft etching with a plasma or by wet etching with a permanganate chlorinate base desmearing solution agent.

After completing the desmearing process as illustrated in FIG. 14(f), the through hole 114 is filled with a conductive resin composition (conductive paste) 115 from the PET masking tape 117 by squeezing with a squeeze plate 150 as used in a screen printing process as illustrated in FIG. 14(g).

FIG. 14(h) shows the conductive resin composition 115 with which the hole has been completely filled. This conductive resin composition is used to fill not only the portion 114a of the through hole 114 passing through the adhesive layer and the insulating resin layer but also the conductive layer portion 114b with no voids.

The conductive resin composition 115 has been made of a silver paste in order to avoid oxidation during heating in a later step. In this case, when the coefficient of viscosity was 300 dPa·s, it was possible to fill the hole with the conductive paste without causing the conductive paste to fall out from the small opening 114b of the copper foil member (the conductive layer 112). Meanwhile, the conductive resin composition 115 may be made of a conductive paste including a copper filler or a carbon mixture in place of a silver paste.

In the case of this embodiment of the present invention, since the PET masking tape 117 is put on the surface of the multilayer wiring board assembly component, it is possible to perform squeezing by making direct contact between the squeeze plate 150 and the substrate without making use of a metallic mask or a squeezing mask therebetween, while of course it is also possible to perform squeezing by making use of a metallic mask or a squeezing mask in order to eliminate waste losses of the conductive resin composition.

Air bubbles are discharged through the small opening 114b of the copper foil member (the conductive layer 112) during squeezing in order to prevent the air bubbles lingering inside of the through hole 114 therefore the close contact between the copper foil member (the conductive layer 112) and the conductive resin composition 115 can be surely established by the rare surface 112a of the conductive layer 112.

If the bore diameter of the large hole 114a of the resin member of the through hole 114 is of the order of 100 µm, the bore diameter of the small hole 114b can be of the order of 30 to 50 µm, which is determined in accordance with the requirement of the contact resistance and, in addition to this, with reference to the respective characteristics of the conductive resin composition 115 such as the coefficient of viscosity, the thixotropy factor thereof and so forth for the purpose of preventing air bubbles from lingering inside of the through hole 114 and preventing the conductive resin composition 115 from falling out therefrom.

Next, the PET masking tape 117, to whose surface a residue of the conductive resin composition 115 sticks, is removed as illustrated in FIG. 14(i). By this procedure, one multilayer wiring board assembly component 110 is completely formed. The projection 115A of the conductive resin composition is formed and the conductive resin composition 115 extends to the interlayer adhesive surface side, i.e., beyond the surface of the adhesive layer 113, by the removal of the PET masking tape 117. The height of the projection 115A corresponds to the thickness of the PET masking tape 117. As the first board assembly component, this multilayer wiring board assembly component 110A is thermal lamination compression bonded (laminated) to the multilayer wiring board assembly component 110B, which is manufactured by the manufacturing method as described above and as illustrated in FIG. 14(a) to FIG. 14(i) together with a conductive layer 116 which is made of a copper foil respectively by the use of an appropriate alignment technique in order to obtain a multilayered structure as illustrated in FIG. 15(j) and FIG. 15(k).

During lamination, it is possible to improve the conformation of the adhesive layer 113 to the contour of the circuit pattern of the conductive layer 112 by performing thermal compression bonding in vacuo. Also, it is possible to make close contact between the conductive resin composition 115 and other layers by performing the lamination while the conductive resin composition 115 remains soft.

Finally, as illustrated in FIG. 15(l), the most outer conductive layer 116 is etched in order to form a circuit to complete the forming of a multilayer wiring board assembly. There are no air holes lingering inside of this multilayer wiring board assembly.

The manufacturing steps of the multilayer wiring board assembly component as described above and the manufacturing steps of the multilayer wiring board assembly by making use of the multilayer wiring board assembly component are applicable in the same manner to the manufacturing steps of the multilayer wiring board assembly component as illustrated in FIG. 8 and the manufacturing steps of the multilayer wiring board assembly by making use of the multilayer wiring board assembly component.

The multilayer wiring board assembly, the multilayer wiring board assembly component and the manufacturing method thereof in accordance with the present invention is not limited to the application of flexible printed circuit boards making use of a polyimide film, but is also applicable to a flexible printed circuit board making use of a polyester film, or a rigid type making use of, as an insulating material, an epoxy resin, a woven glass fabric, the aramid nonwoven cloth and the like in the same manner.

The foregoing description of the particular embodiments has been presented for the purpose of illustration and description of the present invention. It is not intended to be exhaustive or to limit the invention to the precise form described, and it will be obvious to those skilled in the art that many modifications and variations are possible within the technical concept in accordance with the present invention.

As understood from the above explanation, in the case of the multilayer wiring board assembly, the multilayer wiring board assembly component and the manufacturing method thereof in accordance with the first embodiment of the present invention, the electrical connection between a conductive layer and a conductive resin composition is made by the use of the differential bore diameter of a through hole between the insulating substrate component and the conductive layer portion thereof, therefore it is possible to solve the respective problems originating from the requirement of securing the contact area between the conductive layer and the portion of the conductive resin composition located above the conductive layer, and to obtain a thin multilayer wiring board assembly from a general purpose copper plated resin component as a starting item without compromising the electrical connection reliability between the conductive resin composition and the conductive circuit portion and without compromising the smoothness of the substrate.

Also, since the conductive resin composition is inserted to not only the insulating substrate component portion and the adhesive layer portion (the via hole) of the through hole but also to the conductive layer portion thereof to fill it therewith, no air hole is formed after lamination therefore film peeling or separation does not occur even if a reliability test is carried out by exposing the multilayer wiring board assembly to a high temperature. In addition to this, it is possible to increase the contact area between the conductive layer and the conductive paste filling the via hole by the area of the inner peripheral wall of the conductive layer portion.

On the other hand, while the through hole is opened by a laser boring process in the case of the multilayer wiring board assembly, the multilayer wiring board assembly component and the manufacturing method thereof in accordance with the first embodiment of the present invention, depending on the condition, it could be inevitable that air bubbles remain.

Figure 27:
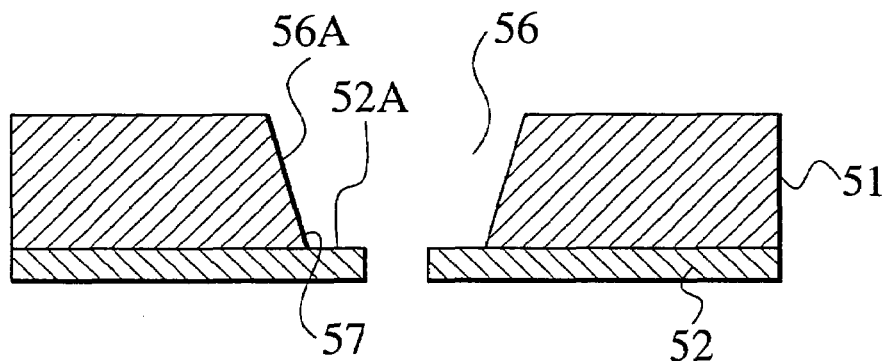
FIG. 27 is a cross sectional view showing the profile of a through hole in the multilayer wiring board assembly component in accordance with a conventional technique.
Figure 28:
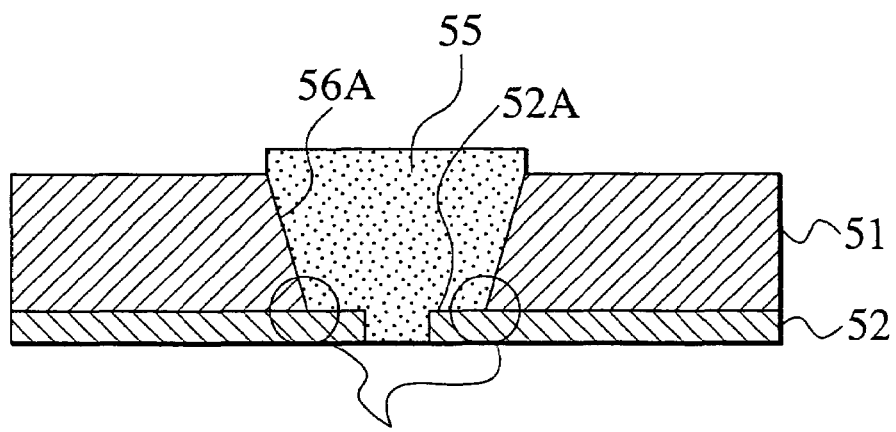
FIG. 28 is a cross sectional view showing the shortcomings of the IVH structure of a multilayer wiring board assembly component in accordance with a conventional technique.

In the case where the through hole is opened by a laser boring process, even if the side wall is formed at a slant as illustrated in FIG. 27, because of the profile, which is extremely rectilinear, in the cross section of the inner wall surface 56A of the through hole 56 along the insulating substrate component 51, there is an angular corner (the locally deformed portion) 57 formed between the inner wall surface 56A of the through hole 56 and the rare surface 52A of the copper foil member 52.

Because of this, when the through hole 56 is filled with the conductive resin composition 55, a stagnating location forms in the boundary location between the insulating substrate component 51 and the copper foil member 52 within the through hole 56, i.e., the location as encircled by a circle mark ◯ from which air is not sufficiently released so that air is often inserted to the conductive resin composition 55 in the location and remains as bubbles in the conductive resin composition 55.

These lingering air bubbles tend to cause fluctuation in the contact area between the conductive resin composition 55 and the copper foil member 52 in the rare surface of 52A of the copper foil member 52 and makes the electrical connection between the conductive resin composition 55 and the copper foil member 52 unstable.

The second embodiment and the third embodiment of the present invention as explained in the following description have been developed to solve the shortcomings as described above and it is an objective to provide a multilayer wiring board assembly component, a manufacturing method thereof and a multilayer wiring board assembly having a structure in which the electrical connection between a copper foil member (conductive layer) and a conductive resin composition filling a via hole is made by the rare surface of the copper foil in order so that air bubbles hardly remain in the conductive resin composition filling the via hole and therefore the electrical connection reliability between the conductive resin composition and the copper foil member is improved.

In what follows, the second embodiment in accordance with the present invention will be explained in detail with reference to the accompanied drawings.

Figure 17:
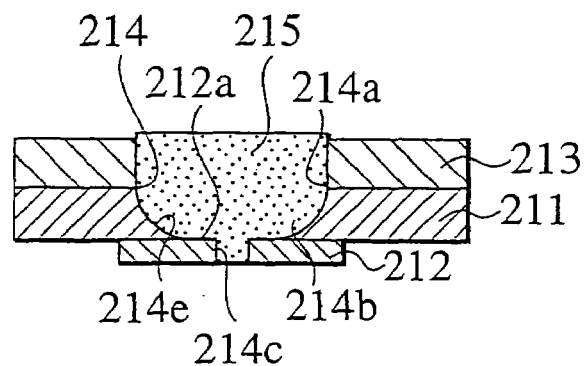
FIG. 17 is a cross sectional view showing the basic configuration of a multilayer wiring board assembly component in accordance with a second embodiment of the present invention.

FIG. 17 shows the basic configuration of a multilayer wiring board assembly component in accordance with the second embodiment of the present invention.

The multilayer wiring board assembly component as illustrated in FIG. 17 is composed of an insulating resin layer 211 as an insulating substrate component which is provided with a conductive layer 212 of a copper foil and the like as an electrode pattern on one surface of the insulating resin layer 211 and an adhesive layer 213 for interlayer connection on the other surface respectively with a through hole 214 formed passing through the adhesive layer 213, the insulating resin layer 211 and the conductive layer 212. The through hole 214 is filled with a conductive resin composition 215 in order to form an IVH (via hole).

In the case of an FPC, the insulating resin layer 211 is composed of a flexible resin film such as a polyimide film, a polyester film or the like made of a wholly aromatic polyimide (API) and the like in order to form a triple layered structure of the insulating resin layer 211, the conductive layer 212 and the adhesive layer 213 in which a polyimide base adhesive material as the adhesive layer 213 is attached to the surface of the polyimide member (the insulating resin layer 211) of the general purpose single sided copper plated polyimide component as opposite to the surface contacting the copper foil (the conductive layer 212).

The adhesive layer 213 made of a polyimide base adhesive material can be formed by attaching a thermoplastic polyimide film or a film which is made by giving a thermosetting property to a thermoplastic polyimide film. In the case of the use of a thermoplastic polyimide film, taking into consideration the heat resistance of the substrate, it is preferred to use a material having a high glass transition temperature.

The through hole 214 includes a portion 214a which is opened through the adhesive layer 213, a portion 214b which is opened through the insulating resin layer 211, and a portion 214c which is opened through the conductive layer 212. The bore diameters of the portion 214a and the portion 214b are conventional via hole diameters while the bore diameter of the portion 214c is smaller than the bore diameter of the portion 214a or 214b passing through the adhesive layer 213 or the insulating resin layer 211. Particularly, the profile of the vertical cross section of the insulating substrate component portion 214b is made to be curved circular. Namely, the insulating substrate component portion 214b of the through hole 214 has a cone-shaped (mortar like) surface in order so that the inner wall surface of the through hole 214 is connected to the rare surface 212a of the conductive layer 212 by an arc-like surface 214e. That is, as illustrated in the vertical cross sectional view of FIG. 17, the inner wall surface 214e of the insulating resin layer 211 has a curved profile as seen in the vertical cross section. In this case, the arc-like surface 214e may be a circular surface (spherical surface) having a constant curvature at each point, a plurality of curved surface portions having different curvatures which are smoothly connected to each other, a surface of an ellipsoid of revolution, a surface of an paraboloid of revolution, and the like curved surface.

Figure 18:
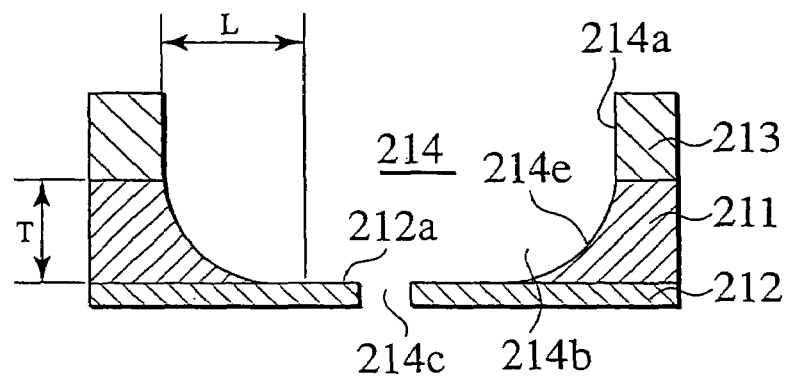
FIG. 18 is a cross sectional view showing the profile of a through hole in the multilayer wiring board assembly component in accordance with the second embodiment of the present invention.

The through hole 214b corresponding to the insulating resin layer 211 made of a polyimide can be opened by an etching process with a liquid etchant in order so that the inner wall surface of the through hole 214 has the arc-like surface 214e by the use of the fact that the cavity profile of the etching becomes arc-like in accordance with the viscosity, isotropic movement and reaction of the liquid etchant. By this configuration, it is assumed that (Insulating Component Thickness T)/(Side Etch Depth L)=(Etching Factor) as illustrated in FIG. 18, the etching factor is no higher than 1 so that the inner wall surface of the through hole 214 has the arc-like surface 214e with which the inner wall surface is smoothly connected to the rare surface 212a of the conductive layer 212 without forming a rectilinear locally deformed portion.

By this configuration, the air release from the through hole 214 is sufficiently performed during filling of the through hole 214 with the conductive resin composition 215 so that no air bubble remains within the conductive resin composition 215 filling the through hole 214, and therefore the electrical connection between the rare surface 212a of the conductive layer 212 and the conductive resin composition 215 filling the via hole (the through hole 214) becomes reliable by a sufficient contact area therebetween.

Figure 19:
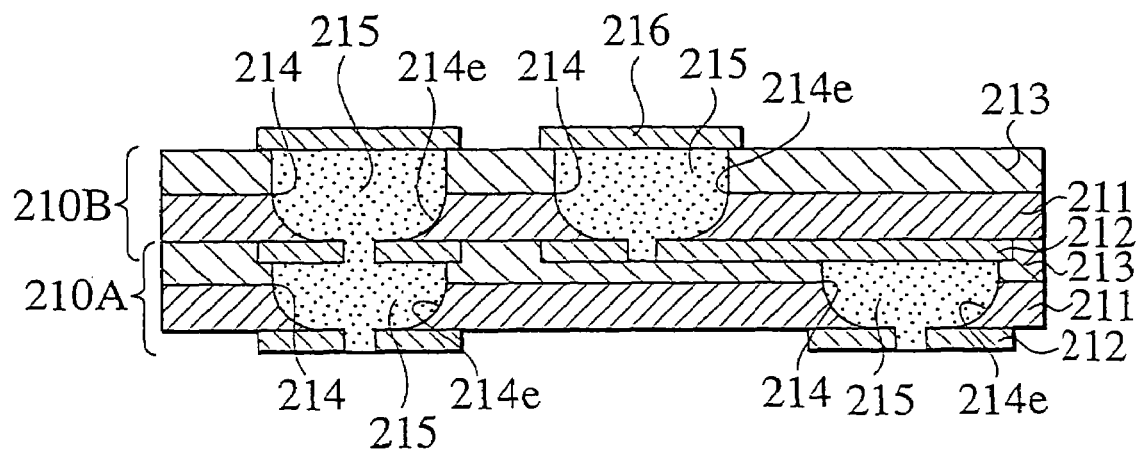
FIG. 19 is across sectional view showing a multilayer wiring board assembly component in accordance with the second embodiment of the present invention.

FIG. 19 is a schematic diagram showing an embodiment of a multilayer wiring board assembly making use of a multilayer wiring board assembly component in accordance with the second embodiment of the present invention. This multilayer wiring board assembly is formed by adhesively joining together two multilayer wiring board assembly components, each of which has been designed as illustrated in FIG. 17 as a first board assembly component 210A and a second layer substrate 210B by making the adhesive layer 213 of the first layer substrate 210A adhere to the second layer substrate 210B. A conductive layer 216 made of a copper foil serving to provide an electrode of the upper surface is formed on the adhesive layer 213 of the second board assembly component 210B.

Each respective through hole 214 functioning as an IVH filled with the conductive resin composition 215 is smoothly connected to the rare surface 212a of the conductive layer 212 by the arc-like surface 214e of the inner wall surface without forming a rectilinear locally deformed portion, so that no air bubble remains within the conductive resin composition 215 filling the through hole 214, and therefore the electrical connection among the conductive layers 212 and the conductive layers 216 of the respective layers becomes reliable by a sufficient contact area therebetween.

Figure 20:
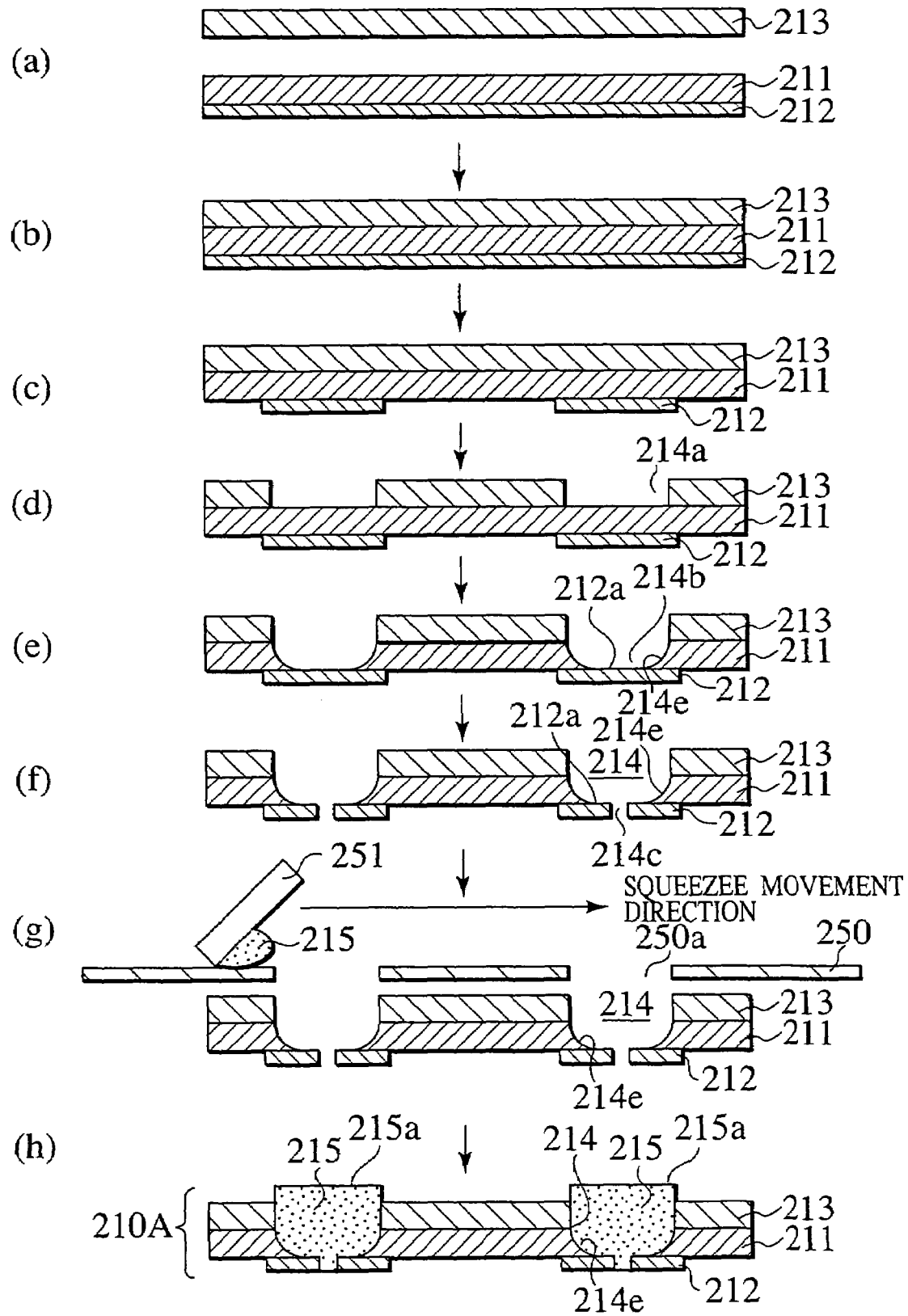
FIG. 20 is a cross sectional view showing the multilayer wiring board assembly component for use in constituting a multilayer wiring board assembly in accordance with the second embodiment of the present invention in the order of the manufacturing steps.
Figure 21:
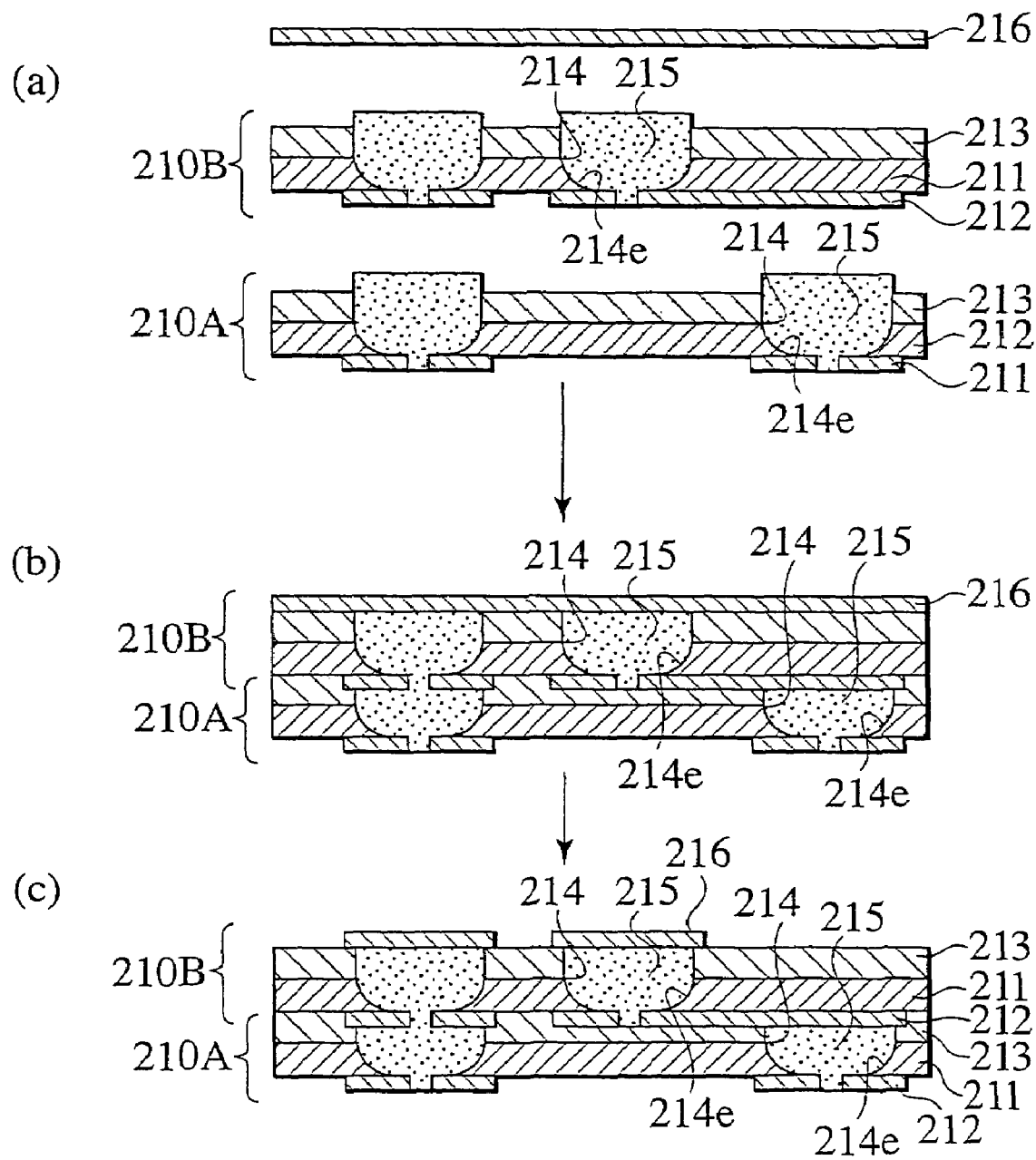
FIG. 21 is a cross sectional view showing the multilayer wiring board assembly in accordance with the second embodiment of the present invention in the order of the manufacturing steps.

Next, an embodiment of the method of manufacturing the multilayer wiring board assembly component as illustrated in FIG. 17 and an embodiment of the method of manufacturing the multilayer wiring board assembly making use of the multilayer wiring board assembly component will be explained with reference to FIG. 20 and FIG. 21.

First of all, as illustrated in FIG. 20(a) and FIG. 20(b), a film made of a thermoplastic polyimide or a thermoplastic polyimide to which is given a thermosetting property is attached to an insulating resin layer (polyimide film) 211 provided with a conductive layer 212 of a copper foil on one surface of the insulating resin layer 211, in order to form an adhesive layer 213.

Next, as illustrated in FIG. 20(c), an electrode pattern (circuit pattern) of the conductive layer 212 is formed by etching the conductive layer 212. In the case where the conductive layer 212 is made of a copper foil, etching the copper foil can be carried out with an etchant having copper chloride or a water solution having ferric chloride.

Next, an etching resist (not shown in the figure) is coated on the adhesive layer 213, followed by etching the adhesive layer 213 to form a through hole 214a at each of the predetermined locations as illustrated in FIG. 20(d).

In the case where the adhesive layer 213 is made of a thermoplastic polyimide, the adhesive layer 213 can be etched by a mixture of potassium hydroxide, hydrazine and ethylenediamine, or a liquid etchant which is prepared for etching a thermoplastic polyimide and includes, as main components, an alkali hydroxide, hydrazine and 1,3 dimethyl-2-imidazolidinone.

Then, as illustrated in FIG. 20(e), a through hole 214b is formed at each of the predetermined locations by etching the insulating resin layer 211.

While etching the polyimide film 211 can be done with a liquid etchant for a polyimide equivalent to a liquid etchant as prepared for etching a thermoplastic polyimide, it is required to determine the etching condition in order not to form a step between the polyimide film 211 and the adhesive layer (the thermoplastic polyimide) 213.

Also, while air bubbles tend to remain near the boundary between the insulating resin layer 211 and the conductive layer 212 within the IVH (the through hole 214) during filling of the through hole 214 with the conductive resin composition in a later step, if the edge of the insulating resin layer 211 is precipitous, the etching factor defined as in FIG. 18 was no higher than 1 when the insulating resin layer 211 was etched with a liquid etchant to form the edge which is not so precipitous so that the inner wall surface of the through hole 214 has the arc-like surface 214e with which the inner wall surface is smoothly connected to the rare surface 212a of the conductive layer 212 without forming a rectilinear locally deformed portion (curved corner) to improve the efficiency of removing air bubbles.

Meanwhile, the adhesive layer 213 and the insulating resin layer 211 can be etched at a time if etchants having the same etching rates are used. In this case, if a plasma etching technique is used, these two layers are etched with the same etching rates. Also, in the case of making use of a laser boring process, it is possible to form an arc-like surface in the inner wall surface of the through hole 214 by making use of a laser beam having an intensity distribution corresponding to the profile as required.

Next, as illustrated in FIG. 20(f), a small hole 214c is opened through the conductive layer 212 by etching, a laser process or the like to complete the formation of the through holes 214.

After the formation of the through holes 214, as illustrated in FIG. 20(g), a metallic mask 250 is put on the adhesive layer 213 in order to align each of the respective through holes 214 to a corresponding one of openings 250a of the metallic mask 250, followed by filling the through hole 214 with a conductive resin composition (conductive paste) 215 through the metallic mask 250 by squeezing with a squeeze plate 250 as used in a screen printing process. FIG. 20(h) shows the conductive resin composition 215 with which the hole has been completely filled.

The conductive resin composition 215 has been made of a silver paste in order to avoid oxidation during heating in a later step. In this case, when the coefficient of viscosity was 300 dPa·s, it was possible to fill the hole with the conductive paste without causing the conductive paste to fall out from the small opening 214c of the copper foil member (the conductive layer 212). Meanwhile, the conductive resin composition 215 may be made of a conductive paste including a copper filler or a carbon mixture in place of a silver paste.

While a mask is used when the conductive resin composition 215 is inserted by a printing technique, the electrical reliability after lamination can not be ensured when a screen mask is used since part of the conductive resin composition is drawn out by the mesh of the screen mask in the locations corresponding to the screen openings. However, this shortcoming can be removed by the use of the metallic mask 250 for the printing technique.

In this case, since the cross section of the IVH (the through hole 214) has a smooth arc-like profile in the insulating resin layer (polyimide location) 214b, air bubbles are readily removed through the small opening 214c of the copper foil (the conductive layer 212) so that the copper foil member (the conductive layer 212) and the conductive resin composition 215 are surely adhered to each other by the rare surface 212a of the conductive layer 212.

Also, in the case of this embodiment as illustrated in FIG. 20(h), the end 215a of each conductive resin composition 215 is somewhat projected beyond the adhesive layer 213 for the purpose of improving the connection.

The diameter of the small opening 214c of the conductive layer 212 is determined in accordance with the requirement of the contact resistance and, in addition to this, with reference to the respective characteristics of the conductive resin composition 215 such as the coefficient of viscosity, the thixotropy factor thereof and so forth for the purpose of preventing air bubbles from lingering inside of the through hole 214 and preventing the conductive resin composition 215 from falling out therefrom. If the bore diameter of the through hole is a conventional via hole diameter of 100 μm at the locations 214a and 214b opened through the adhesive layer 213 and the insulating resin layer 211, the bore diameter of the small hole 214b can be of the order of 30 to 50 μm smaller than the conventional via hole diameter.

After filling the through hole 214 with the conductive resin composition 215, as illustrated in FIG. 20(h), one multilayer wiring board assembly component 210A is completely formed by removing the metallic mask 250.

As the first board assembly component, this multilayer wiring board assembly component 210A is thermal lamination compression bonded (laminated) to the multilayer wiring board assembly component 210B which is manufactured by the manufacturing method as described above and as illustrated in FIG. 20(a) to FIG. 20(h) together with a conductive layer 216 which is made of a copper foil respectively by the use of an appropriate alignment technique in order to obtain a multilayered structure as illustrated in FIG. 21(a) and FIG. 21(b).

During lamination, it is possible to improve the conformation of the adhesive layer 213 to the contour of the circuit pattern of the conductive layer 212 by performing thermal compression bonding in vacuo. Also, it is possible to make close contact between the conductive resin composition 215 and other layers by performing the lamination while the conductive resin composition 215 remains soft.

Finally, as illustrated in FIG. 21(c), the most outer conductive layer 216 is etched in order to form a circuit to complete the forming of a multilayer wiring board assembly.

Figure 22:
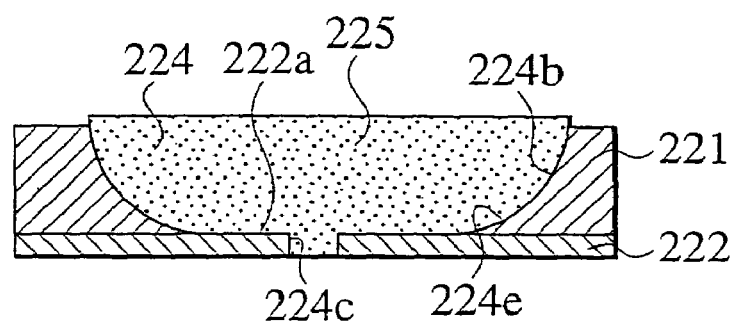
FIG. 22 is a cross sectional view showing the basic configuration of a multilayer wiring board assembly component in accordance with a third embodiment of the present invention.

FIG. 22 shows the basic configuration of a multilayer wiring board assembly component in accordance with the third embodiment of the present invention.

In the multilayer wiring board assembly component as illustrated in FIG. 22, the insulating resin layer 221 itself, as an insulating substrate component, has adhesivity for inter-layer connection and is provided with a conductive layer 222 made of a copper foil and the like as an electrode pattern on one surface of the insulating resin layer 221 while the through hole 224 is opened through the insulating resin layer 221 and the conductive layer 222. The through hole 224 is filled with the conductive resin composition 225 in order to form an IVH (via hole).

In the case of an FPC, the insulating resin layer 221 having adhesivity is formed of a thermoplastic polyimide (TPI) or a thermoplastic polyimide to which a thermosetting property is given. In the case of the use of a thermoplastic polyimide film, taking into consideration the heat resistance of the substrate, it is preferred to use a material having a high glass transition temperature.

The through hole 224 includes a portion 224b which is opened through the insulating resin layer 221 and a portion 224c which is opened through the conductive layer 222. The bore diameter of the portion 224b is a conventional via hole diameter while the bore diameter of the portion 224c is smaller than the bore diameter of the portion 224b passing through the insulating resin layer 221. Particularly, the profile of the vertical cross section of the insulating substrate component portion 224b is made to be curved circular. Namely, the insulating substrate component portion 224b of the through hole 224 has a cone-shaped (mortar like) surface in order so that the inner wall surface of the through hole 224 is connected to the rare surface of 222a of the conductive layer 222 by an arc-like surface 224e. That is, as illustrated in the vertical cross sectional view of FIG. 22, the inner wall surface 224e of the insulating resin layer 221 has a curved profile as seen in the vertical cross section.

The through hole 224 corresponding to the insulating resin layer 221 made of a polyimide can be opened by an etching process with a liquid etchant in order so that the inner wall surface of the through hole 224 has the arc-like surface 224e by use of the fact that the cavity profile of the etching becomes arc-like in accordance with the viscosity, isotropic movement and reaction of the liquid etchant. Also in this case, by this configuration, it is assumed that (the insulating substrate component thickness T)/(the side etch depth L)=(the etching factor) as illustrated in FIG. 18, the etching factor is no higher than 1 so that the inner wall surface of the throughhole 224 has the arc-like surface 224e with which the inner wall surface is smoothly connected to the rare surface of 222a of the conductive layer 222 without forming a rectilinear locally deformed portion.

By this configuration, the air release from the through hole 224 is sufficiently performed during filling of the through hole 224 with the conductive resin composition 225 so that no air bubble remains within the conductive resin composition 225 filling the through hole 224, and therefore the electrical connection between the rare surface of 222a of the conductive layer 222 and the conductive resin composition 225 filling the via hole (the through hole 224) becomes reliable by a sufficient contact area therebetween.

Figure 23:
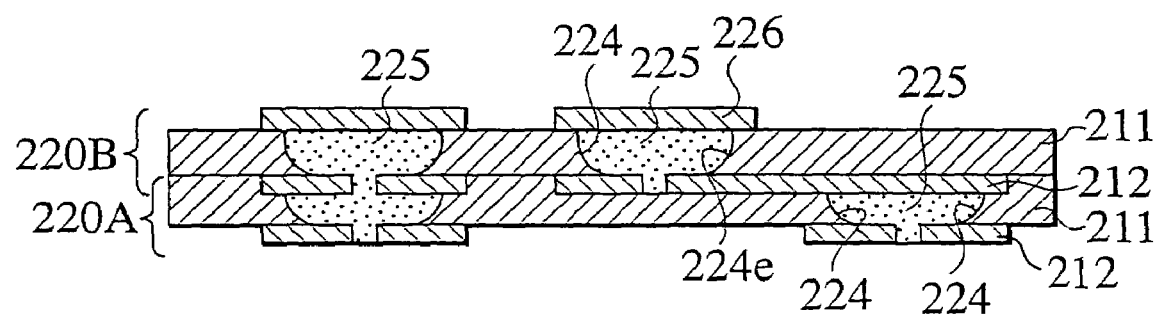
FIG. 23 is across sectional view showing a multilayer wiring board assembly component in accordance with the third embodiment of the present invention.

FIG. 23 is a schematic diagram showing an exemplary implementation of a multilayer wiring board assembly in accordance with this embodiment of the present invention. This multilayer wiring board assembly is formed by adhesively joining together two multilayer wiring board assembly components each of which has been designed as illustrated in FIG. 22 as a first board assembly component 220A and a second layer substrate 220B by making the insulating resin layer 221 having adhesivity to the first layer substrate 220A, adhere to the second layer substrate 220B. A conductive layer 226 made of a copper foil serving to provide an electrode of the upper surface is formed on the insulating resin layer 221 of the second board assembly component 220B.

Each respective through hole 224 functioning as an IVH filled with the conductive resin composition 225 is smoothly connected to the rare surface of 222a of the conductive layer 222 by the arc-like surface 224e of the inner wall surface without forming a rectilinear locally deformed portion (curved corner), so that no air bubble remains within the conductive resin composition 225 filling the through hole 224, and therefore the electrical connection among the conductive layers 222 and the conductive layers 226 of the respective layers becomes reliable because of sufficient contact area therebetween.

Figure 24:
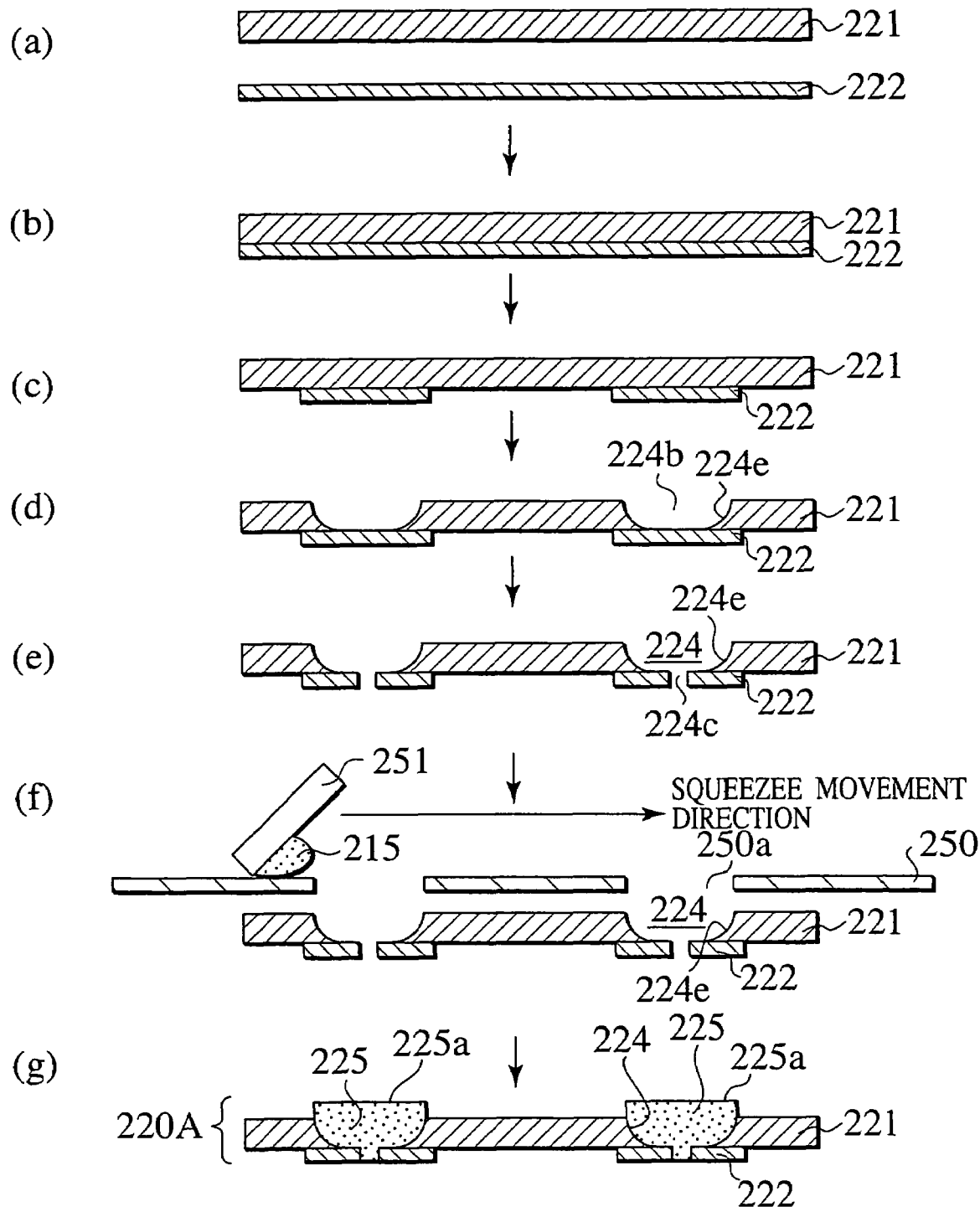
FIG. 24 is a process chart showing an embodiment of the method of manufacturing the multilayer wiring board assembly component in accordance with the third embodiment of the present invention.

Next, an embodiment of the method of manufacturing the multilayer wiring board assembly component as illustrated in FIG. 22 and an embodiment of the method of manufacturing the multilayer wiring board assembly making use of the multilayer wiring board assembly component will be explained with reference to FIG. 24 and FIG. 25.

First of all, as illustrated in FIG. 24(a) and FIG. 24(b), the conductive layer 222 made of a copper foil is attached to one surface of the insulating resin layer (thermoplastic polyimide film) 221. Conversely speaking, a thermoplastic polyimide film (polyimide base adhesive material) is attached to the conductive layer 222 made of the copper foil.

Next, as illustrated in FIG. 24(c), an electrode pattern (circuit pattern) of the conductive layer 222 is formed by etching the conductive layer 222. In the case where the conductive layer 222 is made of a copper foil, etching the copper foil can be carried out with an etchant having copper chloride or a water solution having ferric chloride.

Next, an etching resist (not shown in the figure) is coated on the insulating resin layer (thermoplastic polyimide film) 221, followed by etching the insulating resin layer 221 to form a through hole 224b at each of the predetermined locations as illustrated in FIG. 24(d).

In the case where the insulating resin layer 221 is made of a thermoplastic polyimide, the insulating resin layer 221 can be etched by a mixture of potassium hydroxide, hydrazine and ethylenediamine, or a liquid etchant which is prepared for etching a thermoplastic polyimide and includes, as main components, an alkali hydroxide, hydrazine and 1,3 dimethyl-2-imidazolidinone. Thereafter, the etching resist is removed from the surface of the adhesive layer.

Also, while air bubbles tend to remain near the boundary between the insulating resin layer 221 and the conductive layer 222 within the IVH (the through hole 224) during filling of the through hole 224 with the conductive resin composition in a later step, if the edge of the insulating resin layer 221 is precipitous, the etching factor defined as in FIG. 18 was no higher than 1 when the insulating resin layer 221 was etched with a liquid etchant to form the edge which is not so precipitous. Therefore, the inner wall surface of the through hole 224 has the arc-like surface 224e with which the inner wall surface is smoothly connected to the rare surface of 222a of the conductive layer 222 without forming a rectilinear locally deformed portion and it improves the efficiency of removing air bubbles.

Next, as illustrated in FIG. 24(e), a small hole 224c is opened through the conductive layer 222 by etching, a laser process or the like to complete the formation of the through holes 224.

After the formation of the through holes 224, as illustrated in FIG. 24(f), a metallic mask 250 is put on the insulating resin layer 221 in order to align each of the respective through holes 224 to a corresponding one of openings 250a of the metallic mask 250, followed by filling the through hole 224 with a conductive resin composition (conductive paste) 225 through the metallic mask 250 by squeezing with a squeeze plate 250 as used in the screen printing process. FIG. 24(g) shows the conductive resin composition 225 with which the hole has been completely filled.

The conductive resin composition 225 has been made of a silver paste in order to avoid oxidation during heating in a later step. In this case, when the coefficient of viscosity was 300 dPa·s, it was possible to fill the hole with the conductive paste without causing the conductive paste to fall out from the small opening 224c of the copper foil member (the conductive layer 222). Meanwhile, the conductive resin composition 225 may be made of a conductive paste including a copper filler or a carbon mixture in place of a silver paste.

While a mask is used when the conductive resin composition 225 is inserted by a printing technique, the electrical reliability after lamination can not be ensured when a screen mask is used since the conductive resin composition is drawn by the mesh of the screen mask corresponding to the screen openings. However, this shortcoming can be removed by the use of the metallic mask 250 for the printing technique.

In this case, since the cross section of the IVH (the thermoplastic polyimide 224) has a smooth arc-like profile in the insulating resin layer (polyimide location) 224b, air bubbles are readily removed through the small opening 224c of the copper foil (the conductive layer 222) so that the copper foil member (the conductive layer 222) and the conductive resin composition 225 are surely adhered to each other by the rare surface of 222a of the conductive layer 222.

Also, in the case of this embodiment as illustrated in FIG. 24(g), the end 225a of each conductive resin composition 225 is somewhat projected beyond the insulating resin layer 221 for the purpose of improving the connection.

The diameter of the small opening 224c of the conductive layer 222 is determined in accordance with the requirement of the contact resistance and, in addition to this, with reference to the respective characteristics of the conductive resin composition 225 such as the coefficient of viscosity, the thixotropy factor thereof and so forth for the purpose of preventing air bubbles from lingering inside of the through hole 224 and preventing the conductive resin composition 225 from falling out therefrom. If the bore diameter of the through hole is a conventional via hole diameter of 100 μm at the location 224b through the insulating resin layer 221, the bore diameter of the small hole 224c through the conductive layer 222 can be of the order of 30 to 50 μm smaller than the conventional via hole diameter.

After filling the through hole 224 with the conductive resin composition 225, as illustrated in FIG. 24(g), one multilayer wiring board assembly component 220A is completely formed by removing the metallic mask 250.

As the first board assembly component, this multilayer wiring board assembly component 220A is thermal lamination compression bonded (laminated) to the multilayer wiring board assembly component 220B, which is manufactured by the manufacturing method as described above and as illustrated in FIG. 24(a) to FIG. 24(f) together with a conductive layer 226 which is made of a copper foil respectively by the use of an appropriate alignment technique in order to obtain a multilayered structure as illustrated in FIG. 25(a) and FIG. 25(b).

During lamination, it is possible to improve the conformation of the insulating resin layer 221 to the contour of the circuit pattern of the conductive layer 222 by performing thermal compression bonding in vacuo. Also, it is possible to make close contact between the conductive resin composition 225 and other layers by performing the lamination while the conductive resin composition 225 remains soft.

Finally, as illustrated in FIG. 25(c), the most outer conductive layer 226 is etched in order to form a circuit to complete the forming of a multilayer wiring board assembly.

Figure 26:
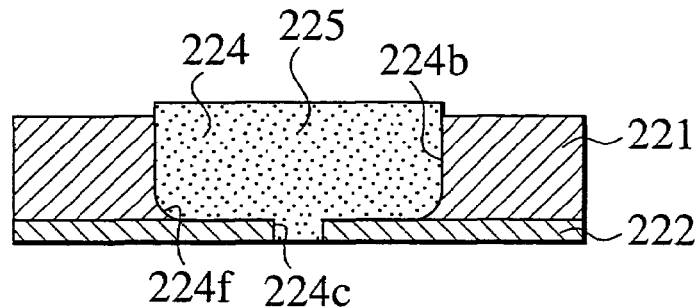
FIG. 26 is a cross sectional view showing an exemplary modification of the multilayer wiring board assembly component in accordance with the third embodiment of the present invention.

Meanwhile, the through hole 224 may not necessarily have an etching factor no higher than 1. For example, as illustrated in FIG. 26, the inner wall surface of the through hole 224 of the insulating resin layer 221 may have an R surface 224f with which the inner wall surface is smoothly connected to the rare surface of 222a of the conductive layer 222 without forming a rectilinear locally deformed portion.

While the embodiments in accordance with the second embodiment and the third embodiment of the present invention have been described as flexible printed circuit boards, the present invention is not limited to the application thereto but applicable also to a rigid type printed circuit board. In the case where the insulating substrate component is made of a prepreg or an epoxy resin base material including an inorganic filler, a glass cloth or the like, it is possible to open a through hole in a mortar-like form by ion etching or plasma etching with a chlorine base gas or a fluorine base gas in the same manner as described with the above embodiments.

As understood from the above explanation, in the case of the multilayer wiring board assembly, the multilayer wiring board assembly component and the manufacturing method thereof in accordance with the second embodiment and the third embodiment of the present invention, since the insulating substrate component portion of the through hole has a curved inner wall surface as seen in a vertical cross sectional view, the rare surface of the conductive layer and the inner wall surface of the through hole are continuously connected to each other without forming a rectilinear locally deformed portion, while the air release from the through hole is sufficiently performed during filling of the through hole with the conductive resin composition so that no air bubbles remain within the conductive resin composition filling the through hole, therefore the electrical connection between the rare surface of the conductive layer and the conductive resin composition filling the via hole becomes highly reliable and stable.

Also, in the case of the above described configuration where the electrical connection between the conductive layer and the conductive resin composition of an IVH filling the through hole is made by the rare surface of the conductive layer, the total area of the electrical connection between this conductive layer and the conductive resin composition could be narrower than that in the case where no through hole is opened through the conductive layer so that the contact electric resistance between the conductive layer and the conductive resin composition could become higher due to the formation of the through hole passing through the conductive layer.

The fourth embodiment and the fifth embodiment of the present invention, as explained in the following description, have been developed to solve the shortcomings as described above and it is an objective to provide a multilayer wiring board assembly component, a manufacturing method thereof and a multilayer wiring board assembly having a structure in which the electrical contact area of the rare surface of the conductive layer is prevented from decreasing due to the through hole passing through the conductive layer while conversely the contact electric resistance is decreased by the provision of the through hole passing through the conductive layer.

In what follows, the fourth embodiment in accordance with the present invention will be explained in detail with reference to the accompanied drawings.

Figure 29:
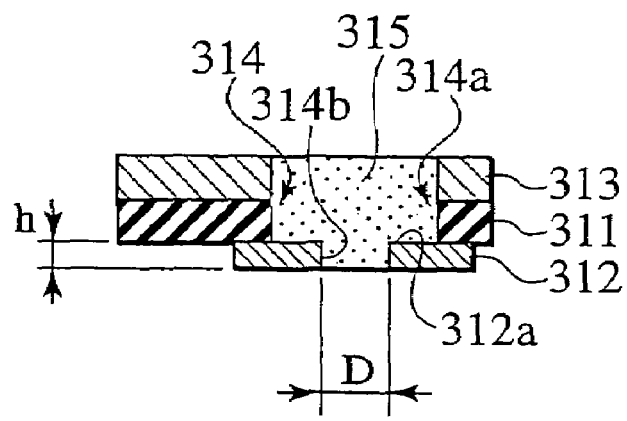
FIG. 29 is a cross-sectional view showing a multilayer wiring board assembly component in accordance with a fourth embodiment of the present invention.

FIG. 29 shows the basic configuration of a multilayer wiring board assembly component in accordance with the fourth embodiment of the present invention.

The multilayer wiring board assembly component as illustrated in FIG. 29 is composed of an insulating resin layer 311 as an insulating substrate component which is provided with a conductive layer 312 of a copper foil and the like as an electrode pattern on one surface of the insulating resin layer 311 and an adhesive layer 313 for interlayer connection on the other surface respectively with a through hole 314 formed passing through the adhesive layer 313, the insulating resin layer 311 and the conductive layer 312. The through hole 314 is filled with a conductive resin composition 315 in order to form an IVH (via hole).

In the case of an FPC, the insulating resin layer 311 is composed of a flexible resin film such as a polyimide film, a polyester film or the like made of a wholly aromatic polyimide (API) and the like in order to form a triple layered structure of the insulating resin layer 311, the conductive layer 312 and the adhesive layer 313 in which a polyimide base adhesive material used as the adhesive layer 313 is attached to the surface of the polyimide member (the insulating resin layer 311) of the general purpose single sided copper plated polyimide component compared to opposite the surface contacting the copper foil (the conductive layer 312).

The adhesive layer 313 made of a polyimide base adhesive material can be formed by attaching a thermoplastic polyimide film or a film which is made by giving a thermosetting property to a thermoplastic polyimide film. In the case of the use of a thermoplastic polyimide film, taking into consideration the heat resistance of the substrate, it is preferred to use a material having a high glass transition temperature.

The through hole 314 includes a portion which is opened through the adhesive layer 313 and the insulating resin layer 311, i.e., an insulating layer through hole 314a which is opened in the form of a cylindrical profile having a circular horizontal cross section with a conventional via hole diameter. The through hole 314 also includes a portion which is opened through the conductive layer 312 as a conductive layer through hole 314b opened in the form of a cylindrical profile having a circular horizontal cross section with a via hole diameter smaller than the diameter of the insulating layer through hole 314a. By this configuration, the horizontal cross sectional area of the conductive layer through hole 314b is smaller than the horizontal cross sectional area of the insulating layer through hole 314a.

Also, in this case, the diameter of the conductive layer through hole 314b and the thickness of the conductive layer 312 are determined in order so that the area of the inside surface (the inner peripheral side wall) of the conductive layer through hole 314b is greater than the horizontal cross sectional area of the conductive layer through hole 314b at the opening end to the insulating layer through hole 314a. In other words, this means that the total contact area of the conductive resin composition 315 to the conductive layer 312 in the case where the conductive layer through hole 314b is formed is greater than the total contact area in the case where the conductive layer through hole 314b is not formed.

It is assumed that the diameter of the conductive layer through hole 314b is D and that the layer thickness of the conductive layer 312 is h, therefore, the following equations (1) and (2) is the conditional expression required of the total contact area of the inner side wall of the conductive layer through hole 314b being greater than the total contact area of the horizontal cross sectional area of the conductive layer through hole 314b at the opening end to the insulating layer through hole 314a.

$$\pi \cdot D \cdot H \geq \pi (D/2)^2 \quad (1)$$

$$D \leq 4h \quad (2)$$

Accordingly, in the case where the conductive layer through hole 314b is a through hole having a cylindrical profile of a circular horizontal cross section, the diameter D of the conductive layer through hole 314b is determined to be no larger than four times the layer thickness h of the conductive layer 312 so that the area of the inner side wall of the conductive layer through hole 314b is greater than the horizontal cross sectional area of the conductive layer through hole 314b.

In other words, in the case where the conductive layer through hole 314b has a vertical wall (the inner side wall), the perimeter length of the conductive layer through hole 314b multiplied by the height of the conductive layer through hole 314b is greater than the horizontal cross sectional area of the conductive layer through hole 314b at the opening end.

For a practical example, in the case where the layer thickness h of the conductive layer 312 is 8 μm, the maximum value of the diameter D of the conductive layer through hole 314b is calculated as 32 μm. In the same manner, the maximum diameter value can be calculated as 36 μm in the case where the layer thickness h of the conductive layer 312 is 9 μm; as 48 μm in the case where the layer thickness h of the conductive layer 312 is 12 μm; as 60 μm in the case where the layer thickness h of the conductive layer 312 is 15 μm; as 72 μm in the case where the layer thickness h of the conductive layer 312 is 18 μm; as 144 μm in the case where the layer thickness h of the conductive layer 312 is 36 μm.

The conductive resin composition 315 is prepared by mixing a resin binder and a metal powder having electrical conductivity with a viscous agent including a solvent in the form of a paste, and used to fill the through hole 314 from the adhesive layer 313 by squeezing to completely stop the insulating layer through hole 314b and the conductive layer through hole 314b.

The air release from the through hole 314 during filling of the through hole 314 is performed through the conductive layer through hole 314b so that air bubbles do not remain in the conductive resin composition 315 filling the through hole 314 (the insulating layer through hole 314b and the conductive layer through hole 314b) while the electrical connection between the conductive layer 312 and the conductive resin composition 315 filling the via hole (the through hole 314) is made by the rare surface of 312a of the conductive layer 312 and the internal peripheral surface of the conductive layer through hole 314b respectively.

Since the area of the internal peripheral surface of the conductive layer through hole 314b is greater than the horizontal cross sectional area of the conductive layer through hole 314b at the opening end to the insulating layer through hole 314a, the electrical contact area between the conductive resin composition 315 and the conductive layer 312 becomes greater, as compared with the case where the conductive layer through hole 314b is not opened, in order to decrease the contact electric resistance between the conductive resin composition 315 and the conductive layer 312.

Figure 30:
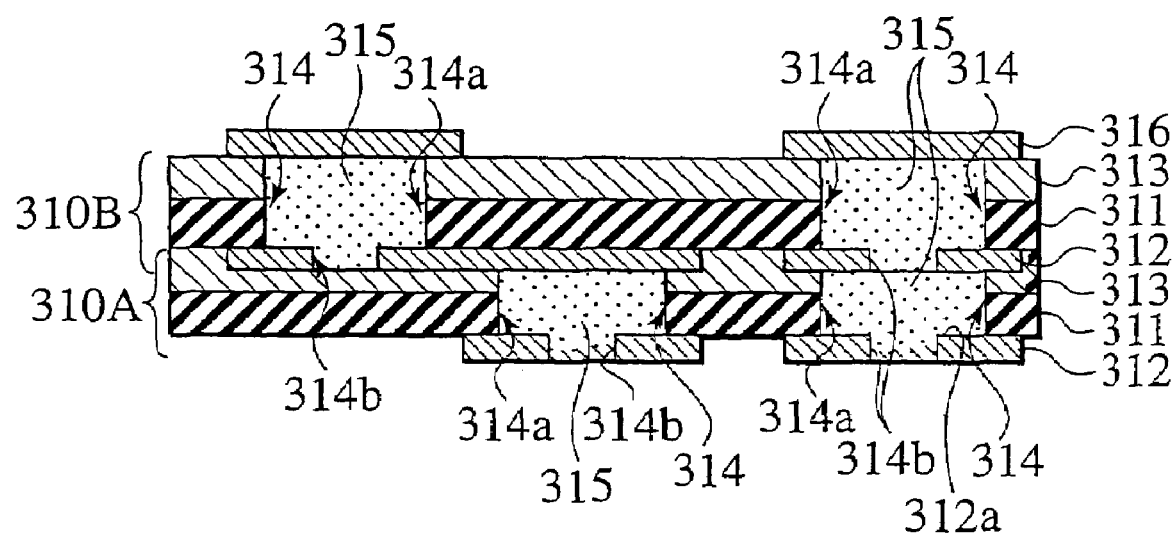
FIG. 30 is a schematic diagram showing an embodiment of a multilayer wiring board assembly in accordance with the fourth embodiment of the present invention.

FIG. 30 is a schematic diagram showing an embodiment of a multilayer wiring board assembly making use of a multilayer wiring board assembly component in accordance with the fourth embodiment of the present invention. This multilayer wiring board assembly is formed by adhesively joining together two multilayer wiring board assembly components each of which has been designed as illustrated in FIG. 29 as a first board assembly component 310A and a second layer substrate 310B by making the adhesive layer 313 of the first layer substrate 310A adhere to the second layer substrate 310B. A conductive layer 316 made of a copper foil serving to provide an electrode of the upper surface is formed on the adhesive layer 313 of the second board assembly component 310B.

While each respective through hole 314 functions as an IVH filled with the conductive resin composition 315, no air bubble remains within the conductive resin composition 315 filling the through hole 314, therefore the electrical connection between the conductive layer 312 and the conductive resin composition 315 filling the through hole 314 is made by the rare surface of 312a of the conductive layer 312 and the internal peripheral surface of the conductive layer through hole 314b respectively.

Also, since the area of the internal peripheral surface of the conductive layer through hole 314b is greater than the horizontal cross sectional area of the conductive layer through hole 314b at the opening end to the insulating layer through hole 314a, the electrical contact area between the conductive resin composition 315 and the conductive layer 312 becomes greater, as compared with the case where the conductive layer through hole 314b is not opened, so to decrease the contact electric resistance between the conductive resin composition 315 and the conductive layer 312 and also to decrease the contact electric resistance between the conductive layers 312 of the respective layers and the contact electric resistance between the conductive layer 312 and the conductive layer 316, resulting in reliable, stable electric characteristics.

Figure 31:
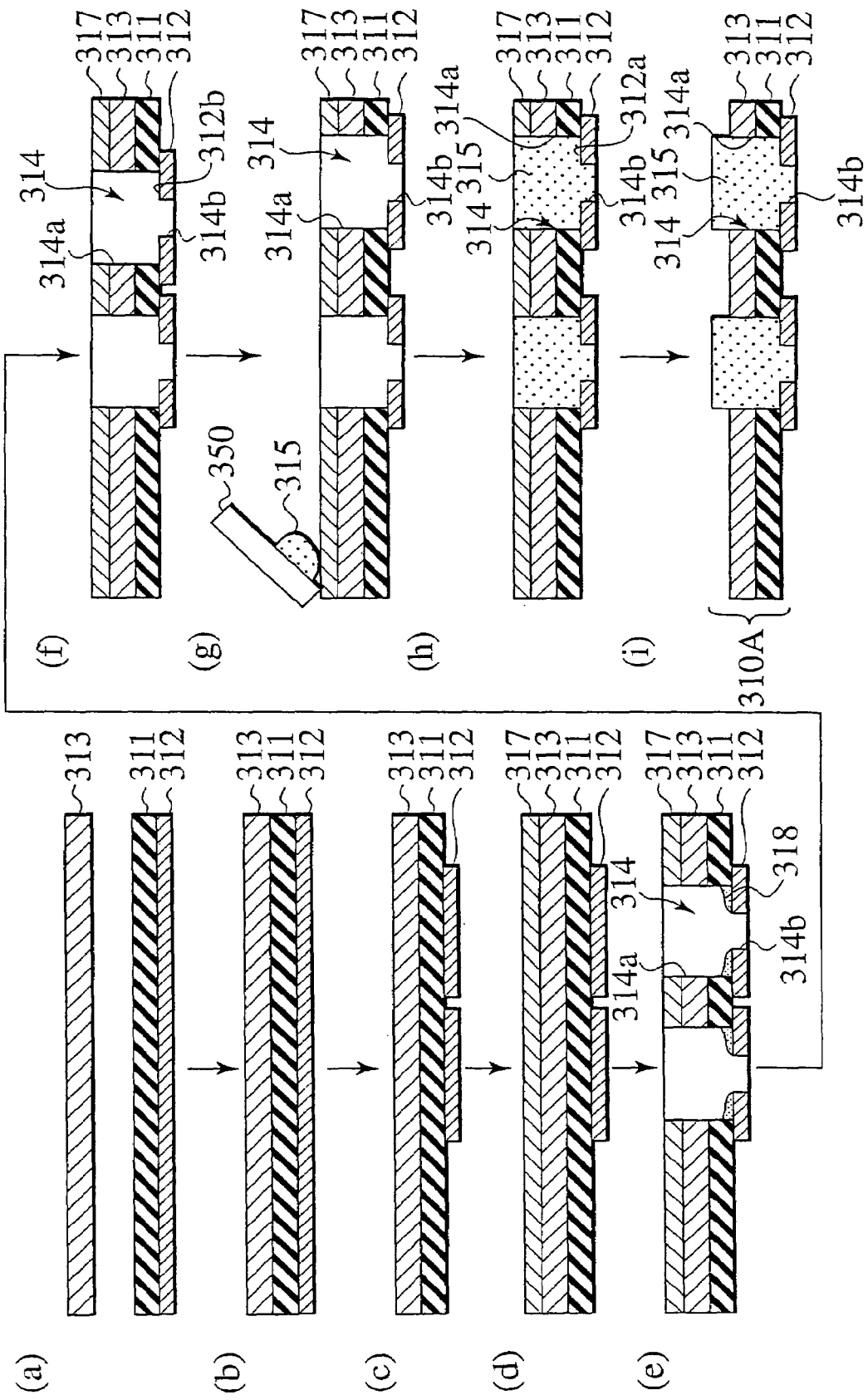
FIG. 31 is a process chart showing an embodiment of the method of manufacturing the multilayer wiring board assembly component in accordance with the fourth embodiment of the present invention.

Next, an embodiment of the method of manufacturing the multilayer wiring board assembly component as illustrated in FIG. 29 and an embodiment of the method of manufacturing the multilayer wiring board assembly making use of the multilayer wiring board assembly component will be explained with reference to FIG. 31 and FIG. 32. In this case, the description is made in the case where the conductive resin composition is inserted to be projected beyond the interlayer adhesive surface.

First of all, as illustrated in FIG. 31(a) and FIG. 31(b), a film made of a plastic polyimide or a thermoplastic polyimide to which is given a thermosetting property is attached to an insulating resin layer (polyimide film) 311 provided with a conductive layer 312 of a copper foil on one surface of the insulating resin layer 311, in order to form an adhesive layer 313.

Next, as illustrated in FIG. 31(c), an electrode pattern (circuit pattern) of the conductive layer 312 is formed by etching the conductive layer 312. In the case where the conductive layer 312 is made of a copper foil, etching the copper foil can be carried out with an etchant having copper chloride or a water solution having ferric chloride.

Next, a PET masking tape 317 is put on the adhesive layer 313 as illustrated in FIG. 31(d), followed by opening a through hole 314 through the PET masking tape 317, the adhesive layer 313, the insulating resin layer 311 and the conductive layer 312 as illustrated in FIG. 31(e).

This through hole 314 comprises an insulating layer through hole 314a which is opened through the PET masking tape 317, the adhesive layer 313 and the insulating resin layer 311 and has a conventional via hole diameter, for example, a diameter of 100 μm, and the conductive layer through hole 314b which is opened through the conductive layer 312 and has a diameter smaller than the via hole diameter of the order of 30 to 50 μm in the case where the layer thickness of the conductive layer 312 is in the order of 7.5 to 12.5 μm. In this case, as described above, the relationship between the diameter of the conductive layer through hole 314b and the layer thickness of the conductive layer 312 is determined in order so that the area of the internal peripheral surface of the conductive layer through hole 314b is greater than the horizontal cross sectional area of the conductive layer through hole 314b at the opening end to the insulating layer through hole 314a.

Meanwhile, the through hole 314 comprising the insulating layer through hole 314a having a smaller diameter and the conductive layer through hole 314b having a larger diameter can be formed by a laser boring process using laser beam irradiation, and also by etching or a combination of etching and laser beam irradiation.

In the case of the laser boring process, after opening the large hole 314a by laser beam irradiation, the small conductive layer through hole 314b is opened through the conductive layer 312 also by laser beam irradiation followed by filling the through hole 314 with the conductive resin composition (the conductive paste) 315. In this case, however, the strength of the laser beam (laser strength) is usually higher in the center of the beam and lower near the periphery of the beam as measured in the radial direction of the beam, therefore, it is possible to make use of this fact in order to form, in one step, the small conductive layer through hole 314b in the center location and the insulating layer through hole 314a so thereby to obtain a via hole having the above described structure in a short amount of time.

After completion of opening the through hole 314, a desmearing process is performed to eliminate the lingering smear 318 of resins, oxides from the copper foil and so forth as generated during the opening of the through hole. The desmearing process is performed by soft etching with a plasma or by wet etching with a permanganate chlorinate base desmearing solution agent.

After completing the desmearing process as illustrated in FIG. 31(f), the through hole 314 is filled with a conductive resin composition (conductive paste) 315 from the PET masking tape 317 by squeezing with a squeeze plate 350 as used in a screen printing process and as illustrated in FIG. 31(g), in order to completely stop the insulating layer through hole 314b and the conductive layer through hole 314b. FIG. 31(h) shows the conductive resin composition 315 with which the hole has been completely filled.

The conductive resin composition 315 has been made of a silver paste in order to avoid oxidation during heating in a later step. In this case, when the coefficient of viscosity was 300 dPa·s, it was possible to fill the hole with the conductive paste without causing the conductive paste to fall out from the small opening 314b of the copper foil member (the conductive layer 312). Meanwhile, the conductive resin composition 315 may be made of a conductive paste including a copper filler or a carbon mixture in place of a silver paste.

In the case of this embodiment of the present invention, since the PET masking tape 317 is put on the surface of the multilayer wiring board assembly component, it is possible to perform squeezing by making direct contact between the squeeze plate 350 and the substrate without making use of a metallic mask or a squeezing mask therebetween, while of course it is also possible to perform squeezing by making use of a metallic mask or a squeezing mask in order to eliminate waste losses of the conductive resin composition.

Air bubbles are discharged through the small opening 314b of the copper foil member (the conductive layer 312) during squeezing in order to prevent the air bubbles from lingering inside of the through hole 314 therefore, close contact between the copper foil member (the conductive layer 312) and the conductive resin composition 315 can be surely established by the rare surface 312a of the conductive layer 312 and the internal peripheral surface of the conductive layer through hole 314b.

Next, the PET masking tape 317, to whose surface a residue of the conductive resin composition 315 sticks, is removed as illustrated in FIG. 31(i). As the first board assembly component, this multilayer wiring board assembly component 310A is thermal lamination compression bonded (laminated) to the multilayer wiring board assembly component 310B, which is also manufactured by the manufacturing method as described above and as illustrated in FIG. 31(a) to FIG. 31(i) together with a conductive layer 316 which is made of a copper foil respectively by the use of an appropriate alignment technique in order to obtain a multilayered structure as illustrated in FIG. 32(a) and FIG. 32(b).

During lamination, it is possible to improve the conformation of the adhesive layer 313 to the contour of the circuit pattern of the conductive layer 312 by performing thermal compression bonding in vacuo. Also, it is possible to make close contact between the conductive resin composition 315 and other layers by performing the lamination while the conductive resin composition 315 remains soft.

Finally, as illustrated in FIG. 32(c), the most outer conductive layer 316 is etched in order to form a circuit to complete the forming of a multilayer wiring board assembly.

Next, the multilayer wiring board assembly component in accordance with the fifth embodiment of the present invention will be explained. In the case of the multilayer wiring board assembly component in accordance with this embodiment of the present invention, an insulating resin layer 321 as an insulating substrate component is composed of a material having adhesivity for interlayer connection by itself, such as a thermoplastic polyimide (TPI) or a thermoplastic polyimide to which a thermosetting property is given. In this case, the insulating resin layer 321 is provided with a conductive layer 322 made of a copper foil and the like as an electrode pattern on one surface of the insulating resin layer 321 while it is possible to dispense with another adhesive layer laminated on the other surface.

In the case of this multilayer wiring board assembly component, the through hole 324 is opened through the insulating resin layer 321 and the conductive layer 322 and filled with the conductive resin composition 325 in order to form an IVH (the via hole).

The through hole 324 includes a portion which is opened through the insulating resin layer 321, i.e., an insulating layer through hole 324a which is opened in the form of a cylindrical profile having a circular horizontal cross section with a conventional via hole diameter. The through hole 324 also includes a portion which is opened through the conductive layer 322 as a conductive layer through hole 324b opened in the form of a cylindrical profile having a circular horizontal cross section with a via hole diameter smaller than the diameter of the insulating layer through hole 324a. By this configuration, the horizontal cross sectional area of the conductive layer through hole 324b is smaller than the horizontal cross sectional area of the insulating layer through hole 324a.

Also, in this case, the diameter of the conductive layer through hole 324b and the thickness of the conductive layer 322 are determined in order so that the area of the inside surface (the inner peripheral side wall) of the conductive layer through hole 324b is greater than the horizontal cross sectional area of the conductive layer through hole 324b at the opening end to the insulating layer through hole 324a. In other words, this means that the total contact area of the conductive resin composition 325 with the conductive layer 322 in the case where the conductive layer through hole 324b is formed is greater than the total contact area in the case where the conductive layer through hole 324b is not formed.

It is assumed that the diameter of the conductive layer through hole 324b is D and that the layer thickness of the conductive layer 322 is h, therefore, the above equations (1) and (2) is also the conditional expression required of the total contact area of the inner side wall of the conductive layer through hole 324b being greater than four times the total contact area of the horizontal cross sectional area of the conductive layer through hole 324b at the opening end to the insulating layer through hole 324a.

The conductive resin composition 325 is prepared by mixing a resin binder and a metal powder having electrical conductivity with a viscous agent including a solvent in the form of a paste, and used to fill the through hole 324 from the insulating resin layer 321 by squeezing to completely stop the insulating layer through hole 324b and the conductive layer through hole 324b.

The air release from the through hole 324 during filling of the through hole 324 is performed through the conductive layer through hole 324b so that air bubbles do not remain in the conductive resin composition 325 filling the through hole 324 (the insulating layer through hole 324b and the conductive layer through hole 324b) while the electrical connection between the conductive layer 322 and the conductive resin composition 325 filling the via hole (the through hole 324) is made by the rare surface of 322a of the conductive layer 322 and the internal peripheral surface of the conductive layer through hole 324b respectively.

Since the area of the internal peripheral surface of the conductive layer through hole 324b is greater than the horizontal cross sectional area of the conductive layer through hole 324b at the opening end to the insulating layer through hole 324a, the electrical contact area between the conductive resin composition 325 and the conductive layer 322 becomes greater, compared to the case where the conductive layer through hole 324b is not opened, in order to decrease the contact electric resistance between the conductive resin composition 325 and the conductive layer 322.

Figure 33:
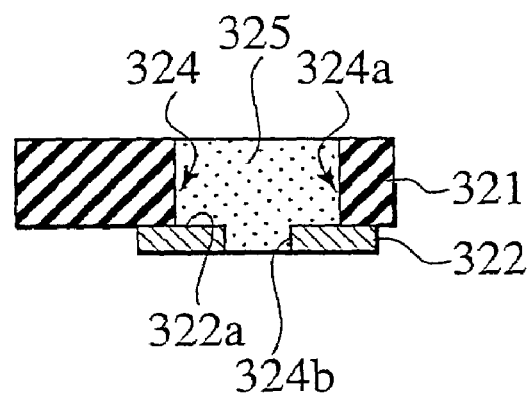
FIG. 33 is a cross sectional view showing another example of a multilayer wiring board assembly component in accordance with the fourth embodiment of the present invention.
Figure 34:
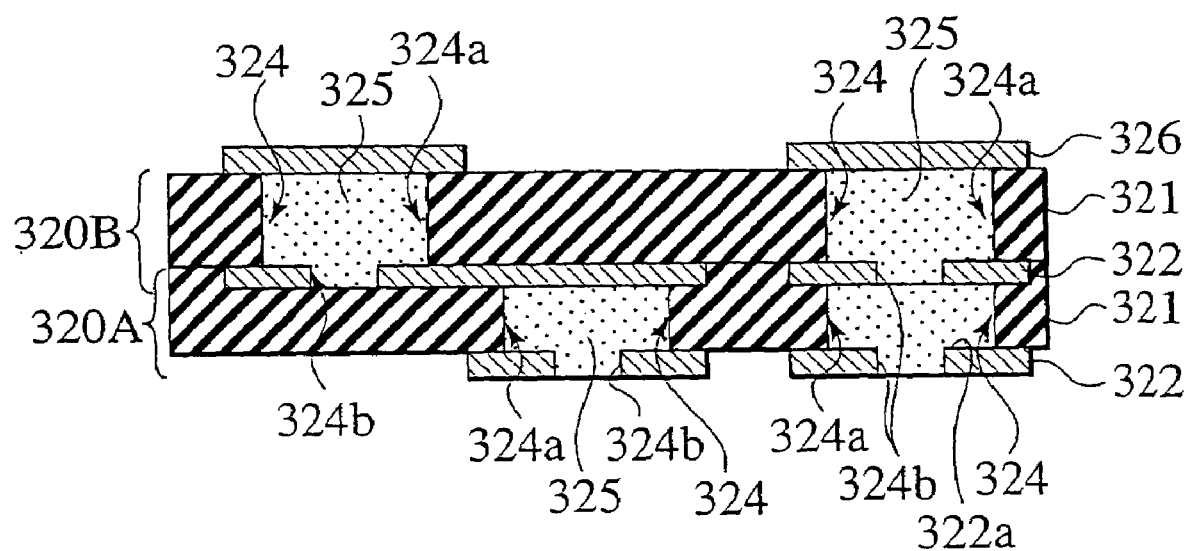
FIG. 34 is a cross sectional view showing another example of a multilayer wiring board assembly in accordance with the fourth embodiment of the present invention.

FIG. 34 is a schematic diagram showing an embodiment of a multilayer wiring board assembly making use of a multilayer wiring board assembly component in accordance with the fifth embodiment of the present invention. This multilayer wiring board assembly is formed by adhesively joining together two multilayer wiring board assembly components, each of which has been designed as illustrated in FIG. 33 as a first board assembly component 320A and a second layer substrate 320B by making the first layer substrate 320A adhere to the second layer substrate 320B by the adhesivity of the insulating resin layer 321 itself. A conductive layer 326 made of a copper foil serving to provide an electrode of the upper surface is formed on the insulating resin layer 321 of the second board assembly component 320B.

While each respective through hole 324 functions as an IVH filled with the conductive resin composition 325, no air bubble remains within the conductive resin composition 325 filling the through hole 324 therefore, the electrical connection between the conductive layer 322 and the conductive resin composition 325 filling the through hole 324 is made by the rare surface of 322a of the conductive layer 322 and the internal peripheral surface of the conductive layer through hole 324b respectively.

Also in this embodiment, since the area of the internal peripheral surface of the conductive layer through hole 324b is greater than the horizontal cross sectional area of the conductive layer through hole 324b at the opening end to the insulating layer through hole 324a, the electrical contact area between the conductive resin composition 325 and the conductive layer 322 becomes greater, compared to the case where the conductive layer through hole 324b is not opened, to decrease the contact electric resistance between the conductive resin composition 325 and the conductive layer 322 and also to decrease the contact electric resistance between the conductive layers 322 of the respective layers and the contact electric resistance between the conductive layer 322 and the conductive layer 326. This results in reliable, stable electric characteristics.

Meanwhile, the multilayer wiring board assembly component, as illustrated in FIG. 33, can be manufactured by a manufacturing method equivalent to the manufacturing method as described above.

Figure 35:
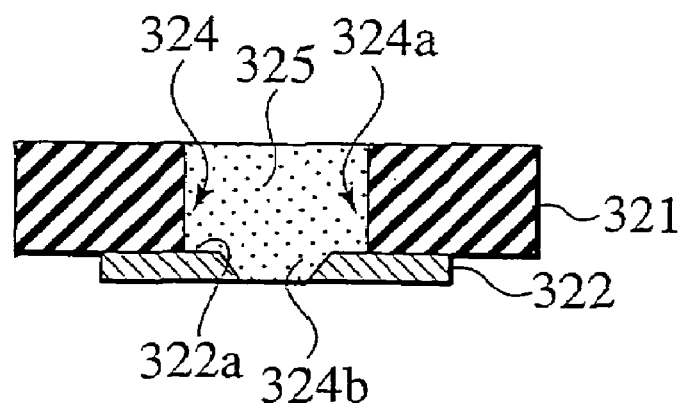
FIG. 35 is a cross sectional view showing a further example of a multilayer wiring board assembly in accordance with the fourth embodiment of the present invention.
Figure 36:
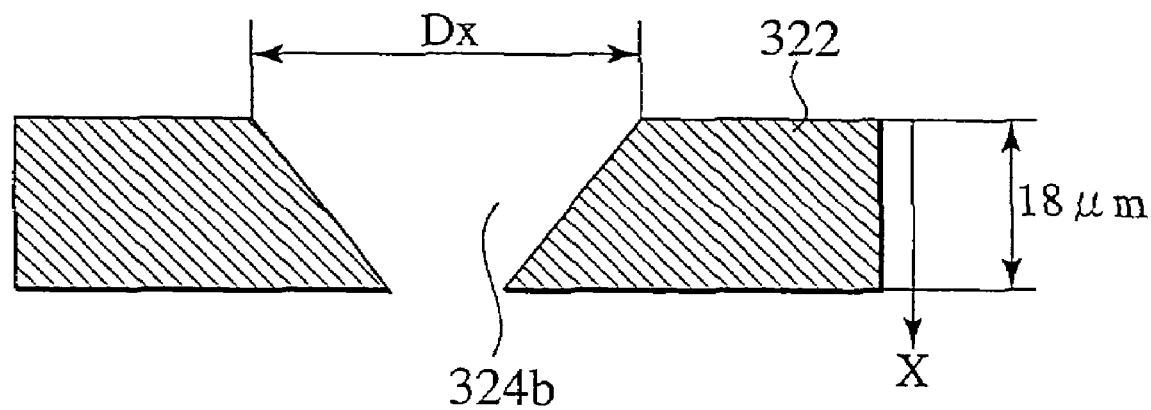
FIG. 36 is an expanded cross sectional view showing a conductive layer through hole of the further example of a multilayer wiring board assembly in accordance with the fourth embodiment of the present invention.

In order to show an example of another through hole as formed, the conductive layer through hole 324b was opened through the conductive layer 322 having a layer thickness of 18 μm by laser beam irradiation. As a result, the through hole was opened in the form of a conic frustum with a taper of about 45 degrees as illustrated in FIG. 35.

In this case, if the diameter of the conductive layer through hole 324b in the rear surface side of the conductive layer is Dx μm, the area of the internal peripheral surface of the conductive layer through hole 324b is expressed by $$\pi\sqrt{2}(72Dx-1296)/4 \qquad (3).$$

Accordingly, the following equation (4) is obtained as the conditional expression as required of the total contact area of the inner side wall of the conductive layer through hole 324b being greater than the total contact area of the horizontal cross sectional area of the conductive layer through hole 324b at the opening end to the insulating layer through hole 324a.

$$\pi\sqrt{2}(72Dx-1296)/4 \geq \pi(Dx/2)^2 \quad (4)$$

As a result, Dx≦378.5 so that the required condition can be achieved if the diameter Dx of the conductive layer through hole 324b at the rare surface of the conductive layer is no larger than 378.5 μm. If these conditions are satisfied, the total contact area of the conductive resin composition 325 with the conductive layer 322, in the case where the conductive layer through hole 324b is formed, is greater than the total contact area in the case where the conductive layer through hole 324b is not formed.

Figure 37:
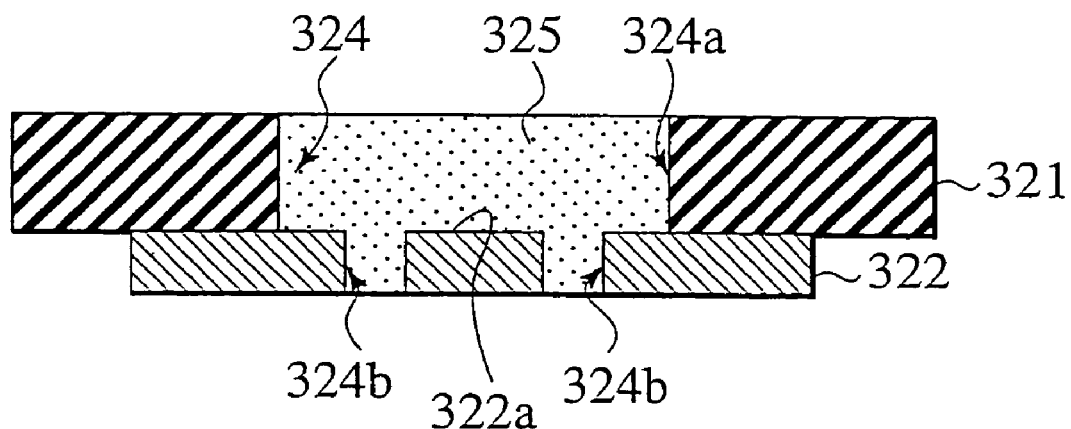
FIG. 37 is across sectional view showing a multilayer wiring board assembly component in accordance with a fifth embodiment of the present invention.
Figure 38:
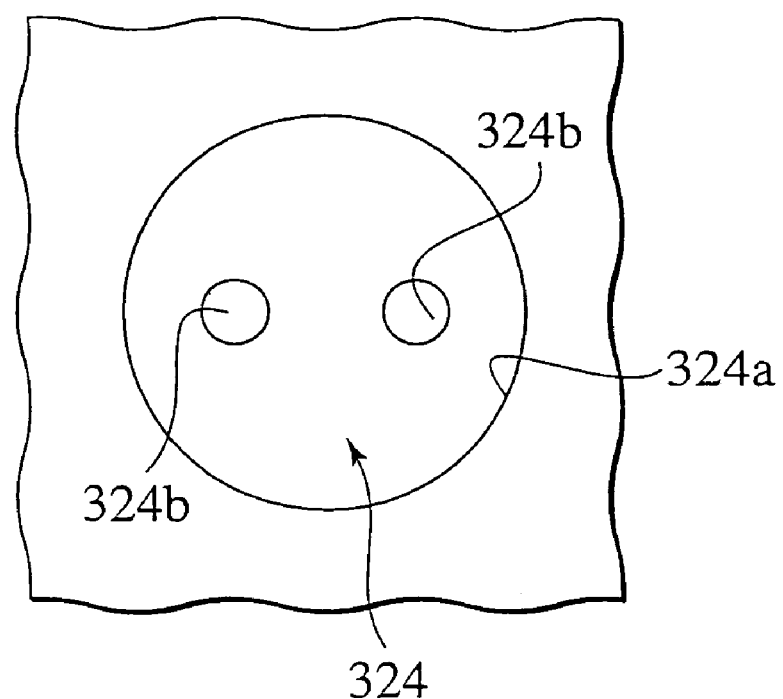
FIG. 38 is a plane view showing the multilayer wiring board assembly component in accordance with the fifth embodiment of the present invention.

Also, as illustrated in FIG. 37 and FIG. 38, the conductive layer through hole 324b is opened in a plurality of locations within one through hole 324 in order so that the area of the inside surface of each conductive layer through hole 324b is greater than the lateral cross sectional area of that conductive layer through hole 324b at the opening end to the insulating layer through hole 324a.

Figure 39:
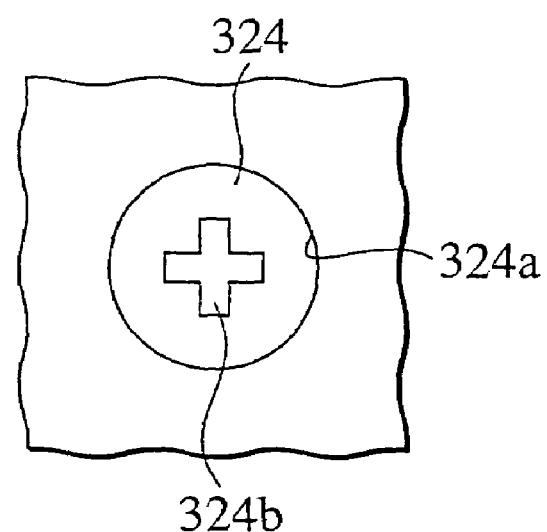
FIG. 39 is a cross sectional view showing another multilayer wiring board assembly component in accordance with the fifth embodiment of the present invention.

Furthermore, as illustrated in FIG. 39, it is also possible to open the conductive layer through hole 324b in a cross form by chemical etching without difficulties in order to obtain a larger area of the inner side wall than a circular through hole.

Meanwhile, while the conductive layer through hole 324b is opened in a cross form in the above described example, any other profile can be employed as long as the inner side wall has a larger area than that of a circular through hole (in such a profile, the conductive layer through hole 324b has a longer perimeter).

The multilayer wiring board assembly, the multilayer wiring board assembly component and the manufacturing method thereof in accordance with the present invention is not limited to the application to flexible printed circuit boards making use of a polyimide film, but also applicable to a flexible printed circuit board making use of a polyester film, or a rigid type making use of, as an insulating material, an epoxy resin, a woven glass fabric, an aramid nonwoven cloth and the like in the same manner.

As understood from the above explanation, in the case of the multilayer wiring board assembly, the multilayer wiring board assembly component and the manufacturing method thereof in accordance with the fourth embodiment and the fifth embodiment of the present invention, since the electrical connection between the conductive layer and the conductive resin composition filling the through hole is made by the rare surface of the conductive layer with the horizontal cross sectional area of the conductive layer through hole being smaller than the horizontal cross sectional area of the insulating layer through hole while the total area of the inner side wall of the conductive layer through hole is greater than the horizontal cross sectional area of that conductive layer through hole, the electrical contact area between the conductive layer and the conductive resin composition is increased while the contact electric resistance between the conductive layer and the conductive resin composition is decreased.

In some implementations, an electric component is mounted on the conductive layer exposed downward in the case for the embodiment as explained above and as seen in the respective drawings. In what follows, several points to be considered for such a case will be explained.

Figure 44:
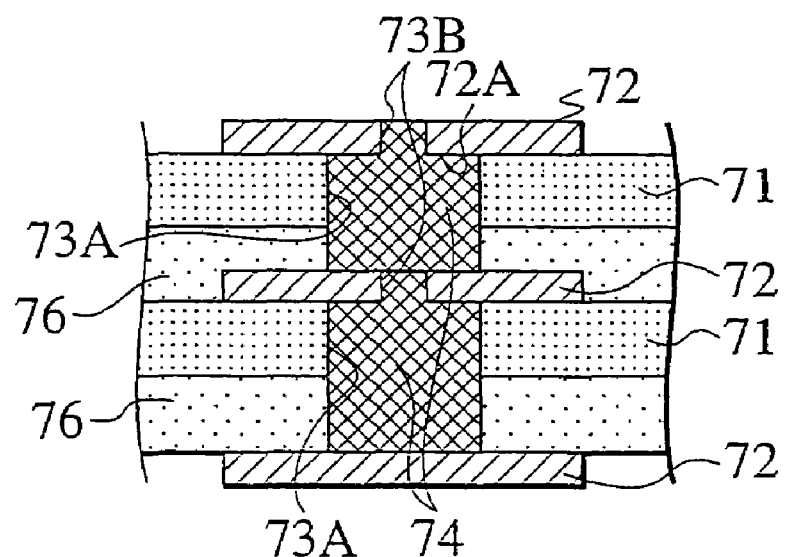
FIG. 44 is a cross sectional view for explaining the characteristics of the multilayer wiring board assembly in accordance with a seventh embodiment of the present invention.

For the sake of explanation, the following drawings have been turned upside down. Namely, illustrated in FIG. 44 is a structure in which the copper foil portion (small opening) 73B of a through hole is designed to be smaller than the bore diameter of an insulating layer portion 73A so that the electrical connection between a copper foil 72 and a conductive paste 74 is made by the rare surface 72A of the copper foil. The small opening 73 opened through the copper foil 72 functions as an air ventilation hole in which air bubbles are prevented from lingering within an IVH during filling of the through hole with the conductive paste 74.

However, in the case of the multilayer substrate as illustrated in FIG. 44, the conductive paste 74 filling the through hole is barely exposed through the small opening 73B at the surface of the copper foil 72, but is particularly exposed at the surface of the land portion made of the copper foil 72 therefore, solder wetting is not good when electric parts are implemented thereon because of the resin component of the conductive paste 74 at the surface of the conductive layer. Because of this, the electric component mounting process sometimes causes problems at the surface of the conductive layer.

The sixth embodiment and the seventh embodiment of the present invention as explained in the following description, have been developed to solve the shortcomings as described above and it is an objective to provide a multilayer wiring board assembly component, a manufacturing method thereof and a multilayer wiring board assembly having a structure in which a small opening is formed through a conductive layer (copper foil), while the electric component mounting process is prevented from being affected by the resin component of the conductive paste at the surface of the conductive layer, in which electric components can be mounted without problems and in which interlayer interconnection can be established with a low resistance.

Figure 40:
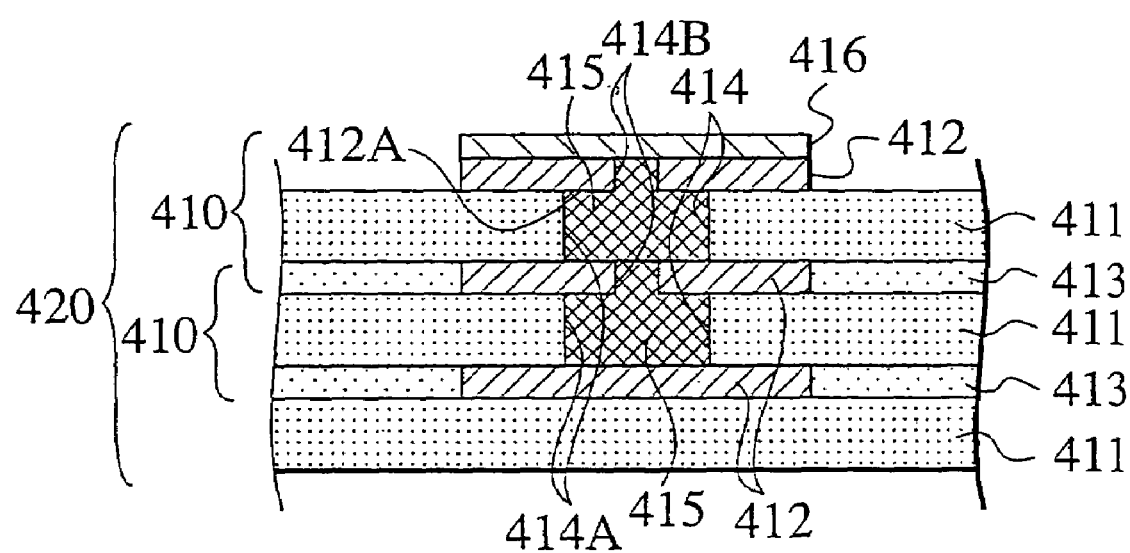
FIG. 40 shows the basic configuration of a multilayer wiring board assembly component and a multilayer wiring board assembly in accordance with a sixth embodiment of the present invention.

In what follows, the sixth embodiment in accordance with the present invention will be explained in detail with reference to the accompanied drawings. FIG. 40 shows the basic configuration of a multilayer wiring board assembly component in accordance with the sixth embodiment of the present invention. In this case, the description is made in the case where the conductive resin composition is inserted to be projected beyond the interlayer adhesive surface.

The multilayer wiring board assembly component 410 as illustrated in FIG. 40 is composed of an insulating resin layer 411 as an insulating substrate component which is provided with a conductive layer 412 of a copper foil and the like as an electrode pattern including a land surface on one surface of the insulating resin layer 411 and an adhesive layer 413 for interlayer connection on the other surface respectively with a through hole 414 formed passing through the adhesive layer 413, the insulating resin layer 411 and the conductive layer 412. The through hole 414 is filled with a conductive resin composition 415 in order to form an IVH (via hole).

The multilayer wiring board assembly 420 is obtained by adhesively aligning and joining a plurality of multilayer wiring board assembly components, each of which has been designed in the same manner as the multilayer wiring board assembly component 410, by the adhesive layer 413.

In the case of an FPC, the insulating resin layer 411 is composed of a flexible resin film such as a polyimide film, a polyester film or the like made of a wholly aromatic polyimide (API) and the like in order to form a triple layered structure of the insulating resin layer 411, the conductive layer 412 and the adhesive layer 413 in which a polyimide base adhesive material, as the adhesive layer 413, is attached to the surface of the polyimide member (the insulating resin layer 411) of the general purpose single sided copper plated polyimide component (CCL) compared to opposite the surface contacting the copper foil (the conductive layer 412). The adhesive layer 413 made of a polyimide base adhesive material can be formed by attaching a thermoplastic polyimide film (TPI) or a film which is made by giving a thermosetting property to a thermoplastic polyimide film.

The through hole 414 includes a portion 414A which is opened through the adhesive layer 413 and the insulating resin layer 411 and a portion 414B which is opened through the conductive layer 412. The bore diameter of the portion 414a is a conventional via hole diameter while the bore diameter of the portion 414B is smaller than the bore diameter of the portion 414A passing through the adhesive layer 413 and the insulating resin layer 411. If the bore diameter (via hole diameter) of the via hole 414A is in the order of 100 μm, the bore diameter of the small opening 414B is in the order of 30 to 50 μm.

The conductive resin composition 415 is prepared by mixing a resin binder and a metal powder having electrical conductivity with a viscous agent including a solvent in the form of a paste, and used to fill the through hole 414 from the insulating resin layer 413 by squeezing to completely stop the hole (the via hole 414A and the small opening 414B).

Because of the small opening 414B, air release from the conductive resin composition 415 is sufficiently performed during filling of the through hole 414 with the conductive resin composition 415 so that air bubbles do not remain in the conductive resin composition 415 filling the through hole 414.

The electrical connection between the conductive layer 412 and the conductive resin composition 415 filling the through hole 414 is made by a disk shaped rare surface of 412A of the conductive layer 412 corresponding to the differential bore diameter between the via hole 414A and the small opening 414B to increase the contact area between the conductive layer 412 and the conductive resin composition 415 and to improve the electrical reliability thereof.

A metallic layer 416 is uniformly formed on the entire surface of the conductive layer 412 by electrolytic plating, electroless plating, sputtering or the like in order to cover the small opening 414B opened in the surface of the conductive layer 412 which is the outermost layer (the most upper layer) of the multilayer wiring board assembly 420. By this configuration, the conductive resin composition 415 exposed at the opening end of the conductive layer 412 is covered with the metallic layer 416 at the opening end of the through hole 414 of the multilayer wiring board assembly 420.

By this configuration, the conductive resin composition 415 is no longer exposed to the surface of the conductive layer 412 so that the entire surface of the conductive layer 412 is made a uniform metallic surface by the metallic layer 416 therefore, it is possible to avoid the deterioration of solder wetting due to the resin component of the conductive paste 415 and the problems encountered during the mounting of electric components on the surface of the conductive layer.

The metallic layer 416 may be made of gold, silver, copper or the like.

In the case where the metallic layer 416 is made of gold, no oxide film is formed on the surface of the metallic layer 416 therefore, the electrical connection of electric components mounted on the metallic layer 416 is prevented from being affected by the oxide film, resulting in high reliability, stability and a low resistance.

In the case where the metallic layer 416 is made of silver which has the lowest resistivity among metals, the electrical connection of electric components mounted on the metallic layer 416 is surely made with low resistivity while high frequency signals can be transferred at a high speed only with suppressed attenuation.

In the case where the metallic layer 416 is made of copper, there is a low resistance characteristic and an ion migration-proof characteristic.

Next, an embodiment of the method of manufacturing the multilayer wiring board assembly component as illustrated in FIG. 40 and an embodiment of the method of manufacturing the multilayer wiring board assembly making use of the multilayer wiring board assembly component will be explained with reference to FIG. 41(a) and FIG. 41(i) in detail.

With a starting item of a single sided copper clad laminate component comprising a polyimide film 431 which is provided with a copper foil 432 on one surface of the polyimide film 431 as illustrated in FIG. 41(a), an etching resist (not shown in the figure) is formed on the copper foil 432 by a photolithography technique followed by chemical etching to form a conductive circuit 432A as illustrated in FIG. 41(b).

Next, as illustrated in FIG. 41(c), an adhesive layer 433 made of a thermoplastic polyimide or a thermoplastic polyimide to which a thermosetting property is given, is attached to the surface of the polyimide film 431 opposing the copper foil 432. The adhesive layer 433 is an interlayer adhesive layer for making a multilayered structure in a later process. Furthermore, a PET masking tape 434 is attached to the surface of the adhesive layer 433.

Next, as illustrated in FIG. 41(d), a via hole 435 is formed through the polyimide film 431, the adhesive layer 433 and the masking tape 434 by laser beam irradiation as well as a small opening 436 is formed through the conductive circuit 432A (the copper foil 432). The laser light used is the third harmonic of a UV:YAG laser (wavelength: 355 nm).

Next, as illustrated in FIG. 41(e), the conductive paste 437 is used to fill the via hole 435 and the small opening 436 from the masking tape 434 by a printing technique. An Ag/epoxy resin base filler paste is used as the conductive paste 437. Of course, the conductive paste 437 may be made of any other conductive paste such as a Cu paste, a carbon paste and so forth.

After filling the hole with the conductive paste, the masking tape 434 is removed. By this process, the projection 437A of the conductive paste 437 is formed beyond the interlayer adhesive surface. The projection 437A is pressed against the copper foil of the counter assembly component during multilayer lamination in order to improve the reliability of interlayer interconnection.

The multilayer wiring board assembly component 440 as manufactured in this manner, another assembly component (uppermost substrate) 441 as manufactured in the same manner as the assembly component 440 except that no circuit pattern is formed, and a further assembly component 442 formed with a circuit pattern and located under the assembly component 440 opposite to the assembly component 441 are aligned to each other as illustrated in FIG. 41(f) and thermal compression bonded in order to obtain a multilayer wiring board assembly 450 as illustrated in FIG. 41(g).

A copper plating layer 438 is formed on the entire surface of the copper foil (upper copper foil) 432, on which a circuit pattern has not yet formed, of the uppermost substrate 441 of this multilayer wiring board assembly 450, by supplying an electric current to the upper copper foil 432 in order to perform electrolytic plating. The thickness of the copper plating layer 438 is 5 μm in flat locations.

Figure 41:
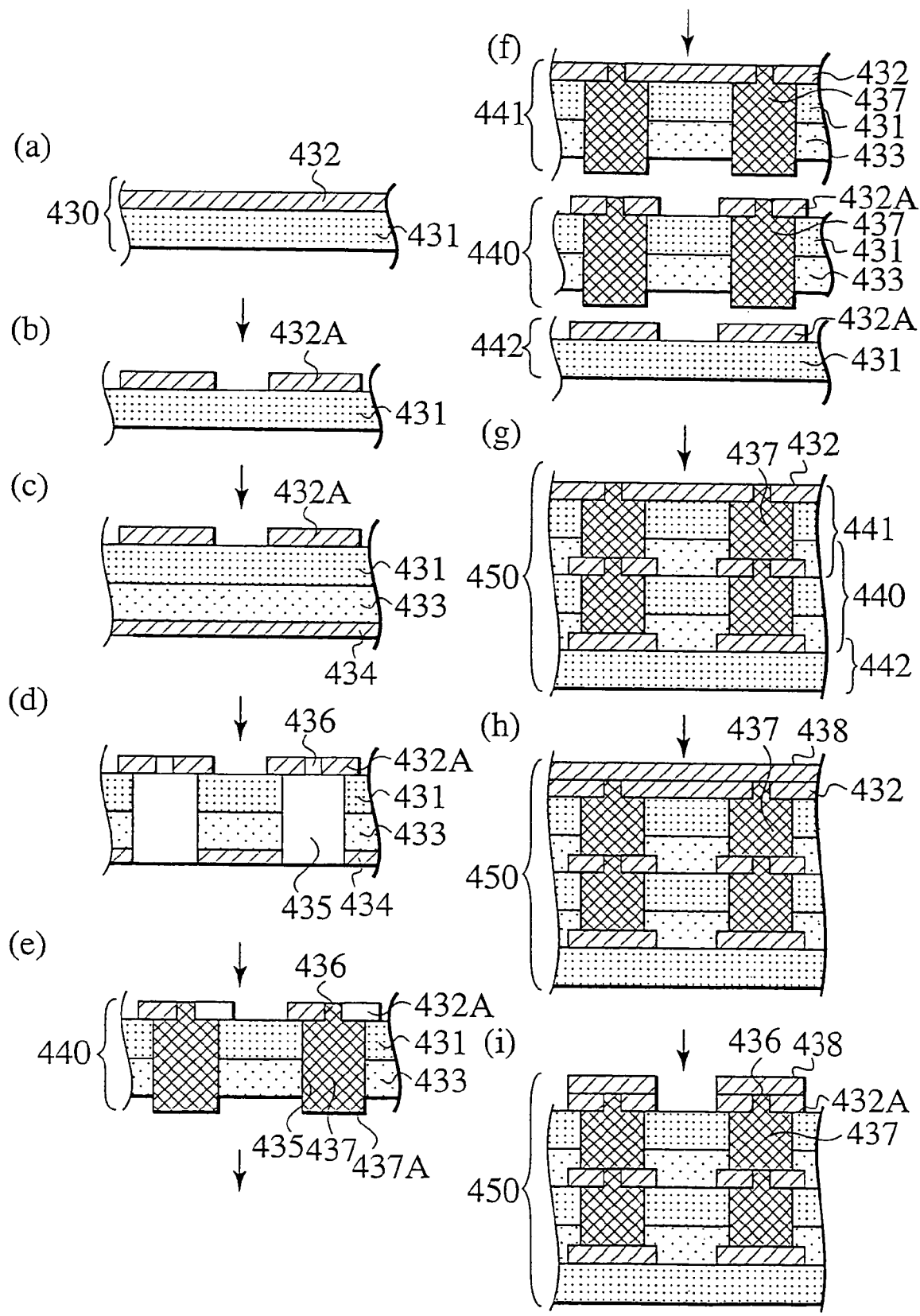
FIG. 41 is a process chart showing a method of manufacturing the multilayer wiring board assembly component and the multilayer wiring board assembly in accordance with the sixth embodiment of the present invention.

Finally, as illustrated in FIG. 41(*i*), an uppermost conductive circuit 432A is formed on the copper plating layer 438 and the copper foil 432 by chemical etching. This chemical etching can be performed in the same process for the copper plating layer 438 and the copper foil 432 when laminated together.

By this process, the conductive paste 437 exposed to the opening end of the small opening 436 at the outermost layer (uppermost layer) is covered by the copper plating layer 438 so that the conductive paste 437 is not exposed to the most outer conductive circuit 432A.

Next, another embodiment of the method of manufacturing the multilayer wiring board assembly component as illustrated in FIG. 40 and the multilayer wiring board assembly making use of the multilayer wiring board assembly component will be explained with reference to FIG. 42(*a*) and FIG. 42(*h*) in detail. Meanwhile, in FIG. 42, like reference symbols indicate similar elements as illustrated in FIG. 41, and therefore a redundant explanation is not repeated. Also, the description is made in the case where the conductive resin composition is inserted to be projected beyond the interlayer adhesive surface.

Figure 42:
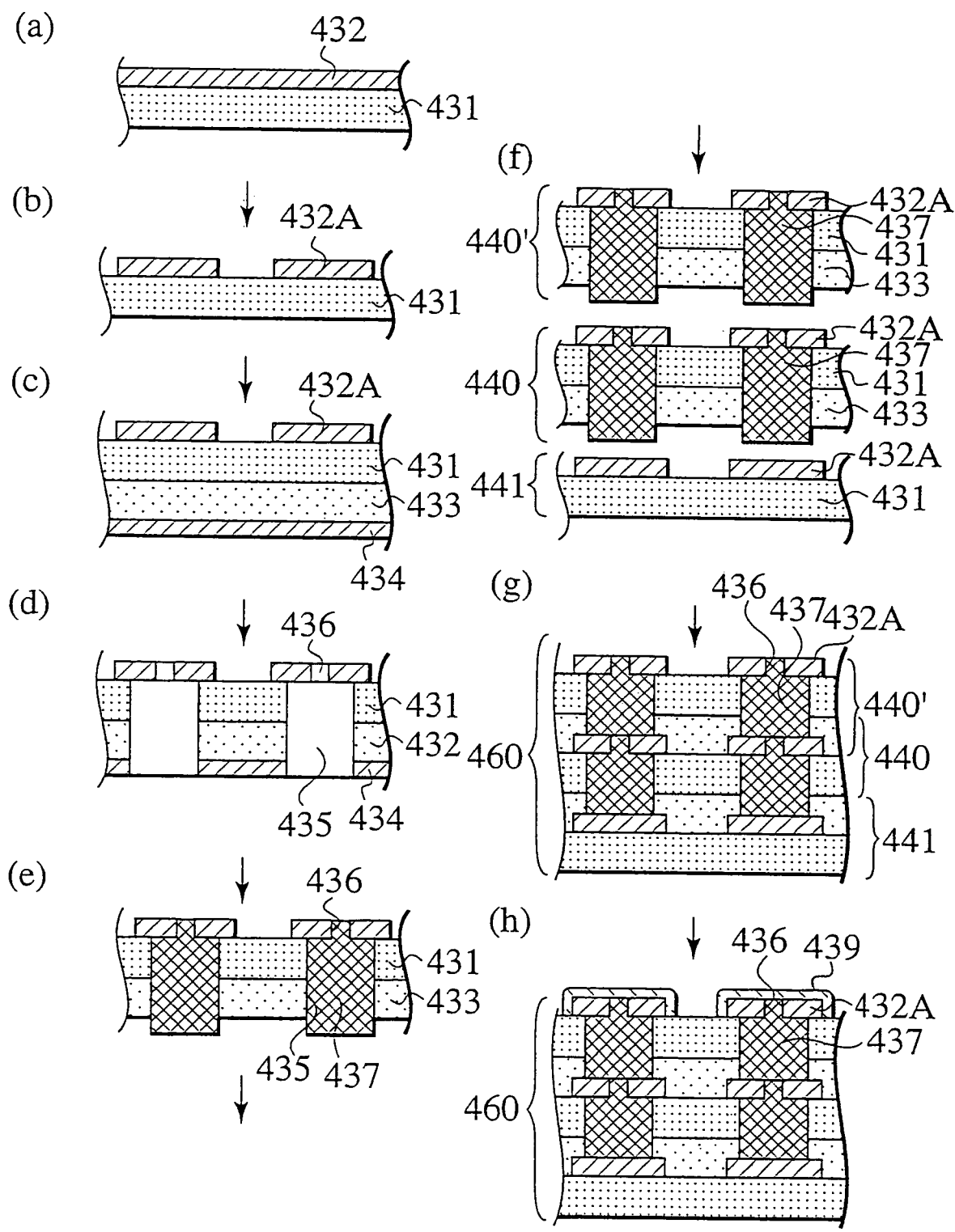
FIG. 42 is a process chart showing another exemplary method of manufacturing the multilayer wiring board assembly component and the multilayer wiring board assembly in accordance with the sixth embodiment of the present invention.

The manufacturing steps for manufacturing the assembly component 440 as illustrated in FIG. 42(*a*) to FIG. 42(*e*) are equivalent to the manufacturing steps as illustrated in FIG. 41(*a*) to FIG. 41(*e*).

The multilayer wiring board assembly component 440, another assembly component 440' as manufactured in the same manner as the assembly component 440, and a further assembly component 442 formed with a circuit pattern and located under the assembly component 440 opposite to the assembly component 440' are aligned to each other as illustrated in FIG. 42(*f*) and thermal compression bonded in order to obtain a multilayer wiring board assembly 460 as illustrated in FIG. 42(*g*).

A gold plating layer 439 is formed on the entire surface of the copper foil (upper copper foil) 432A of the uppermost substrate 440' of this multilayer wiring board assembly 460 by supplying an electric current to the upper copper foil 432 in order to perform electrolytic plating.

By this process, the conductive paste 437 exposed to the opening end of the small opening 436 at the outermost layer (uppermost layer) is covered by the gold plating layer 439 so that the conductive paste 437 is not exposed to the most outer conductive circuit 432A.

Meanwhile, depending upon the electrode pattern, the uppermost conductive circuit 432A may include only land pads while a transmission circuit is formed in an inner layer so that it is impossible to supply electric power through the uppermost conductive circuit 432A. In such a case, the inner layer including the transmission circuit is used for power supply.

Figure 43:
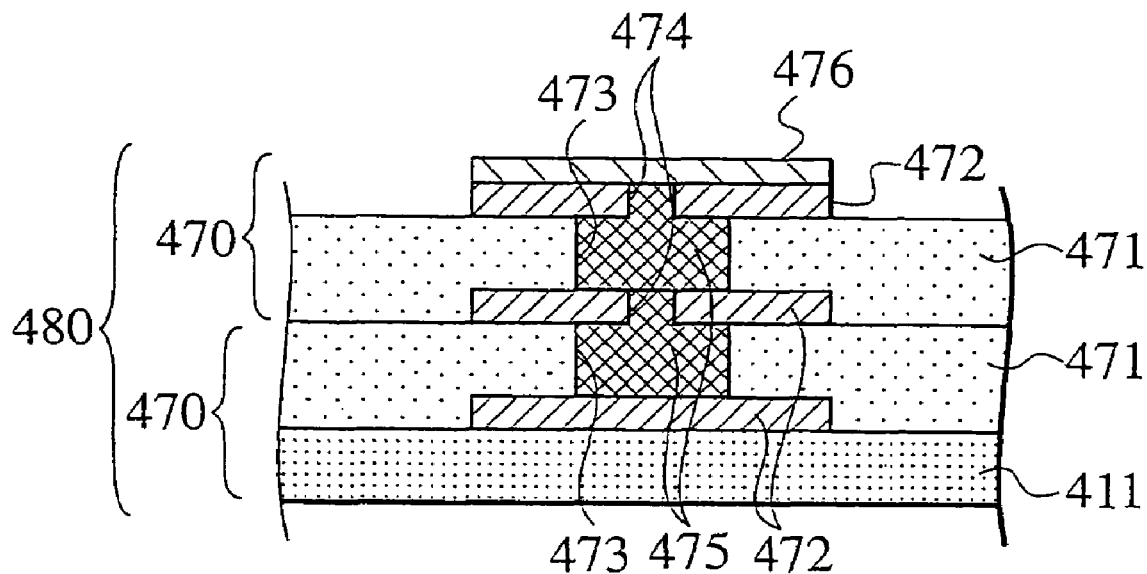
FIG. 43 shows the basic configuration of a multilayer wiring board assembly component and a multilayer wiring board assembly in accordance with a seventh embodiment of the present invention.

Next, the multilayer wiring board assembly component in accordance with the seventh embodiment of the present invention will be explained. In the case of the multilayer wiring board assembly component and the multilayer wiring board assembly in accordance with this embodiment of the present invention, as illustrated in FIG. 43, an insulating resin layer 471 as an insulating substrate component is composed of a material having adhesivity for multilayer adhesion by itself, such as a thermoplastic polyimide (TPI) or a thermoplastic polyimide to which a thermosetting property is given. In this case, the insulating resin layer 471 is provided with a conductive layer 472 made of a copper foil and the like as an electrode pattern on one surface of the insulating resin layer 471 while it is possible to dispense with another adhesive layer laminated on the other surface.

In the case of this multilayer wiring board assembly component 470, a via hole 473 is opened through the insulating resin layer 471 while a small opening 474 is opened through the conductive layer 472 in order to form an IVH (via hole).

A plurality of multilayer wiring board assembly components each of which is equivalent to the multilayer wiring board assembly component 470 are multilayered and joined by the adhesivity of the insulating resin layer 471 itself to obtain a multilayer wiring board assembly 480.

A metallic layer 476 made of gold, silver, copper or the like is uniformly formed on the entire surface of the conductive layer 472 by electrolytic plating, electroless plating, sputtering or the like in order to cover the small opening 474 opened in the surface of the conductive layer 412 which is the outermost layer (the most upper layer) of the multilayer wiring board assembly 480. By this configuration, the conductive resin composition 475 exposed to the opening end of the conductive layer 472 is covered with the metallic layer 476 at the opening end of the IVH of the multilayer wiring board assembly 480.

By this configuration, the conductive resin composition 475 is no longer exposed to the surface of the conductive layer 472 so that the entire surface of the conductive layer 472 is made a uniform metallic surface by the metallic layer 476 therefore, it is possible to avoid the deterioration of solder wetting due to the resin component of the conductive paste 475 and the problems encountered during the mounting of electric components on the surface of the conductive layer.

The multilayer wiring board assembly component 470 and the multilayer wiring board assembly 480 of this embodiment can be manufactured by a manufacturing method equivalent to the manufacturing method of the multilayer wiring board assembly component and the multilayer wiring board assembly as illustrated in FIG. 41 and FIG. 42.

While all of the embodiments in accordance with the above embodiments of the present invention have been described as a flexible printed circuit board, the present invention is not limited to the application thereto but applicable also to a rigid type printed circuit board made of an epoxy resin base material, a prepreg or the like.

As understood from the above explanation, in the case of the multilayer wiring board assembly, the multilayer wiring board assembly component and the manufacturing method thereof in accordance with the sixth embodiment and the seventh embodiment of the present invention, since the metallic layer is formed on the conductive layer in order to cover the conductive resin composition exposed to the opening end at the conductive layer with the metallic layer so that the entire surface of the conductive layer is made a uniform metallic surface by the metallic layer, it is possible to avoid the deterioration of solder wetting due to the resin component of the conductive paste and the problems encountered during the mounting of electric components on the surface of the conductive layer.

In what follows, another aspect of the present invention will be explained with reference to the accompanied drawings.

FIG. 45(*a*) and FIG. 45(*b*) show the basic configuration of multilayer wiring board assembly components in accordance with the eighth embodiment of the present invention.

The multilayer wiring board assembly component as illustrated in FIG. 45(*a*) is composed of an insulating resin layer 511 as an insulating substrate component which is provided with a conductive layer 512 of a copper foil and the like as an electrode pattern on one surface of the insulating resin layer 511 and an adhesive layer 513 for interlayer connection on the other surface respectively with a through hole 514 formed passing through the adhesive layer 513, the insulating resin layer 511 and the conductive layer 512. The through hole 514 is filled with a conductive resin composition 515 in order to form an IVH (via hole).

In the case of an FPC, the insulating resin layer 511 is composed of a flexible resin film such as a polyimide film, a polyester film or the like made of a wholly aromatic polyimide (API) and the like in order to form a triple layered structure of the insulating resin layer 511, the conductive layer 512 and the adhesive layer 513 in which a polyimide base adhesive material used as the adhesive layer 513, is attached to the surface of the polyimide member (the insulating resin layer 511) of the general purpose single sided copper plated polyimide component compared to opposite the surface contacting the copper foil (the conductive layer 512).

The through hole 514 formed through the multilayer wiring board assembly component includes a portion 514a which is opened through the adhesive layer 513 and the insulating resin layer 511 and a portion 514b which is opened through the conductive layer 512. The bore diameter of the portion 514a is a conventional via hole diameter while the bore diameter of the portion 514b is smaller than the bore diameter of the portion 514a passing through the adhesive layer 513 and the insulating resin layer 511.

The adhesive layer 513 can be formed by not only the application of an adhesive material but also by attaching a thermoplastic polyimide film or a film which is made by giving a thermosetting property to a thermoplastic polyimide film. In the case of the use of a thermoplastic polyimide film, taking into consideration the heat resistance of the substrate, it is preferred to use a material having a high glass transition temperature. Meanwhile, the insulating resin layer 511 can be formed not only of a polyimide film but also of an insulating material such as an imide base or epoxy base prepreg. In the latter case, the insulating resin layer 511 can function as an adhesive so that it is possible to dispense with the adhesive layer 513 which has otherwise to be separately formed.

The conductive resin composition 515 is prepared by mixing a resin binder and a metal powder having electrical conductivity with a viscous agent including a solvent in the form of a paste, and used to fill the through hole 514 from the insulating resin layer 511 by squeezing to completely stop the hole.

The conductive resin composition 515 is used to make electric contact with the conductive layer 512 by means of the rare surface 512a of the conductive layer 512 rather than the outer surface of the conductive layer 512 therefore, there is no need for the provision of the extended portion of the conductive resin composition 515 extending in the outer direction.

The conductive layer 512, i.e., the copper foil member is provided with a small hole 514b which is smaller than that opened through the resin portion (the insulating resin layer 511+the adhesive layer 513). This is because, if the bore diameter of the copper foil member 42 is equal to the bore diameter of the resin portion (the insulating layer 47) as illustrated in FIG. 9, the contact area between the copper foil member 42 and the conductive resin composition 45 is only the side surface 42A of the hole so the reliability of electrical connection becomes insufficient. Also if the hole is formed only through the resin insulating layer 47 as illustrated in FIG. 10, air release from the IVH can not be sufficiently performed when filling the hole with the conductive paste by squeezing as this will leave air bubbles in the IVH so the contact area between the copper foil member 42 and the conductive resin composition 45 can not be guaranteed.

The small hole 514b opened through the conductive layer 512 functions as an air bleeder aperture through which air bubbles are surely exhausted, when filling the hole with the conductive paste, in order to ensure a sufficient contact area between the conductive layer 512 and the conductive resin composition 515.

While the conductive paste 515 is provided with no projection in the surface thereof opposite to the conductive layer 512 in the case of the multilayer wiring board assembly component as illustrated in FIG. 45, it is also possible to provide such a projection as illustrated in FIG. 46(i). Also, the adhesive layer 513 as illustrated in FIG. 45(a) is dispensed with in the case as illustrated in FIG. 45(b), as described below.

The characteristics of the present invention reside in the formation technique of a small hole 514b opened through this conductive layer 512. Namely, the inventor of the present invention has repeatedly conducted experiments in order to determine the structure required of the hole 514b to function as the most effective air bleeder aperture. In what follows, the characteristics thereof will be explained in detail as well as the manufacturing method thereof.

Figure 46:
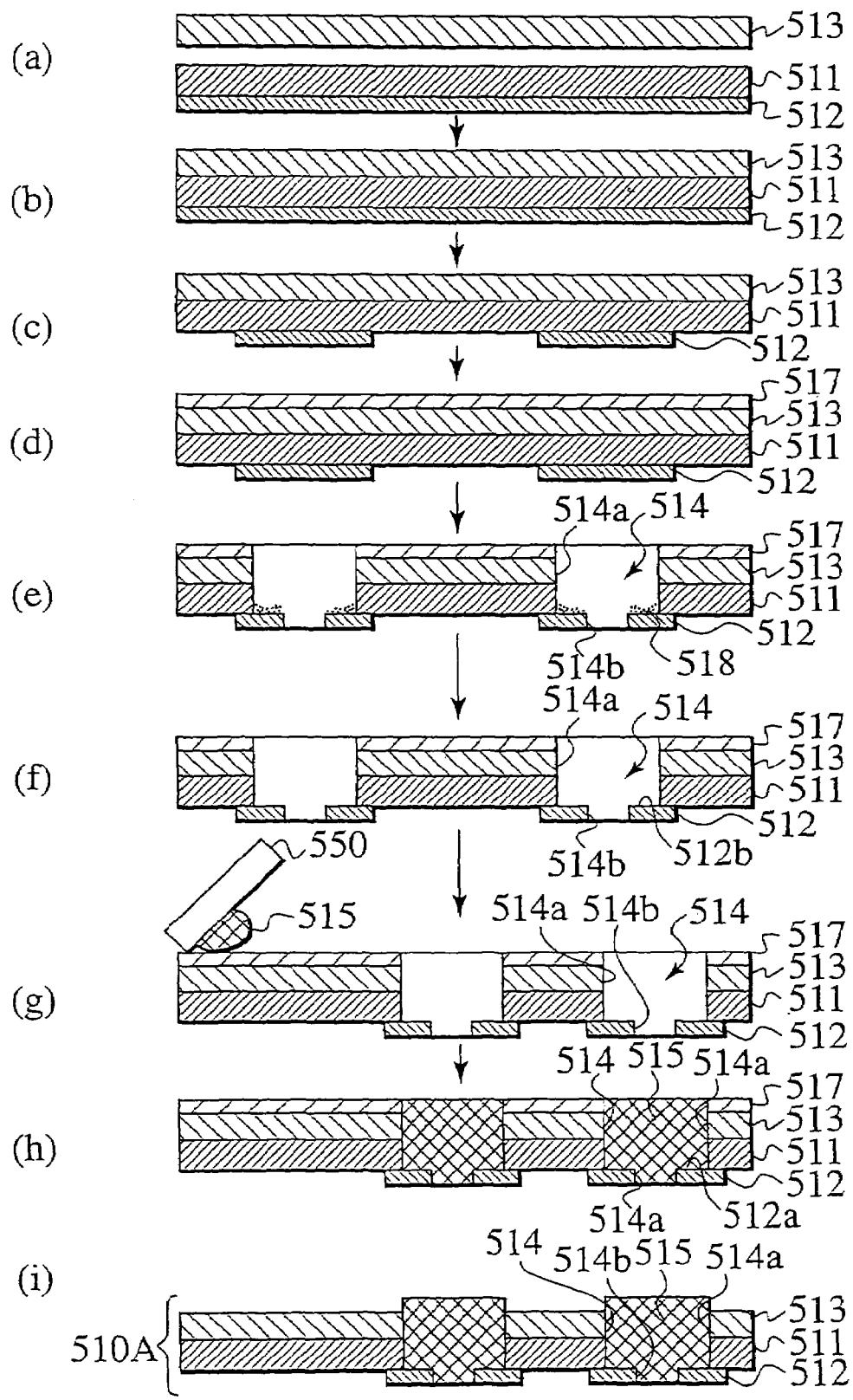
FIG. 46 is a process chart showing an embodiment of the method of manufacturing the multilayer wiring board assembly component in accordance with the eighth embodiment of the present invention.
Figure 47:
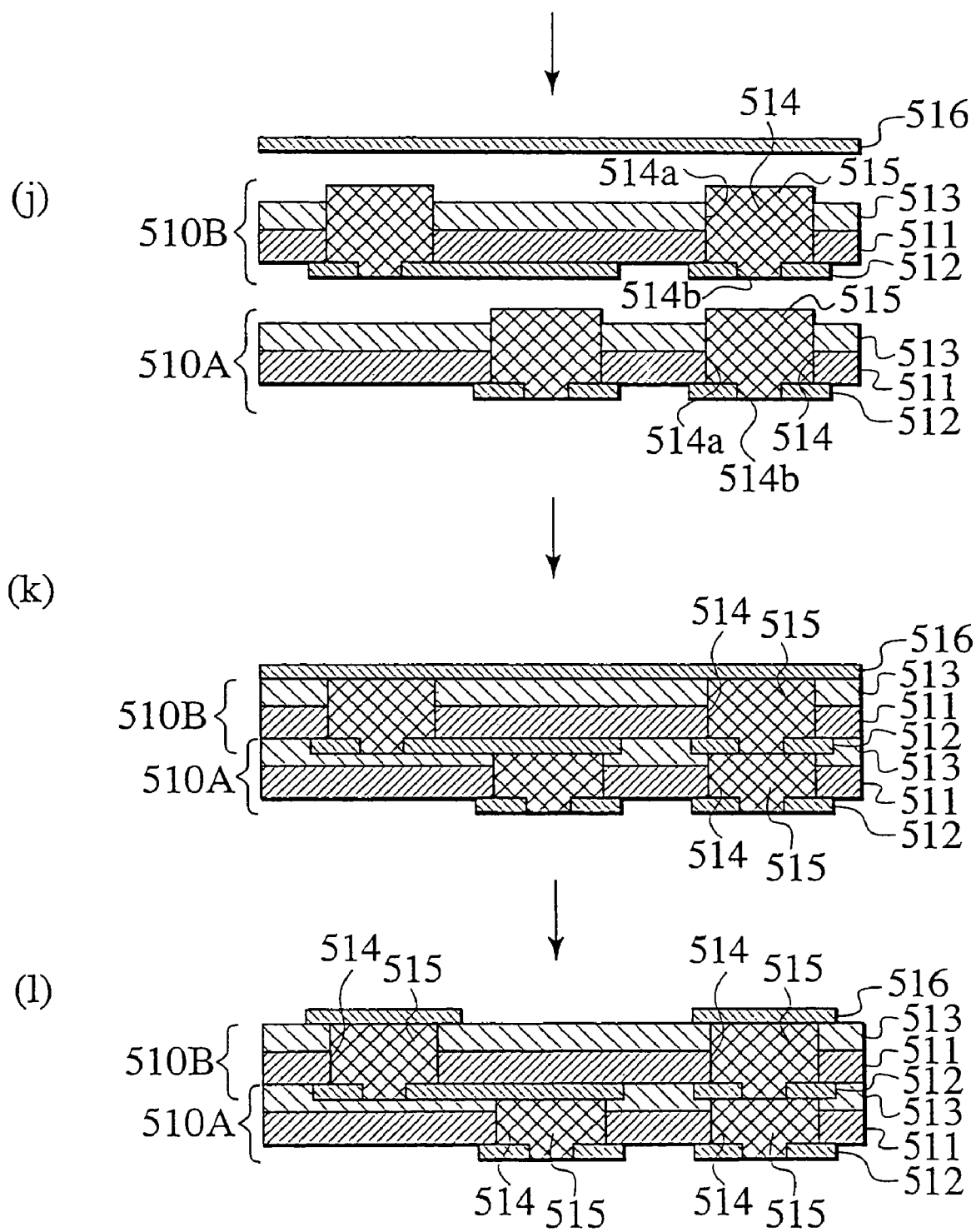
FIG. 47 is a process chart showing an embodiment of the method of manufacturing the multilayer wiring board assembly in accordance with the eighth embodiment of the present invention.

FIG. 46 and FIG. 47 are cross sectional views showing an embodiment of the method of manufacturing the multilayer wiring board assembly component as illustrated in FIG. 45(a) and an embodiment of the method of manufacturing the multilayer wiring board assembly making use of the multilayer wiring board assembly component. In this case, the description is made in the case where the conductive resin composition is inserted to be projected beyond the interlayer adhesive surface.

First of all, as illustrated in FIG. 46(a) and FIG. 46(b), a film made of a plastic polyimide or a thermoplastic polyimide to which a thermosetting property is given, is attached to an insulating resin layer (polyimide film) 511 provided with a conductive layer 512 of a copper foil to be an electrode pattern on the opposite surface of the insulating resin layer 511, in order to form an adhesive layer 513.

Next, as illustrated in FIG. 46(c), an electrode pattern (circuit pattern) of the conductive layer 512 is formed by etching the conductive layer 512.

Next, a PET masking tape 517 is put on the adhesive layer 513 as illustrated in FIG. 46(d), followed by opening a through hole 514 through the PET masking tape 517, the adhesive layer 513, the insulating resin layer 511 and the conductive layer 512 as illustrated in FIG. 46(e).

This through hole 514 comprises a portion 514a which is opened through the PET masking tape 517, the adhesive layer 513 and the insulating resin layer 511 and has a conventional via hole diameter, for example, a diameter of 100 µm, and a portion 514b which is opened through the conductive layer 512 and has a diameter smaller than the via hole diameter of the order of 10 to 50 µm. The selection of the bore diameter of this hole 514b is the characteristics of this embodiment of the present invention and is explained later in detail.

After completion of opening the through hole 514, a desmearing process is performed to eliminate any lingering smear 518 of resins, oxides of the copper foil and so forth that was generated during the opening of the through hole. The desmearing process is performed by soft etching with a plasma or by wet etching with a permanganate chlorinate base desmearing solution agent.

After completing the desmearing process as illustrated in FIG. 46(f), the through hole 514 is filled with a conductive resin composition (conductive paste) 515 from the PET masking tape 517 by squeezing with a squeeze plate 550 as used in a screen printing process as illustrated in FIG. 46(g). FIG. 46(h) shows the conductive resin composition 515 with which the hole has been completely filled.

Next, the PET masking tape 517, to whose surface a residue of the conductive resin composition 515 sticks, is removed as illustrated in FIG. 46(i). As the first board assembly component, this multilayer wiring board assembly component 510A is thermal lamination compression bonded (laminated) to the multilayer wiring board assembly component 510B, which is also manufactured by the manufacturing method as described above and as illustrated in FIG. 46(a) to FIG. 46(i) together with a conductive layer 516 which is made of a copper foil by the use of an appropriate alignment technique respectively in order to obtain a multilayered structure as illustrated in FIG. 47(a) and FIG. 47(b).

During lamination, it is possible to improve the conformation of the adhesive layer 513 to the contour of the circuit pattern of the conductive layer 512 by performing thermal compression bonding in vacuo. Also, it is possible to make close contact between the conductive resin composition 515 and other layers by performing the lamination while the conductive resin composition 515 remains soft.

Finally, as illustrated in FIG. 47(l), the most outer conductive layer 516 is etched in order to form a circuit to complete the forming of a multilayer wiring board assembly.

Figure 48:
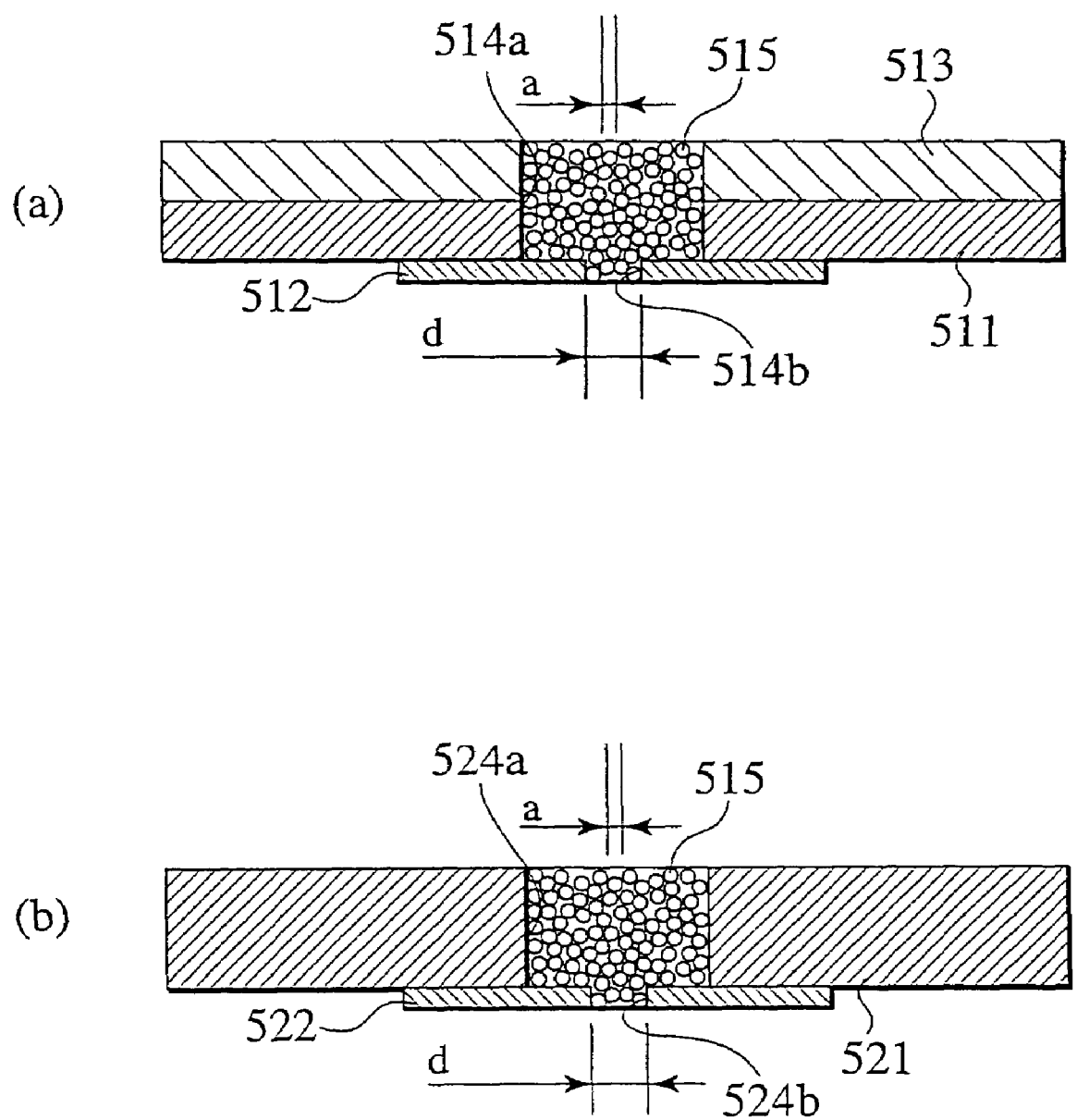
FIG. 48 is an explanatory view for showing the condition of a through hole which is filled with a conductive resin composition by screen printing in the manufacturing method in accordance with the eighth embodiment of the present invention.

Next, with reference to FIG. 48(a), the condition of the through hole 514 filled with the conductive paste by screen printing. The conductive paste is prepared by mixing a resin binder and metal particles or other metal particles having electrical conductivity such as silver particles, with a viscous agent including a solvent in the form of a paste. The diameter "d" of the bore diameter of 514b as considered relative to the maximum diameter "a" of the metal particles is an important factor for surely filling the hole with the conductive paste. For increasing the flexibility of the process design, it is particularly important to determine the tolerable range of the conductive paste and so forth.

First, the inventor of the present invention conducted experiments while the bore diameter of this hole 514b was varied relative to the maximum diameter "a" of the metal particles in order to determin the tolerable range of the bore diameter of this hole 514b. This experiment was repeated also in the case where the adhesive layer 513 was dispensed with as described below and illustrated in FIG. 48(b). Similar results were obtained.

Figure 49:
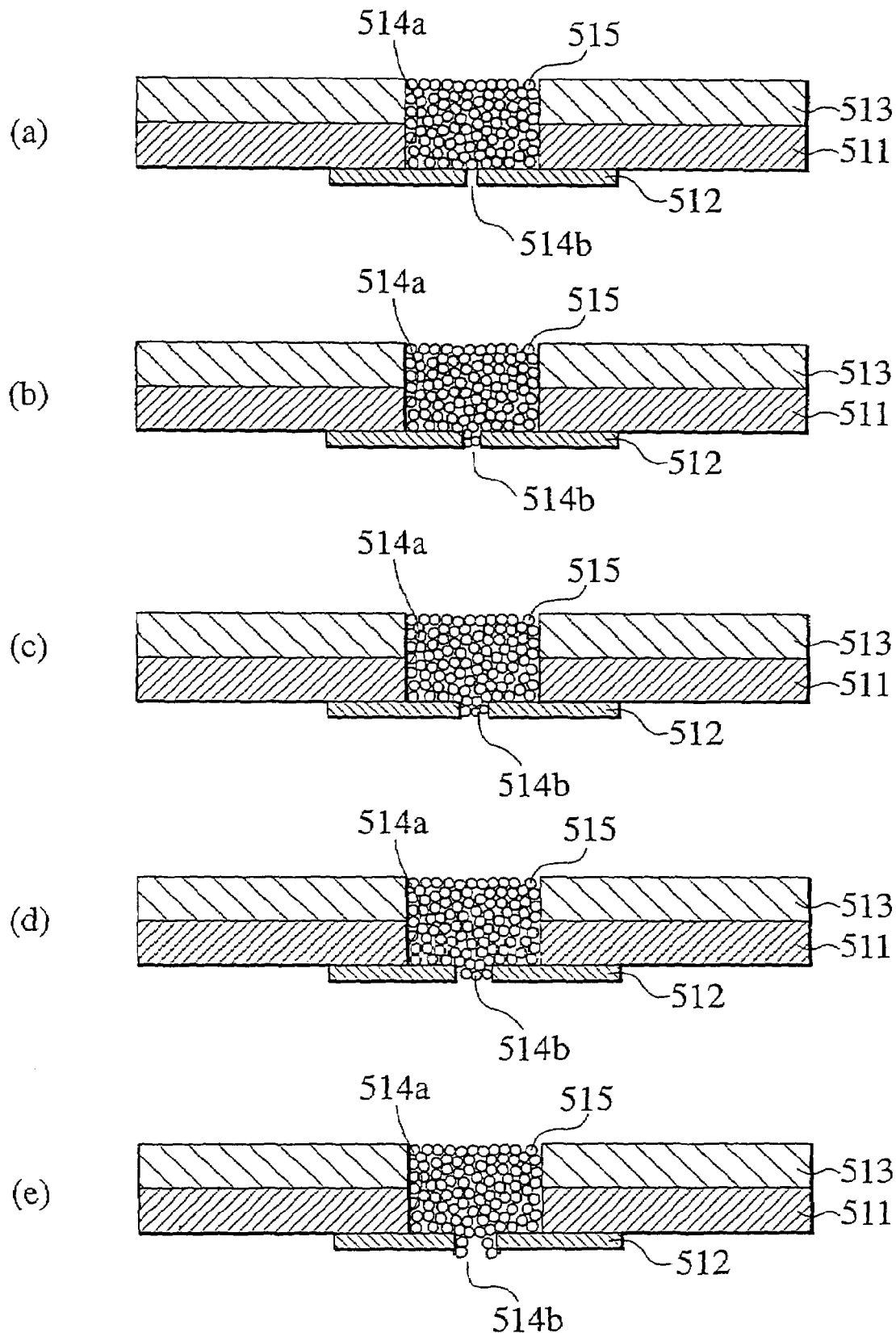
FIG. 49 is an explanatory view for explaining the experimental results which were obtained by examining the condition of the through hole filled with the conductive resin composition by screen printing while changing the bore diameter of a small opening opened through a conductive layer and the surface of the conductive layer in the case of the manufacturing method of the multilayer wiring board assembly component in accordance with the eighth embodiment of the present invention.

The experiment as conducted by the inventor of the present invention will be explained with reference to FIG. 49. FIG. 49(a) is a schematic diagram showing the condition of the conductive paste in the case where the bore diameter of the hole 514b was smaller than the maximum diameter of the metal particles. In this case, the filling of the hole 514b with the metal particles is imperfect. Practically speaking, the distribution of the diameters of the metal particles are dispersed in a certain range so that the hole 514b might be filled in some cases while the hole 514b might not be filled in other cases. However, the probability of filling the hole with the metal particles is decreased as the bore diameter is decreased along with the diameters of the metal particles.

FIG. 49(b) is a schematic diagram showing the condition of the conductive paste in the case where the bore diameter of the hole 514b was increased to the maximum diameter of the metal particles. In this case, almost all the holes 514b were filled with the metal particles. Since the hole 514b is completely filled with the metal particles so that no void is included within the via location when a multilayer substrate is manufactured by laminating a plurality of the assembly components, there are the following advantages. The first advantage is that the electrical connection resistance is stabilized to decrease the dispersion of circuit resistances and to enable to form high frequency circuits with circuit constants just as designed. The second advantage is that even if a thermal shock is applied, it is possible to prevent interlayer separation and via breakage originating from thermal expansion of a gas existing in the boundary locations since reliable adhesiveness in the interlayer locations can be ensured.

FIG. 49(c) and FIG. 49(d) are schematic diagrams showing the conditions of the conductive paste in the case where the bore diameter of the hole 514b was increased from the maximum diameter "a" of the metal particles to about three times the maximum diameter "a". Also in this case, the filling of the hole 514b was consistently established.

Next, FIG. 49(e) is a schematic diagram showing the condition of the conductive paste in the case where the bore diameter of the hole 514b was increased beyond three times the maximum diameter of the metal particles. In this case, the metal particles easily fell out during the filling of the hole so that there often remained voids within the via hole.

From the results of the experiments as described above, it will be understood that the bore diameter "d" of the hole 514b is preferably within a range of a<d<3a where "a" is the maximum diameter of the metal particles. More specifically speaking, the range is determined as from a range of 10 μm to 30 μm to a range of 50 μm to 150 μm in the case where the maximum diameter of the metal particles is 10 μm to 50 μm. FIG. 68(a) is a schematic diagram showing the conclusion of these experimental results.

Figure 52:
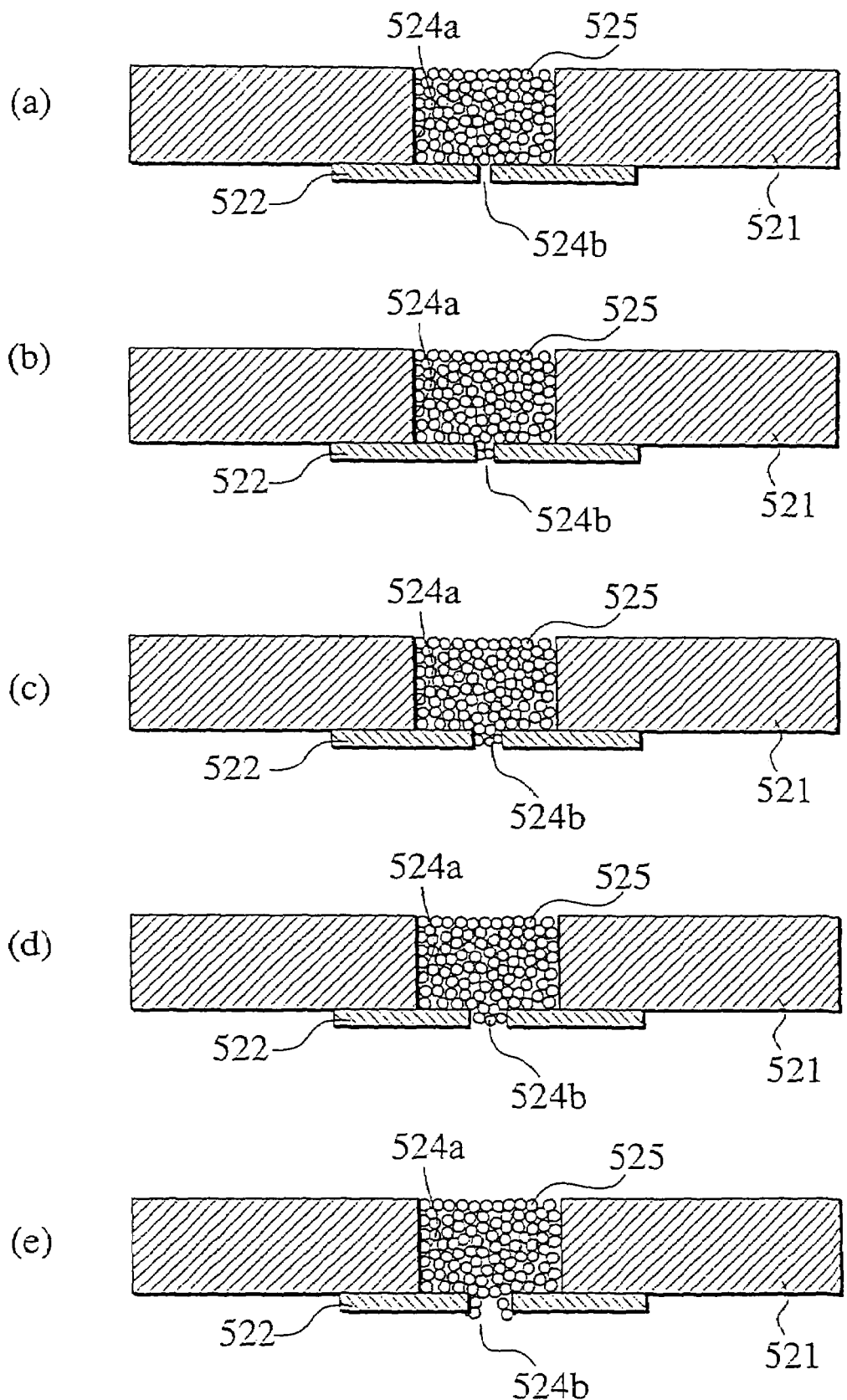
FIG. 52 is an explanatory view for explaining the experimental results which were obtained by examining the condition of the through hole filled with the conductive resin composition by screen printing while changing the bore diameter of the small opening of the conductive layer and the surface of the conductive layer in the case of the manufacturing method of the multilayer wiring board assembly component in accordance with the eighth embodiment of the present invention.

Meanwhile, as illustrated in FIG. 52, this experimental example was conducted also in the case where the adhesive layer 513 was dispensed with as described below, and the equivalent results were obtained therefrom.

Namely, in the case of the multilayer wiring board assembly component in accordance with the present invention, the adhesive layer 513 can be dispensed with as illustrated in FIG. 45(b). The multilayer wiring board assembly component as illustrated in FIG. 45(b) is composed of an insulating resin layer 521 as an insulating substrate component which has adhesivity for interlayer connection and is provided with a conductive layer 522 of a copper foil and the like as an electrode pattern on one surface of the insulating resin layer 511 with a through hole 524 formed passing through the insulating resin layer 521 and the conductive layer 522. The through hole 524 is filled with the conductive resin composition 525 in order to form an IVH (via hole).

In the case of an FPC, the insulating resin layer 521 having adhesivity is formed of a thermoplastic polyimide (TPI) or a thermoplastic polyimide to which a thermosetting property is given. In the case of the use of a thermoplastic polyimide film, taking into consideration the heat resistance of the substrate, it is preferred to use a material having a high glass transition temperature.

The through hole 524 includes a portion 524a which is opened through the insulating resin layer 521 and a portion 524c which is opened through the conductive layer 522. The bore diameter of the portion 524b is a conventional via hole diameter while the bore diameter of the portion 524b is smaller than the bore diameter of the portion 524a passing through the insulating resin layer 521.

The conductive resin composition 525 is prepared by mixing a resin binder and a metal powder having electrical conductivity with a viscous agent including a solvent in the form of a paste, and used to fill the through hole 524 from the insulating resin layer 521 by squeezing to completely stop the hole.

The conductive resin composition 525 is used to make electric contact with the conductive layer 522 by means of the rare surface 522a of the conductive layer 522 rather than the outer surface of the conductive layer 522 therefore, there is no need for the provision of the extended portion of the conductive resin composition 525 extending in the outer direction.

The small hole 524b opened through the conductive layer 522 functions as an air bleeder aperture through which air bubbles are surely exhausted, when filling the hole with the conductive paste, in order to ensure a sufficient contact area between the conductive layer 522 and the conductive resin composition 525. The bore diameter of this hole 524b, the bore diameter of the through hole 524 and the particle diameter of the metallic powder are determined in the same manner as described with reference to FIG. 45(a).

Figure 51:
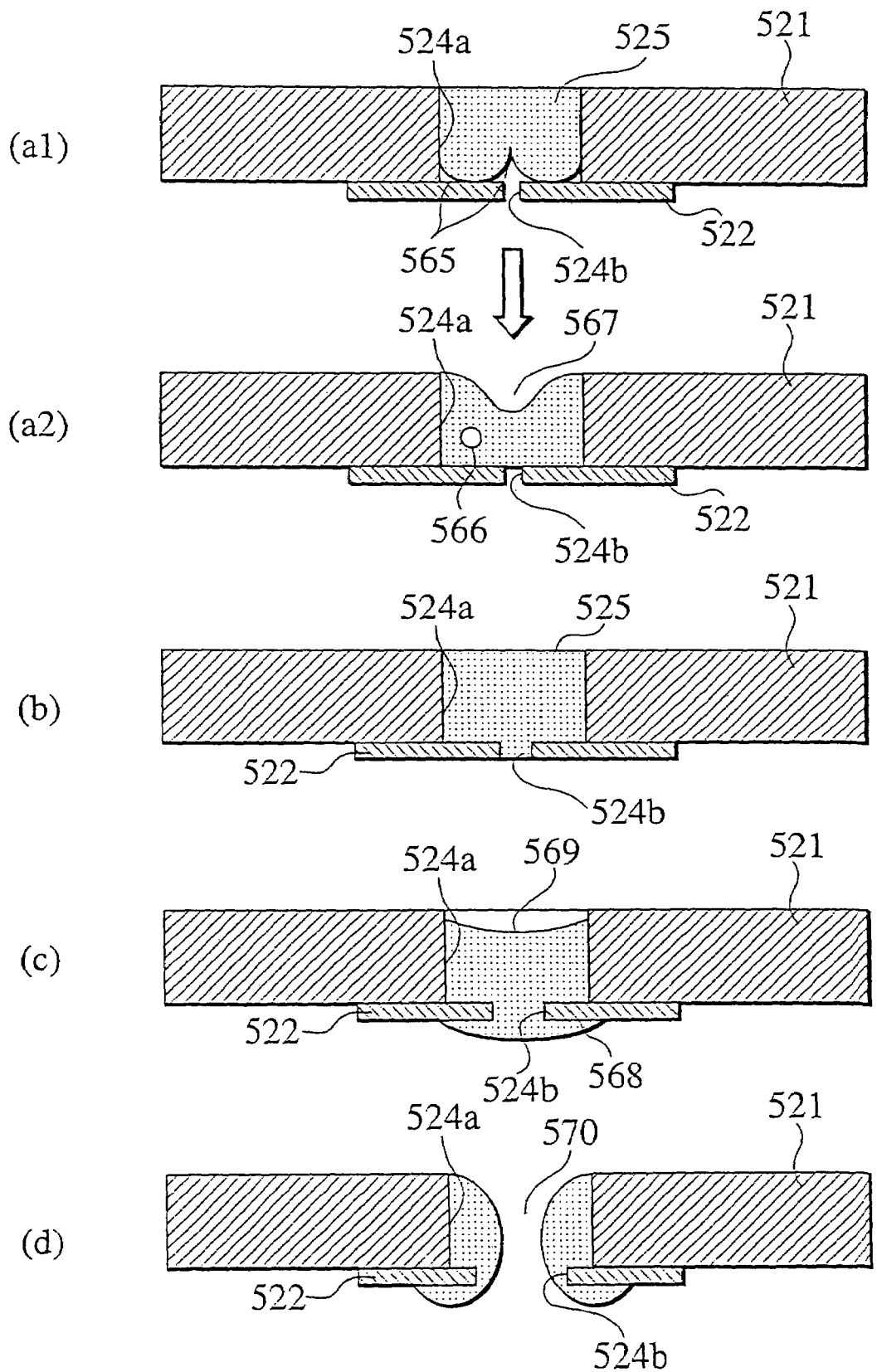
FIG. 51 is an explanatory view for explaining the experimental results which were obtained by examining the condition of the through hole filled with the conductive resin composition by screen printing while changing respectively the bore diameter of the small hole opened through the conductive layer and the bore diameter of the insulating resin layer in the case of the manufacturing method of the multilayer wiring board assembly component in accordance with the eighth embodiment of the present invention.

On the other hand, the relationship between the bore diameter of the through hole 524a and the diameter of the hole 524b is an important factor for adequately filling the hole with the conductive paste. Also in this case, it is particularly important to determine the tolerable range of this factor for increasing the flexibility for designing the process, selecting the conductive paste and so forth. With this consideration in mind, the inventor of the present invention has conducted experiments in which a variety of combinations of the bore diameters D of the through hole 514a and the bore diameters d of the hole 514b (refer to FIG. 50(a)) were prepared followed by filling them with a variety of materials used as the conductive resin composition, having the coefficients of viscosity and the thixotropy factors in wide ranges, followed by confirming the condition of the conductive resin composition as a result. FIG. 51 is an explanatory view for explaining the experimental results which were obtained by examining the condition of the through hole filled with the conductive resin composition by screen printing while changing respectively the bore diameter of the small hole opened through the conductive layer and the bore diameter of the insulating resin layer in the case of the manufacturing method of the multilayer wiring board assembly component in accordance with the eighth embodiment of the present invention. In the following explanation, the experiments as conducted by the inventor of the present invention will be explained.

In the experiments, it was confirmed whether or not the conductive resin composition was completely inserted without voids from the adhesive layer by means of a screen printing apparatus with the hole 514b through which air was easily released. Under a variety of experimental conditions with the bore diameters of the through hole 514a from 50 μm to 300 μm, it was found as an optimal range that D/2>d>D/10 as described below by repeating experiments. While this experiment was repeated also in the case where the adhesive layer was dispensed with as described below and illustrated in FIG. 50(b), similar results were obtained as illustrated in FIG. 51. FIG. 48(b) is a schematic diagram showing the conclusion of these experimental results.

Namely, FIG. 51(a1) and FIG. 51(a2) are cross sectional views showing the result of experiments for confirming the filling condition of the conductive resin composition with the bore diameter "d" of the hole 524b being no larger than 1/10 of the bore diameter D of the through hole 524a. In this case, voids 565 (FIG. 51(a1)) were observed because air was not sufficiently removed by filling the conductive resin composition 525 just after the conductive resin composition was inserted from the through hole 524a to the hole 524b. Although the voids gradually came out of the conductive resin composition after completion of the printing and filling process (FIG. 51(a2)), there remained yet lingering air as air bubble 566 or a recess 567 was formed in the via location due to a deficiency of the conductive resin composition filling the through hole. While this shortcoming may be removed by performing the printing process under a reduced pressure, the application is limited because of a higher cost required and lower throughput obtained.

FIG. 51(b) is a cross sectional view showing the results of experiments for confirming the filling condition of the conductive resin composition with the bore diameter "d" of the hole 524b relative to the bore diameter D of the through hole 524a satisfying the equation of D/2>d>D/10. In this case, air could be sufficiently exhausted, even under atmospheric pressure to completely fill the via hole including the hole 524b without any lingering voids. With the multilayered substrate structure as manufactured in this manner, it can be expected to achieve a stabilized performance and high reliability as explained in the above embodiments.

FIG. 51(c) is a cross sectional view showing the result of experiments for confirming the filling condition of the conductive resin composition with the bore diameter "d" of the hole 524b which was further enlarged relative to the bore diameter D of the through hole 524a, satisfying the equation of d>D/2. In this case, the filling conductive resin composition leaked through the opening due to the viscosity thereof and extended over the bottom surface. The conductive resin composition 568 extending over the land of the bottom surface tends not only to cause an insulation failure but also to cause an interlayer conduction failure because of the via connection surface 569 which is depressed from the polyimide surface corresponding to the leakage of the conductive resin composition 568.

When the diameter of the opening was furthermore increased as illustrated in FIG. 51(d), the throughhole 524a was not stopped by the conductive resin composition which was attached only to the inner wall surface leaving a through hole 570.

From the above results of the experiments, it is understood that the bore diameter "d" of the hole 524b is preferably formed within a range of D/10<d<D/2 where D is the bore diameter of the through hole 524a.

Meanwhile, the conductive resin composition 515 or the conductive resin composition 525 may be made of a conductive paste including a copper filler or a carbon mixture in place of a silver paste. In the case of this embodiment of the present invention, since the PET masking tape 557 is put on the surface of the multilayer wiring board assembly component, it is possible to perform squeezing by making direct contact between the squeeze plate 550 and the substrate without making use of a metallic mask or a squeezing mask therebetween, while of course it is also possible to perform squeezing by making use of a metallic mask or a squeezing mask in order to eliminate waste losses of the conductive resin composition.

Under the condition as described above, it is possible to surely remove air bubbles from the small opening 514b or 524b of the copper foil member (the conductive layer 512), to prevent air bubbles from lingering in the through hole 514 or 524, to prevent the conductive resin composition from leaking through the opening of the hole 514b or 524b, and to make close contact between the copper foil member (the conductive layer 512 or 522) and the conductive resin composition 515 or 525 by the rare surface 512*a* or 522*a* of the conductive layer 512 or 522.

In the case of either multilayer wiring board assembly component as illustrated in FIG. 45(*a*) or 45(*b*), the through hole 514 or 524 including the large hole 514*a* or 524*a* and the small hole 514*b* or 524*b* can be formed by a laser boring process utilizing laser beam irradiation, or alternatively by etching or a combination of etching and laser beam irradiation.

In the case of the laser boring process, the process is initiated by opening the large hole 514*a* through the insulating resin layer 511 and the adhesive layer 513 or opening the large hole 524*a* through the insulating resin layer 521 by laser beam irradiation, followed by opening the small hole 514*b* through the conductive layer 512 or opening the small hole 524*b* through the conductive layer 522 also by laser beam irradiation. Thereafter, the conductive resin composition (the conductive paste) 515 or 525 is used to fill the through hole 514 or 524. In this case, however, the strength of the laser beam (laser strength) is usually higher (stronger) in the center of the beam and lower (weaker) near the periphery of the beam as seen in the radial direction of the beam therefore, it is possible to make use of this fact in order to form, in one step, the small hole 514*b* or 524*b* through the conductive layer 512 or 522 and the large hole 514*a* or 524*a* through the resin member. By this process, the via hole of the above described structure can be efficiently formed in a shorter amount of time.

Furthermore, the IVH can be surely formed of the above described structure by making use of a laser beam having a two-step profile of the beam strength within the processing plane as illustrated in FIG. 16(*a*) and FIG. 16(*b*) in which the laser beam is stronger near the center of the beam and weaker near the periphery of the beam. The laser beam with such a two-step strength profile can be prepared by passing a laser beam through a filter having a beam transmission efficiency which is high at the center position and low near the periphery of the beam in advance of restricting the laser beam.

The manufacturing steps of the multilayer wiring board assembly component as described above and the manufacturing steps of the multilayer wiring board assembly by making use of the multilayer wiring board assembly component are applicable in the same manner to the manufacturing steps of the multilayer wiring board assembly component as illustrated in FIG. 45(*b*) and the manufacturing steps of the multilayer wiring board assembly by making use of the multilayer wiring board assembly component.

The multilayer wiring board assembly, the multilayer wiring board assembly component and the manufacturing method thereof in accordance with the present invention is not limited to the application to flexible printed circuit boards making use of a polyimide film, but also applicable to a flexible printed circuit board making use of a polyester film, or a rigid type making use of, as an insulating material, an epoxy resin, a woven glass fabric, the aramid nonwoven cloth and the like in the same manner.

Figure 54:
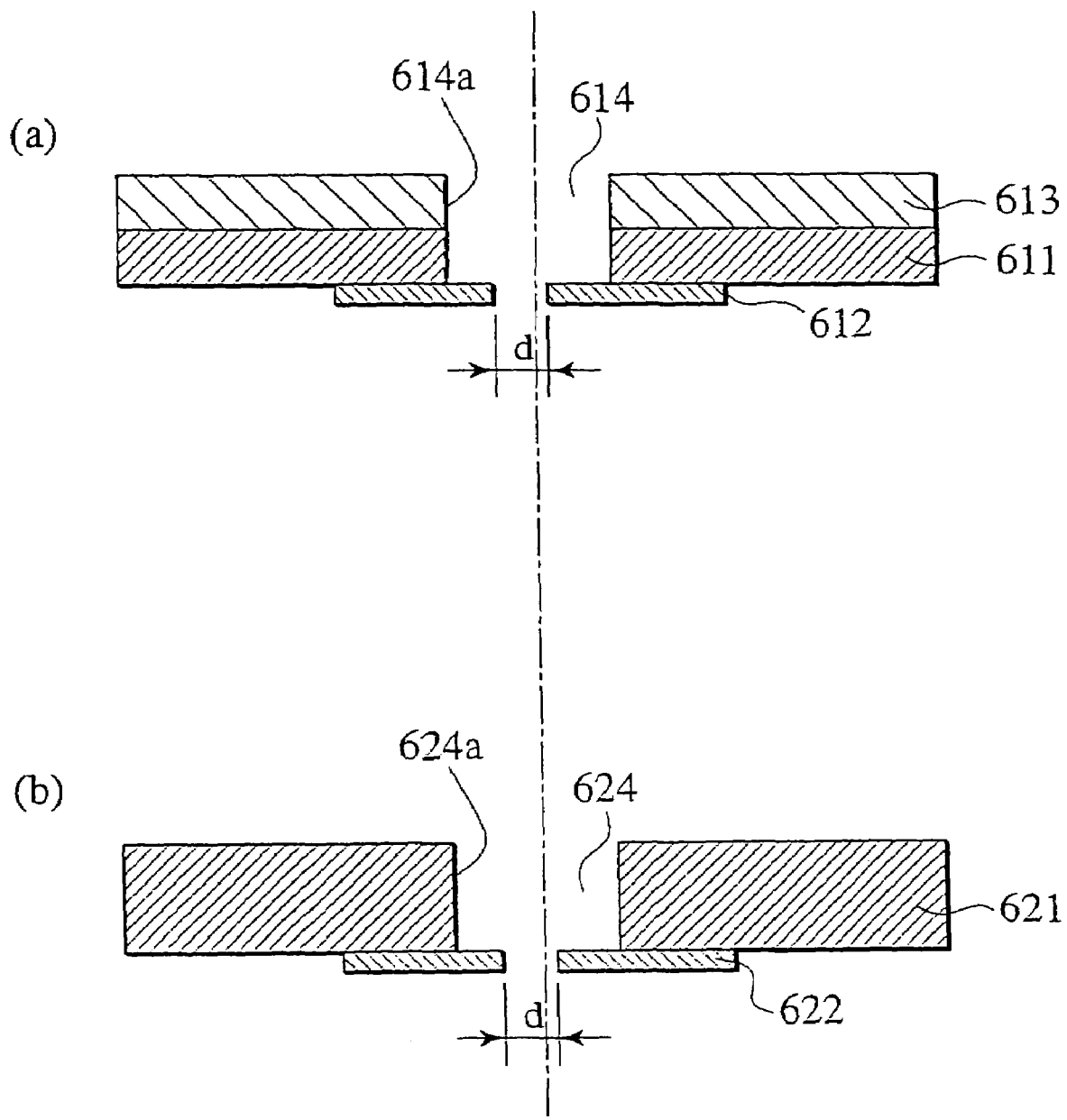
FIG. 54 is an explanatory view for explaining the relationship between the center position of the through hole of the insulating resin layer and the small opening of a conductive layer in the multilayer wiring board assembly component in accordance with the ninth embodiment of the present invention.

Next, the ninth embodiment of the present invention will be explained. The characteristics of this embodiment resides in that the center position of the through hole of the insulating resin layer is displaced from the center position of the small opening of the conductive layer as illustrated in FIG. 54(*a*). Such displacement in greater or lesser degrees is inevitable in practice. Meanwhile, the following description is basically true also in the configuration as described later where the adhesive layer was dispensed with as illustrated in FIG. 54(*b*). FIG. 53(*a*) shows the basic configuration of a multilayer wiring board assembly component in accordance with this embodiment of the present invention.

The multilayer wiring board assembly component as illustrated in FIG. 53(*a*) is composed of an insulating resin layer 611 as an insulating substrate component which is provided with a conductive layer 612 of a copper foil and the like as an electrode pattern on one surface of the insulating resin layer 611 and an adhesive layer 613 for interlayer connection on the other surface respectively with a through hole 614 formed passing through the adhesive layer 613, the insulating resin layer 611 and the conductive layer 612. The through hole 614 is filled with a conductive resin composition 615 in order to form an IVH (via hole).

In the case of an FPC, the insulating resin layer 611 is composed of a flexible resin film such as a polyimide film, a polyester film or the like made of a wholly aromatic polyimide (API) and the like in order to form a triple layered structure of the insulating resin layer 611, the conductive layer 612 and the adhesive layer 613 in which a polyimide base adhesive material as the adhesive layer 613 is attached to the surface of the polyimide member (the insulating resin layer 611) of the general purpose single sided copper plated polyimide component compared to opposite the surface contacting the copper foil (the conductive layer 612).

The through hole 614 formed through the multilayer wiring board assembly component includes a portion 614*a* which is opened through the adhesive layer 613 and the insulating resin layer 611 and a portion 614*b* which is opened through the conductive layer 612. The bore diameter of the portion 614*a* is a conventional via hole diameter while the bore diameter of the portion 614*b* is smaller than the bore diameter of the portion 614*a* passing through the adhesive layer 613 and the insulating resin layer 611. Also, the center position of this hole 614*b* is slightly displaced from the center position of the through hole 614*a*. Such displacement in greater or lesser degrees is inevitable in practice.

The adhesive layer 613 can be formed by not only the application of an adhesive material but also by attaching a thermoplastic polyimide film or a film which is made by giving a thermosetting property to a thermoplastic polyimide film. In the case of the use of a thermoplastic polyimide film, taking into consideration the heat resistance of the substrate, it is preferred to use a material having a high glass transition temperature. Meanwhile, the insulating resin layer 611 can be formed not only of a polyimide film but also of an insulating material such as an imide base or epoxy base prepreg. In the latter case, the insulating resin layer 611 can function as an adhesive so that it is possible to dispense with the adhesive layer 613 which has otherwise to be separately formed.

The conductive resin composition 615 is prepared by mixing a resin binder and a metal powder having electrical conductivity with a viscous agent including a solvent in the form of a paste, and used to fill the through hole 614 from the insulating resin layer 611 by squeezing to completely stop the hole.

The conductive resin composition 615 is used to make electric contact with the conductive layer 612 by means of the rare surface 612*a* of the conductive layer 612 rather than the outer surface of the conductive layer 612 therefore, there is no need for the provision of the extended portion of the conductive resin composition 615 extending in the outer direction.

The small hole 614*b* opened through the conductive layer 612 functions as an air bleeder aperture through which air bubbles are surely exhausted, when filling the hole with the conductive paste, in order to ensure a sufficient contact area between the conductive layer 612 and the conductive resin composition 615.

While the conductive paste 615 is provided with no projection in the surface thereof opposite to the conductive layer 612 in the case of the multilayer wiring board assembly component as illustrated in FIG. 53, it is also possible to provide such a projection as illustrated in FIG. 55(i). Also, the adhesive layer 613 as illustrated in FIG. 53(a) is dispensed with in the case as illustrated in FIG. 53(b), as described below.

The characteristics of the present invention reside in the formation technique of a small hole 614b opened through this conductive layer 612. Namely, the inventor of the present invention has repeatedly conducted experiments in order to determine the structure required of the hole 614b to function as the most effective air bleeder aperture. In what follows, the characteristics thereof will be explained in detail as well as the manufacturing method thereof.

Figure 55:
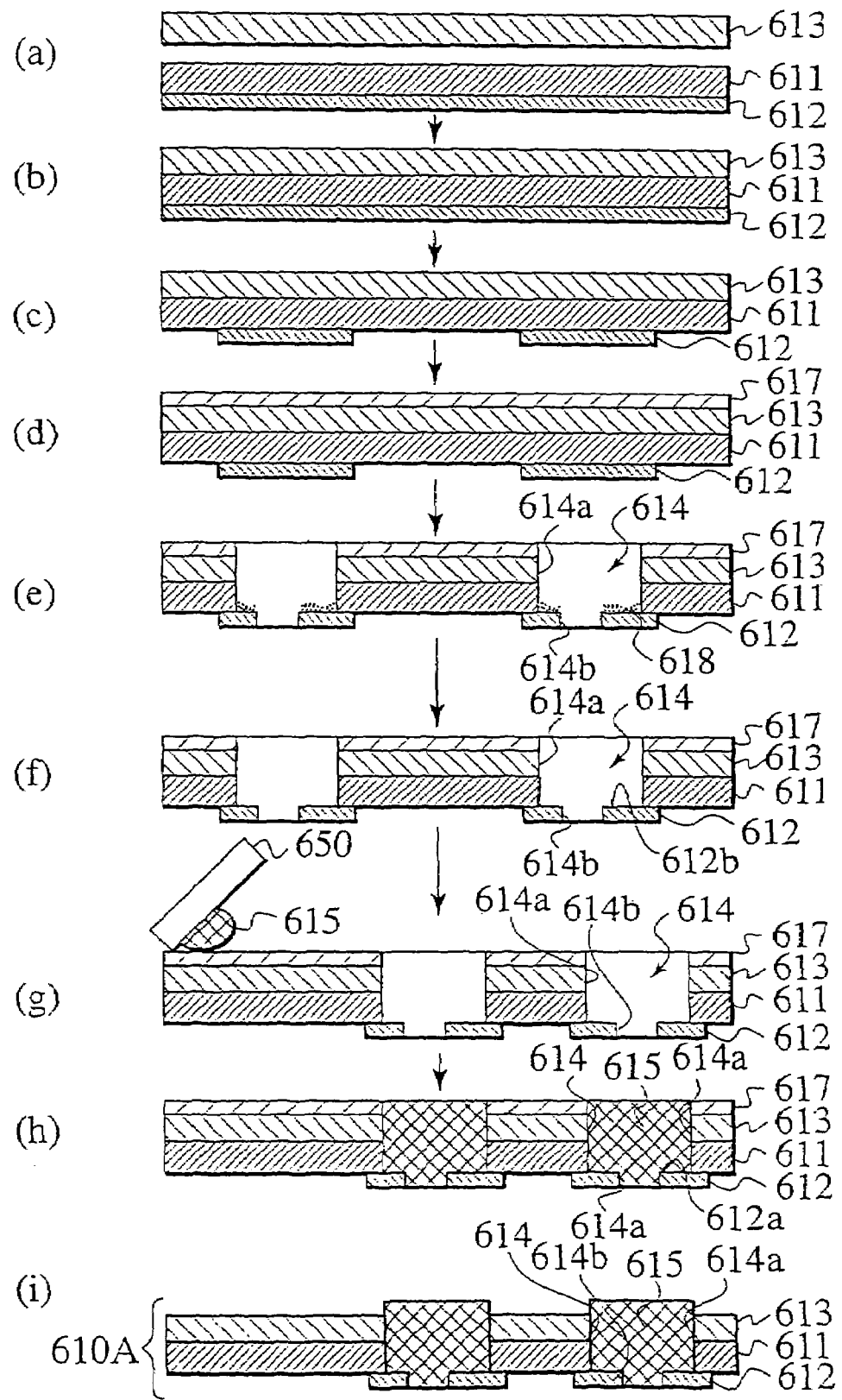
FIG. 55 is a process chart showing an embodiment of the method of manufacturing the multilayer wiring board assembly component in accordance with the ninth embodiment of the present invention.
Figure 56:
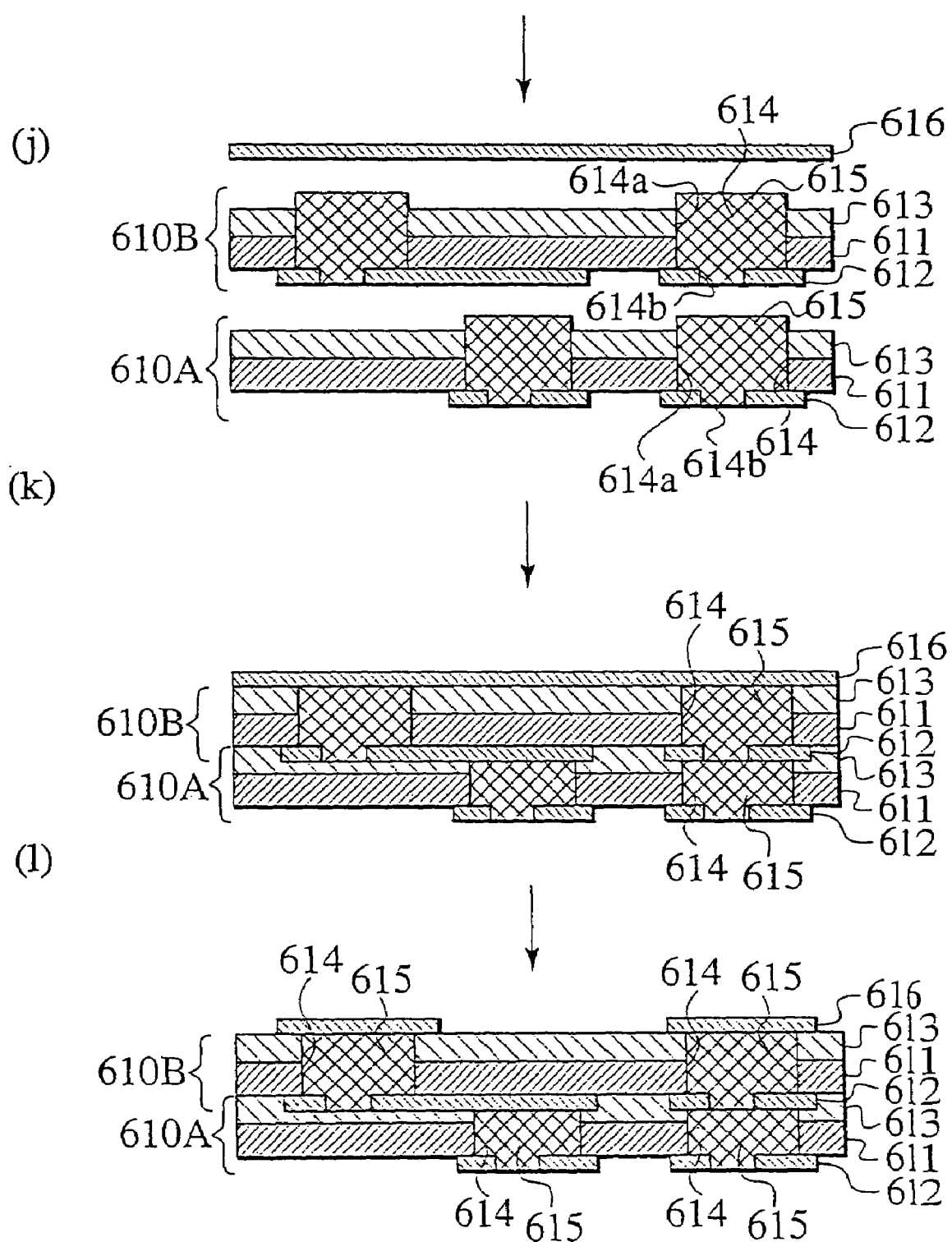
FIG. 56 is a process chart showing an embodiment of the method of manufacturing the multilayer wiring board assembly component in accordance with the ninth embodiment of the present invention.

FIG. 55 and FIG. 56 are cross sectional views showing an embodiment of the method of manufacturing the multilayer wiring board assembly component as illustrated in FIG. 53(a) and an embodiment of the method of manufacturing the multilayer wiring board assembly making use of the multilayer wiring board assembly component. In this case, the description is made in the case where the conductive resin composition is inserted to be projected beyond the interlayer adhesive surface.

First of all, as illustrated in FIG. 55(a) and FIG. 55(b), a film made of a plastic polyimide or a thermoplastic polyimide to which a thermosetting property is given, is attached to an insulating resin layer (polyimide film) 611 provided with a conductive layer 612 of a copper foil to be an electrode pattern on the opposite surface of the insulating resin layer 611, in order to form an adhesive layer 613.

Next, as illustrated in FIG. 55(c), an electrode pattern (circuit pattern) of the conductive layer 612 is formed by etching the conductive layer 612.

Next, a PET masking tape 617 is put on the adhesive layer 613 as illustrated in FIG. 55(d), followed by opening a through hole 614 through the PET masking tape 617, the adhesive layer 613, the insulating resin layer 611 and the conductive layer 612 as illustrated in FIG. 55(e).

This through hole 614 comprises a portion 614a which is opened through the PET masking tape 617, the adhesive layer 613 and the insulating resin layer 611 and has a conventional via hole diameter, for example, a diameter of 100 μm, and a portion 614b which is opened through the conductive layer 612 and has a diameter smaller than the via hole diameter of the order of 10 to 50 μm. Also, the center position of this hole 614b is slightly displaced from the center position of the through hole 614a. Such displacement in greater or lesser degrees is inevitable in practice.

After completion of opening the through hole 614, a desmearing process is performed to eliminate any lingering smear 618 of resins, oxides of the copper foil and so forth that was generated during the opening of the through hole. The desmearing process is performed by soft etching with a plasma or by wet etching with a permanganate chlorinate base desmearing solution agent.

After completing the desmearing process as illustrated in FIG. 55(f), the through hole 614 is filled with a conductive resin composition (conductive paste) 615 from the PET masking tape 617 by squeezing with a squeeze plate 650 as used in a screen printing process as illustrated in FIG. 55(g). FIG. 55(h) shows the conductive resin composition 615 with which the hole has been completely filled.

Next, the PET masking tape 617, to whose surface a residue of the conductive resin composition 615 sticks, is removed as illustrated in FIG. 55(i). As the first board assembly component, this multilayer wiring board assembly component 610A is thermal lamination compression bonded (laminated) to the multilayer wiring board assembly component 610B, which is also manufactured by the manufacturing method as described above and as illustrated in FIG. 55(a) to FIG. 55(i) together with a conductive layer 616 which is made of a copper foil respectively by the use of an appropriate alignment technique in order to obtain a multilayered structure as illustrated in FIG. 56(j) and FIG. 56(k).

During lamination, it is possible to improve the conformation of the adhesive layer 613 to the contour of the circuit pattern of the conductive layer 612 by performing thermal compression bonding in vacuo. Also, it is possible to make close contact between the conductive resin composition 615 and other layers by performing the lamination while the conductive resin composition 615 remains soft.

Finally, as illustrated in FIG. 56(l), the most outer conductive layer 616 is etched in order to form a circuit to complete the forming of a multilayer wiring board assembly.

As described above, the center position of this hole 614b is displaced from the center position of the through hole 614a. Generally speaking, it is advantageous to have a wider allowable range for the accuracy of positional alignment when designing the manufacturing process. In this case, the flexibility of designing the manufacturing process is increased if the center position of the hole 614b can be displaced. For example, this embodiment is effective in the case where it is desired to move the center position of the hole 614b to the left as far as possible while taking into consideration the relationship to the pattern characteristics of the copper foil. Also, if the allowable range is known, the development time may sometimes be trimmed. Namely, the step of maintaining the accuracy may be simplified.

The inventor of the present invention has therefore conducted experiments while the center position of the hole 614b was changed in order to determine the allowable range of displacement of the center position of this hole 614b.

Figure 57:
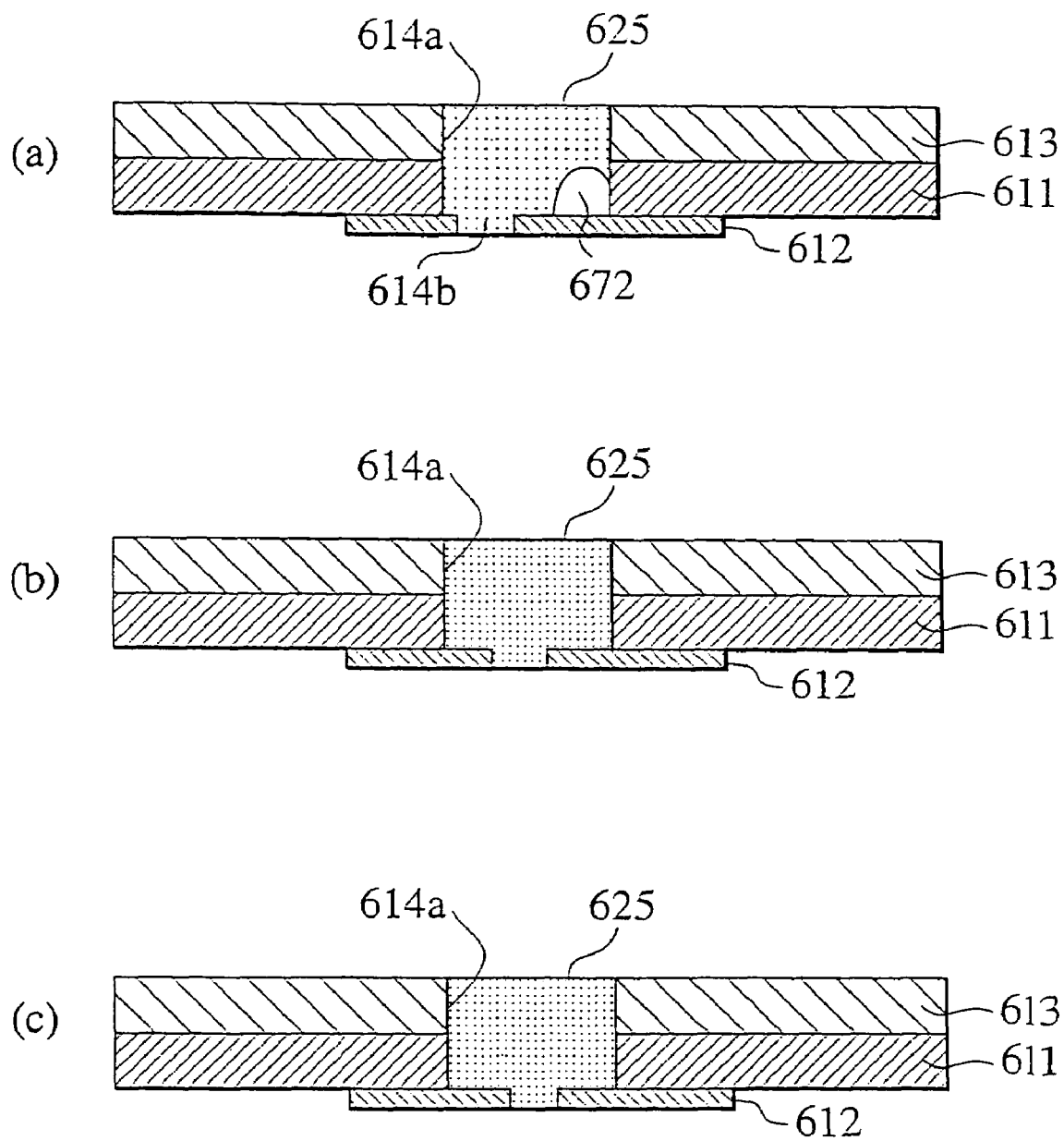
FIG. 57 is an explanatory view for explaining the experimental results which were obtained by examining the condition of the through hole filled with a conductive resin composition by screen printing while changing the center position of the small hole opened through the conductive layer relative to the center position of the insulating resin layer in the case of the manufacturing method of the multilayer wiring board assembly component in accordance with the ninth embodiment of the present invention.

FIG. 57 is an explanatory view for explaining the experimental results which were obtained by examining the condition of the through hole filled with the conductive resin composition by screen printing while changing the center position of the small hole opened through the conductive layer relative to the center position of the insulating resin layer in the case of the manufacturing method of the multilayer wiring board assembly component in accordance with the eighth embodiment of the present invention. In this case, the experiments were conducted when d=D/3 in order to determine the allowable range.

FIG. 57(a) is a cross sectional view showing the result of experiments for confirming the filling condition of the conductive resin composition while the hole 614b was displaced from the center position of the through hole 614a to the extent that the center position of the through hole 614a did no longer fall within the hole 614b. Namely, air bubbles 672 that were lingering in some of the via holes were observed when the hole 614b was located and the entirety of the hole 614b was located outside of the center line of the through hole 614a. It is understood that the filling tends to be incomplete at locations distant from the hole 614b where air is hardly removed.

FIG. 57(b) is a cross sectional view showing the result of experiments for confirming the filling condition of the conductive resin composition while the location of the hole 614b was moved closer to the center position of the through hole 614a from the location as illustrated in FIG. 57(a) so that the center line of the through hole 614a fell within the hole 614b. As a result, all of the via holes could be completely filled with the conductive resin composition without any voids. From the experimental results, it will be understood that the opening of the conductive layer includes the center position of the via hole bottom. FIG. 57(c) is a cross sectional view showing the result of experiments for confirming the filling condition of the conductive resin composition with the location of the hole 614b being aligned with the center position of the through hole 614a. Also in this case, all of the via holes could be completely filled with the conductive resin composition without any voids.

Meanwhile, there is a technique available for accurately aligning the center position of the hole 614b as the opening of the conductive layer with the center position of the via hole of the resin member, by making use of a UV-YAG laser, an excimer laser or the like in order to process the via hole resin member and the copper foil member one at a time. However, there are no problems even if the center position of the hole 614b is somewhat displaced from the center position of the through hole 614a as long as the above condition is satisfied. Therefore, it becomes possible to make use of a process technique which has not been employed before. For example, if these two layers are separately processed, where the resin member is processed by alkali etching or laser processing while the copper foil member is processed by etching with an acid, the process locations of these two layers tend to be displaced from each other. However, it is acceptable as long as the above condition is satisfied even if the center position of the hole 614b is somewhat displaced from the center position of the through hole 614a.

By this configuration, air bubbles are discharged through the small opening 614b of the copper foil member (the conductive layer 612) during squeezing in order to prevent the air bubbles from lingering inside of the through hole 614 therefore, close contact between the copper foil member (the conductive layer 612) and the conductive resin composition 615 can be surely established by the rare surface 612a of the conductive layer 612 without any leakage of the conductive resin composition from the opening of the hole 614b.

Meanwhile, in the case of the multilayer wiring board assembly component in accordance with the present invention, the adhesive layer 613 can be dispensed with as illustrated in FIG. 53(b). The multilayer wiring board assembly component as illustrated in FIG. 53(b) is composed of an insulating resin layer 621 as an insulating substrate component which has adhesivity for interlayer connection and is provided with a conductive layer 622 of a copper foil and the like as an electrode pattern on one surface of the insulating resin layer 611 with a through hole 624 formed passing through the insulating resin layer 621 and the conductive layer 622. The through hole 624 is filled with the conductive resin composition 625 in order to form an IVH (via hole).

In the case of an FPC, the insulating resin layer 621 having adhesivity is formed of a thermoplastic polyimide (TPI) or a thermoplastic polyimide to which a thermosetting property is given. In the case of the use of a thermoplastic polyimide film, taking into consideration the heat resistance of the substrate, it is preferred to use a material having a high glass transition temperature.

The through hole 624 includes a portion 624a which is opened through the insulating resin layer 621 and a portion 624c which is opened through the conductive layer 622. The bore diameter of the portion 624b is a conventional via hole diameter while the bore diameter of the portion 624b is smaller than the bore diameter of the portion 624a passed through the insulating resin layer 621.

The conductive resin composition 625 is prepared by mixing a resin binder and a metal powder having electrical conductivity with a viscous agent including a solvent in the form of a paste, and used to fill the through hole 624 from the insulating resin layer 621 by squeezing to completely stop the hole.

The conductive resin composition 625 is used to make electric contact with the conductive layer 622 by means of the rare surface 622a of the conductive layer 622 rather than the outer surface of the conductive layer 622 therefore, there is no need for the provision of the extended portion of the conductive resin composition 625 extending in the outer direction.

The small hole 624b opened through the conductive layer 622 functions as an air bleeder aperture through which air bubbles are surely exhausted, when filling the hole with the conductive paste, in order to ensure a sufficient contact area between the conductive layer 622 and the conductive resin composition 625. The selection of the center position of this hole 614b is determined in the same manner as described with reference to FIG. 53(a).

Figure 58:
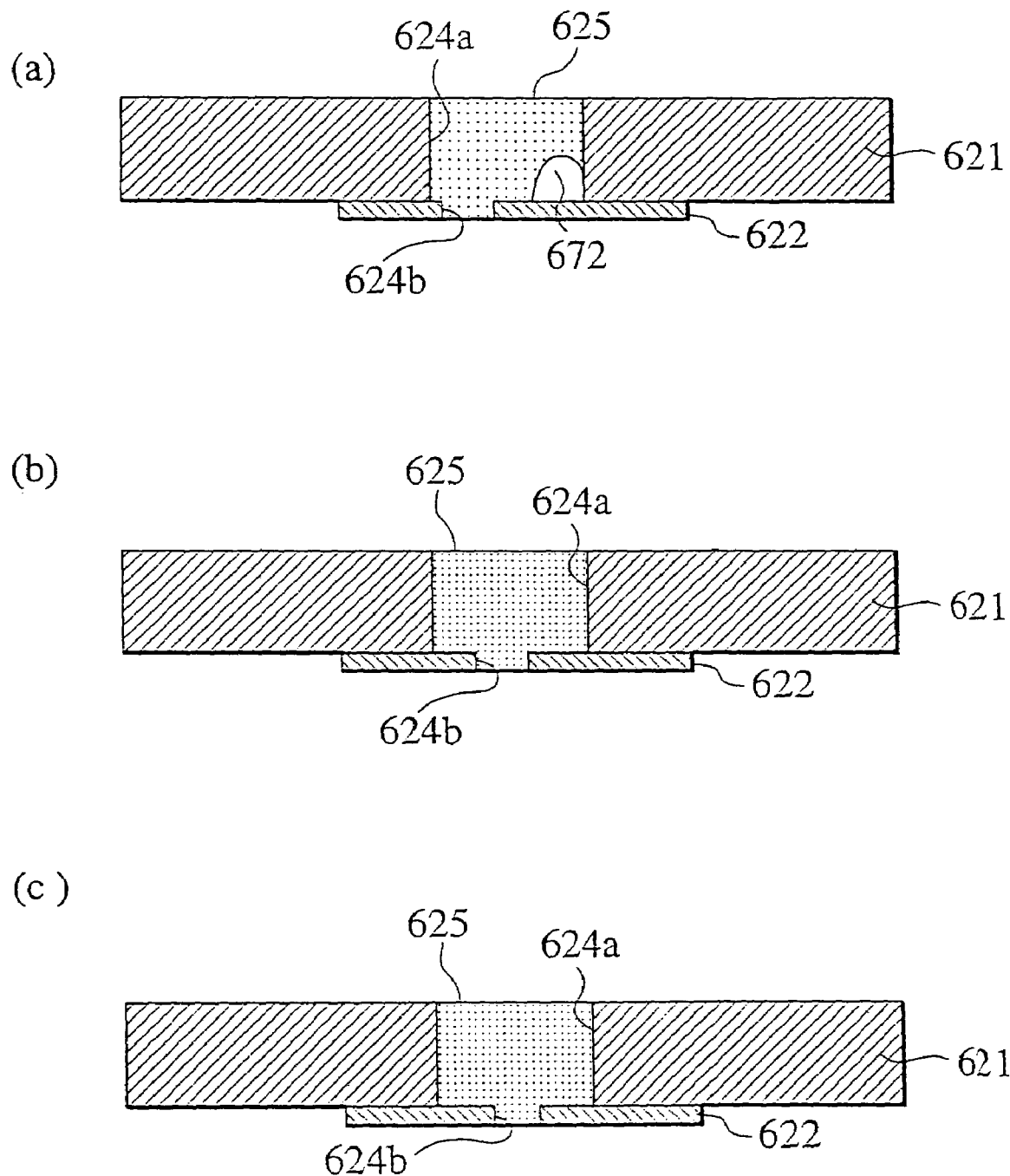
FIG. 58 is an explanatory view for explaining the experimental results which were obtained by examining the condition of the through hole filled with the conductive resin composition by screen printing while changing the positional relationship between the center position of the through hole of the insulating resin layer and the center position of the small opening of the conductive layer in the case of the manufacturing method of the multilayer wiring board assembly component in accordance with the ninth embodiment of the present invention.

The manufacturing steps of the multilayer wiring board assembly component as described above and the manufacturing steps of the multilayer wiring board assembly by making use of the multilayer wiring board assembly component are applicable in the same manner to the manufacturing steps of the multilayer wiring board assembly component as illustrated in FIG. 53(b) and the manufacturing steps of the multilayer wiring board assembly by making use of the multilayer wiring board assembly component. Meanwhile, the results of the experiments as illustrated in FIG. 58 were confirmed with the multilayer wiring board assembly component as illustrated in FIG. 53(b). Namely, while the experiments have been conducted in the case where the adhesive layer 613 was dispensed with as illustrated in FIG. 58, similar results were obtained. FIG. 68(c) is a schematic diagram showing the conclusion of these experimental results.

The multilayer wiring board assembly, the multilayer wiring board assembly component and the manufacturing method thereof in accordance with the present invention is not limited to the application to flexible printed circuit boards making use of a polyimide film, but also applicable to a flexible printed circuit board making use of a polyester film, or a rigid type making use of, as an insulating material, an epoxy resin, a woven glass fabric, the aramid nonwoven cloth and the like in the same manner.

Figure 60:
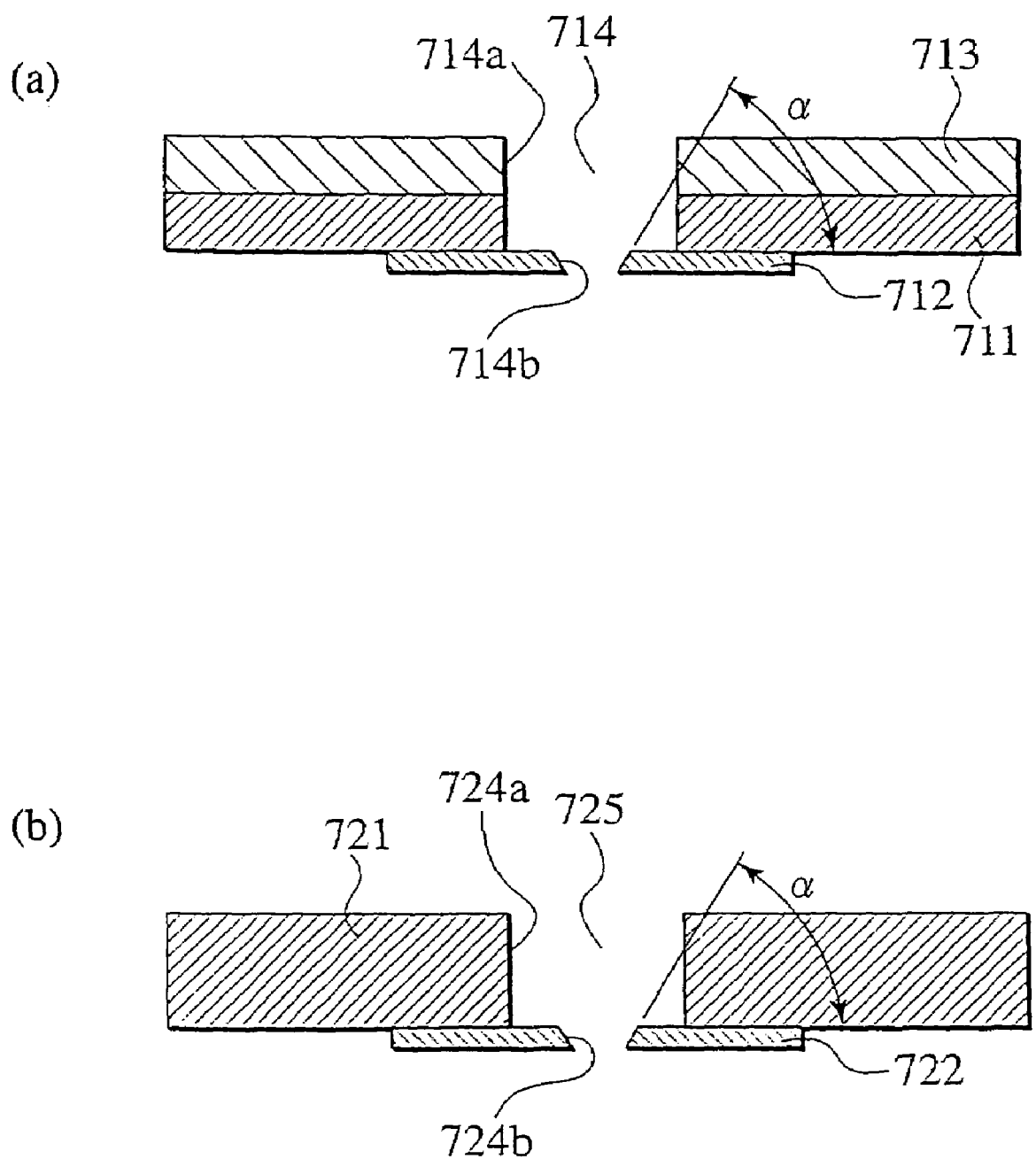
FIG. 60 is an explanatory view for explaining the angle between the surface of a conductive layer and the internal side wall of the small opening of the conductive layer in the case of the multilayer wiring board assembly component in accordance with the tenth embodiment of the present invention.

Next, the tenth embodiment of the present invention will be explained. The characteristics of the tenth embodiment reside in that the inner side wall of the hole of the conductive layer is slanted as illustrated in FIG. 60(a). Namely, the side wall of the through hole of the conductive layer portion makes an angle α with said conductive layer. The angle α is smaller than 90°. Meanwhile, the following description is basically true also in the configuration as described later where the adhesive layer was dispensed with as illustrated in FIG. 60(b).

FIG. 59(a) shows the basic configuration of a multilayer wiring board assembly component in accordance with this embodiment of the present invention.

The multilayer wiring board assembly component as illustrated in FIG. 59(a) is composed of an insulating resin layer 711 as an insulating substrate component which is provided with a conductive layer 712 of a copper foil and the like as an electrode pattern on one surface of the insulating resin layer 711 and an adhesive layer 713 for interlayer connection on the other surface respectively with a through hole 714 formed passing through the adhesive layer 713, the insulating resin layer 711 and the conductive layer 712. The through hole 714 is filled with a conductive resin composition 715 in order to form an IVH (via hole).

In the case of an FPC, the insulating resin layer 711 is composed of a flexible resin film such as a polyimide film, a polyester film or the like made of a wholly aromatic polyimide (API) and the like in order to form a triple layered structure of the insulating resin layer 711, the conductive layer 712 and the adhesive layer 713 in which a polyimide base adhesive material used as the adhesive layer 713, is attached to the surface of the polyimide member (the insulating resin layer 711) of the general purpose single sided copper plated polyimide component compared to opposite the surface contacting the copper foil (the conductive layer 712).

The through hole 714 formed through the multilayer wiring board assembly component includes a portion 714a which is opened through the adhesive layer 713 and the insulating resin layer 711 and a portion 714b which is opened through the conductive layer 712. The bore diameter of the portion 714a is a conventional via hole diameter while the bore diameter of the portion 714b is smaller than the bore diameter of the portion 714a passing through the adhesive layer 713 and the insulating resin layer 711. The peripheral surface, i.e., the inner wall surface of this hole 714b is slanted to become wider in the upward direction in the drawing, i.e., towards the insulating resin layer 711. The characteristics of the present embodiment reside in the slanted structure.

The adhesive layer 713 can be formed by not only the application of an adhesive material but also by attaching a thermoplastic polyimide film or a film which is made by giving a thermosetting property to a thermoplastic polyimide film. In the case of a thermoplastic polyimide film being used, taking into consideration the heat resistance of the substrate, it is preferred that a material having a high glass transition temperature is used. Meanwhile, the insulating resin layer 711 can be formed of not only a polyimide film but also of an insulating material such as an imide base or epoxy base prepreg. In the latter case, the insulating resin layer 711 can function as an adhesive so that it is possible to dispense with the adhesive layer 713 which otherwise has to be separately formed.

The conductive resin composition 715 is prepared by mixing a resin binder and a metal powder having electrical conductivity with a viscous agent including a solvent in the form of a paste, and used to fill the through hole 714 from the insulating resin layer 711 by squeezing to completely stop the hole.

The conductive resin composition 715 is used to make electric contact with the conductive layer 712 by means of the rare surface 712a of the conductive layer 712 rather than the outer surface of the conductive layer 712 therefore, there is no need for provision of the extended portion of the conductive resin composition 715 to extend in the outer direction.

The small hole 714b opened through the conductive layer 712 functions as an air bleeder aperture through which air bubbles are surely exhausted, when filling the hole with the conductive paste, in order to ensure a sufficient contact area between the conductive layer 712 and the conductive resin composition 715.

Figure 61:
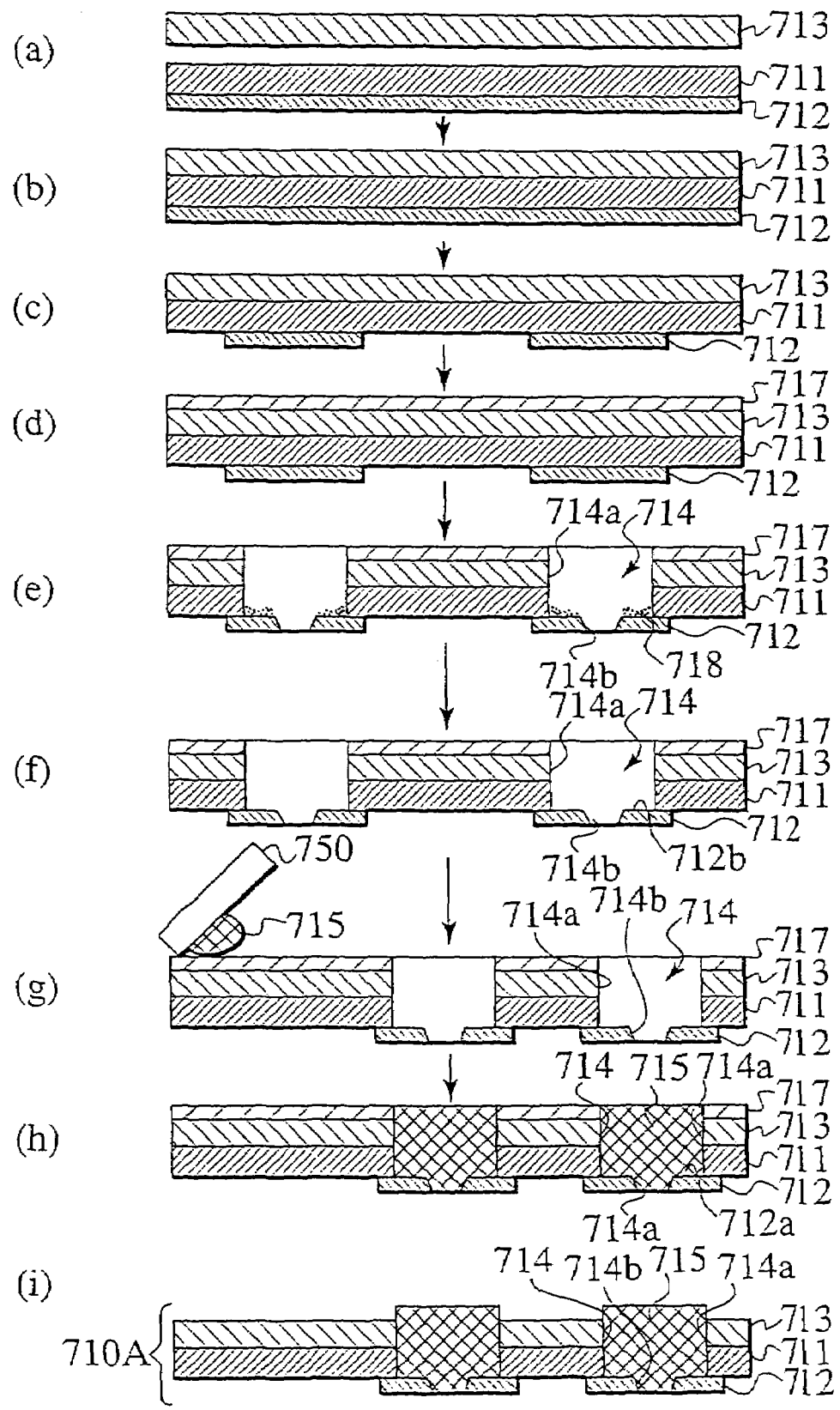
FIG. 61 is a process chart showing an embodiment of the method of manufacturing the multilayer wiring board assembly component in accordance with the tenth embodiment of the present invention.

While the conductive paste 715 is provided with no projection in the surface thereof opposite to the conductive layer 712 in the case of the multilayer wiring board assembly component as illustrated in FIG. 59, it is also possible to provide such a projection as illustrated in FIG. 61(*i*). Also, the adhesive layer 713 as illustrated in FIG. 59(*a*) is dispensed with in the case as illustrated in FIG. 59(*b*) and described below.

The characteristics of the present invention reside in the formation technique of a small hole 714b opened through this conductive layer 712. Namely, the inventor of the present invention has repeatedly conducted experiments in order to determine the structure required of the hole 714b to function as the most effective air bleeder aperture. In what follows, the characteristics thereof will be explained in detail as well as the manufacturing method thereof.

Figure 62:
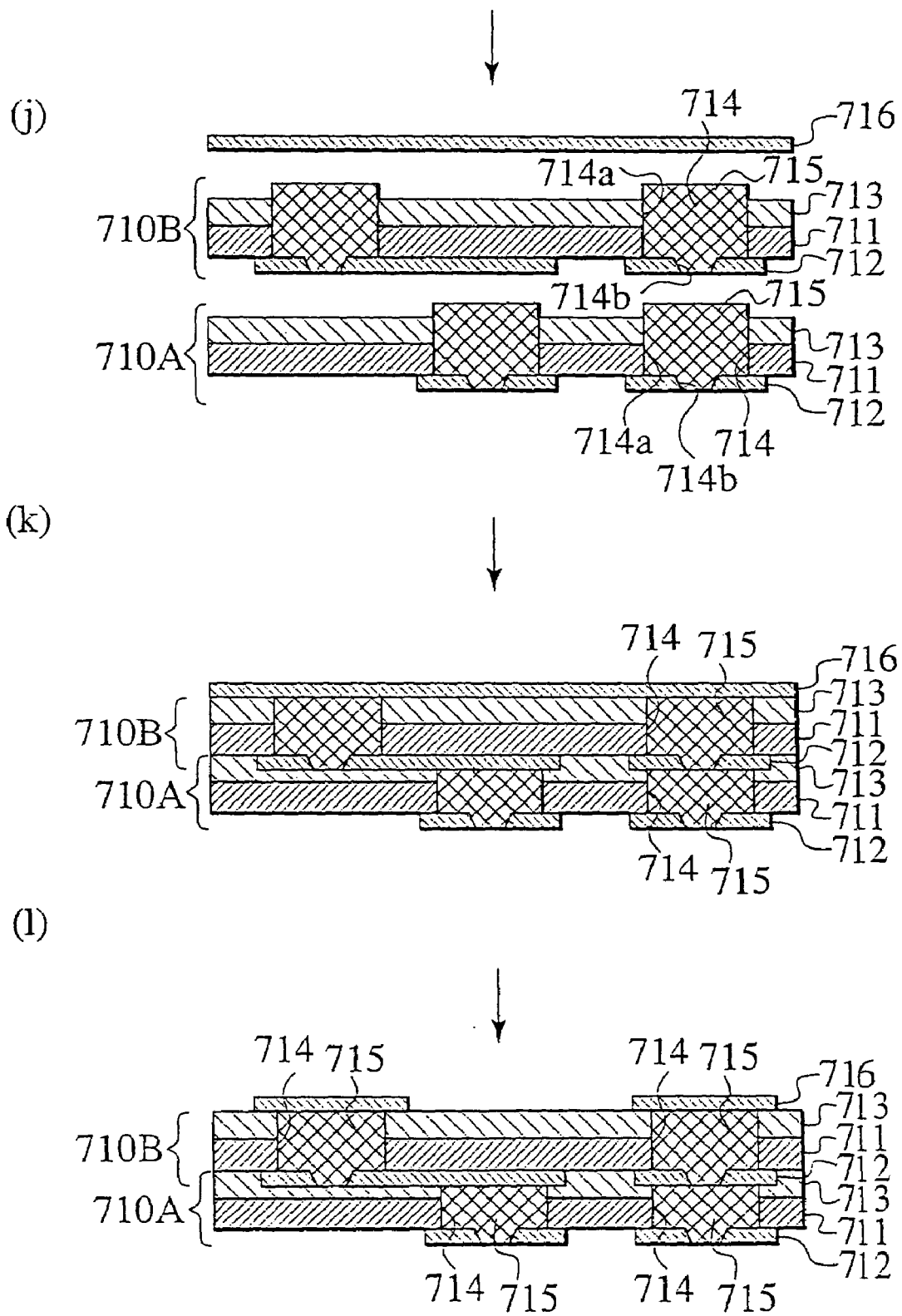
FIG. 62 is a process chart showing an embodiment of the method of manufacturing the multilayer wiring board assembly in accordance with the tenth embodiment of the present invention.

FIG. 61 and FIG. 62 are cross sectional views showing an embodiment of the method of manufacturing the multilayer wiring board assembly component as illustrated in FIG. 59(*a*) and an embodiment of the method of manufacturing the multilayer wiring board assembly making use of the multilayer wiring board assembly component. In this case, the description is made in the case where the conductive resin composition is inserted to be projected beyond the interlayer adhesive surface.

First of all, as illustrated in FIG. 61(*a*) and FIG. 61(*b*), a film made of a plastic polyimide or a thermoplastic polyimide to which a thermosetting property is given, is attached to an insulating resin layer (polyimide film) 711 provided with a conductive layer 712 of a copper foil to be an electrode pattern on the opposite surface of the insulating resin layer 711, in order to form an adhesive layer 713.

Next, as illustrated in FIG. 61(*c*), an electrode pattern (circuit pattern) of the conductive layer 712 is formed by etching the conductive layer 712.

Next, a PET masking tape 777 is put on the adhesive layer 713 as illustrated in FIG. 61(*d*), followed by opening a through hole 714 through the PET masking tape 777, the adhesive layer 713, the insulating resin layer 711 and the conductive layer 712 as illustrated in FIG. 61(*d*).

This through hole 714 comprises a portion 714a which is opened through the PET masking tape 777, the adhesive layer 713 and the insulating resin layer 711 and has a conventional via hole diameter, for example, a diameter of 100 μm, and a portion 714b which is opened through the conductive layer 712 and has a diameter smaller than the via hole diameter of the order of 10 to 50 μm. Also, the peripheral surface of this hole 714b is slanted to become wider in the upward direction in the drawing, i.e., toward the insulating resin layer 711. The characteristics of the present embodiment reside in the slanted structure.

After completion of opening the through hole 714, a desmearing process is performed to eliminate any lingering smear 718 of resins, oxides of the copper foil and so forth that were generated during the opening of the through hole. The desmearing process is performed by soft etching with a plasma or by wet etching with a permanganate chlorinate base desmearing solution agent.

After completing the desmearing process as illustrated in FIG. 61(*f*), the through hole 714 is filled with a conductive resin composition (conductive paste) 715 from the PET masking tape 777 by squeezing with a squeeze plate 750 as used in a screen printing process as illustrated in FIG. 61(*g*). FIG. 61(*h*) shows the conductive resin composition 715 with which the hole has been completely filled.

Next, the PET masking tape 777, to whose surface a residue of the conductive resin composition 715 sticks, is removed as illustrated in FIG. 61(*i*). As the first board assembly component, this multilayer wiring board assembly component 710A is thermal lamination compression bonded (laminated) to the multilayer wiring board assembly component 710B, which is also manufactured by the manufacturing method as described above and as illustrated in FIG. 61(*a*) to FIG. 61(*i*) together with a conductive layer 716 which is made of a copper foil respectively by the use of an appropriate alignment technique in order to obtain a multilayered structure as illustrated in FIG. 62(*j*) and FIG. 62(*k*).

During lamination, it is possible to improve the conformation of the adhesive layer 713 to the contour of the circuit pattern of the conductive layer 712 by performing thermal compression bonding in vacuo. Also, it is possible to make close contact between the conductive resin composition 715 and other layers by performing the lamination while the conductive resin composition 715 remains soft.

Finally, as illustrated in FIG. 62(*l*), the most outer conductive layer 716 is etched in order to form a circuit to complete the forming of a multilayer wiring board assembly.

As described above, the peripheral surface of this hole 714*b* is slanted to become wider in the upward direction in the drawing, i.e., towards the insulating resin layer 711. In other words, the bore diameter of the opening of the hole 714*b* in the side contacting with the insulating resin layer 711 is larger than the bore diameter in the opposite side. The characteristics of the present embodiment reside in the slanted structure of the inner wall surface of the hole 714*b*. The inventor of the present invention has repeated experiments with a variety of slanting angles in order to determine the angle of the slanting side wall.

Figure 63:
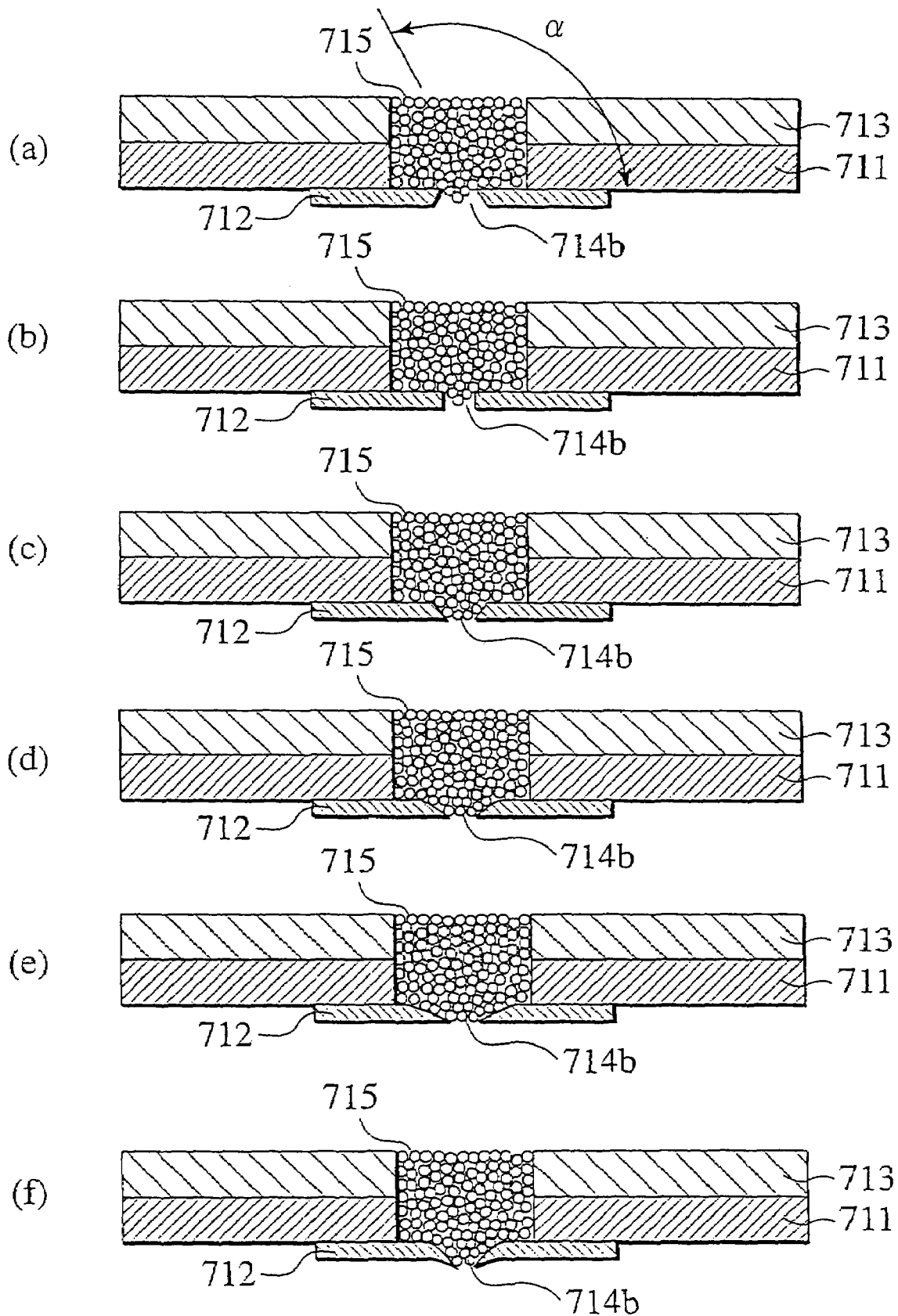
FIG. 63 is an explanatory view for explaining the experimental results which were obtained by examining the condition of the through hole filled with a conductive resin composition by screen printing while changing the angle between the surface of the conductive layer and the internal side wall of the small opening of the conductive layer in the case of the manufacturing method of the multilayer wiring board assembly component in accordance with the tenth embodiment of the present invention.

FIG. 63 is an explanatory view for explaining the experimental results which were obtained by examining the condition of the through hole filled with the conductive resin composition by screen printing while changing the angle between the inside wall of the small opening of the conductive layer and the surface of the conductive layer in the case of the manufacturing method of the multilayer wiring board assembly component in accordance with the tenth embodiment of the present invention. With reference to FIG. 63, the experiments as conducted by the inventor of the present invention will be explained. FIG. 63(*a*) is a cross sectional view showing the result of experiments for confirming the filling condition of the conductive resin composition in the case where the hole 714*b* was broader towards the bottom (in the downward direction in the figure). Namely, when the opening of the conductive layer is formed by etching from the surface, the profile as illustrated in FIG. 63(*a*) is obtained. In this case, the angle between the side wall and the surface of the conductive layer, i.e., the angle α as defined in FIG. 17 was no smaller than 90°. In this case, the hole 714*b* was hardly filled with the conductive resin composition that was injected into it. Even if some conductive resin composition was inserted into the hole 714*b*, it eventually fell out thereof.

FIG. 63(*b*) is a cross sectional view showing the result of experiments for confirming the filling condition of the conductive resin composition in the case where the hole 714*b* was opened with a side wall being normal to the conductive layer. In this case, it may be possible to insert the conductive resin composition into the hole and prevent the conductive resin composition from falling out thereof by adequately selecting the components of the conductive resin composition and the condition under which the hole is filled with the conductive resin composition. However, when these requirements were relaxed, there were problems encountered depending upon the property of the conductive resin composition and the thickness of the conductive layer. Namely, the hole 714*b* was hardly filled with the conductive resin composition when the conductive layer had a large thickness to increase the aspect ratio of the hole or when the conductive resin composition had a high coefficient of viscosity during filling. In other words, the flexibility of selecting the components of the conductive resin composition and the thickness of the conductive layer was restricted.

FIG. 63(*c*) is a cross sectional view showing the result of experiments for confirming the filling condition of the conductive resin composition in the case where the hole 714*b* is inwardly broader (in the upward direction in the figure). By this configuration, the conductive resin composition could be smoothly inserted to the hole and hardly fall out irrespective of the components of the conductive resin composition and the thickness of the conductive layer. This advantage of the slanting side wall of the hole 714*b* appeared when the side wall was slanted at an angle of 5° or more from the upright position, i.e., when the angle α is no larger than 85°.

FIG. 63(*d*) is a cross sectional view showing the result of experiments for confirming the filling condition of the conductive resin composition in the case where, while the hole 714*b* is also inwardly broader (in the upward direction in the figure), the angle stepwise changes. Also, FIG. 63(*e*) is a cross sectional view showing the result of experiments for confirming the filling condition of the conductive resin composition in the case where, while the hole 714*b* is also inwardly broader (in the upward direction in the figure), the inner side wall is rounded. In both cases, the hole can be safely filled with the conductive resin composition as long as part of the side wall is broader from the surface to the hole 714*b* in order that α>85°. Particularly, it is possible to firmly fill the hole 714*b* with the conductive resin composition in the case where 45°<α<60°.

FIG. 63(*f*) is a cross sectional view showing the result of experiments for confirming the filling condition of the conductive resin composition in the case where, while the hole 714*b* is also inwardly broader (in the upward direction in the figure), the angle α is furthermore decreased. In this case, while the edge of the opening becomes sharp, the thickness of the conductive layer is extremely small so that the conductive layer is deformed at the edge of the opening by the pressure of the conductive resin composition as inserted. After repeating the experiment with a variety of angles, it was discovered that an angle of 15° is the limit to maintain the flatness of the assembly component.

Figure 64:
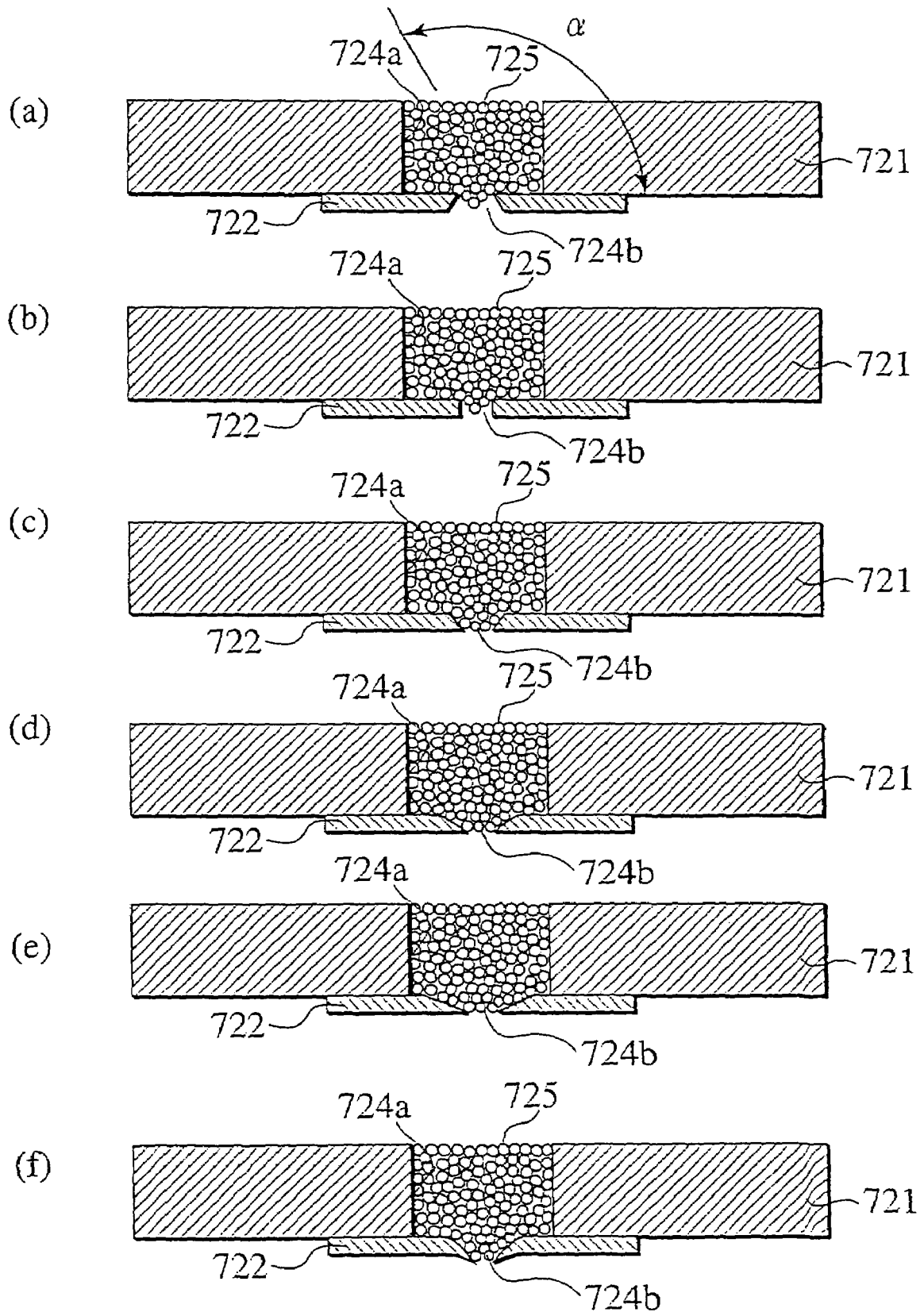
FIG. 64 is an explanatory view for explaining the experimental results which were obtained by examining the condition of the through hole filled with the conductive resin composition by screen printing while changing the angle between the surface of the conductive layer and the internal side wall of the small opening of the conductive layer in the case of the manufacturing method of the multilayer wiring board assembly component in accordance with the tenth embodiment of the present invention.

Determined by the experiments as described above is the requirement for surely discharging air bubbles through the small opening 714*b* of the copper foil member (the conductive layer 712) during squeezing in order to prevent the air bubbles from lingering inside of the through hole 714 therefore, close contact between the copper foil member (the conductive layer 712) and the conductive resin composition 715 can be surely established by the rare surface 712*a* of the conductive layer 712 without any leakage of the conductive resin composition from the opening of the hole 714*b*. As a result, it is confirmed that a through hole can be certainly filled with a conductive resin composition by selecting the angle α of the side wall relative to the surface of the conductive layer as 15°<α<85°, preferably 5°<α<60°, irrespective of the components of the conductive resin composition and the condition under which the hole is filled with the conductive resin composition. By this configuration, it is possible to increase the flexibility of designing the manufacturing method. While this experiment was repeated also in the case where the adhesive layer was dispensed with as described below and illustrated in FIG. 64, similar results were obtained. FIG. 68(d) is a schematic diagram showing the conclusion of these experimental results.

Namely, in the case of the multilayer wiring board assembly component in accordance with the present invention, the adhesive layer 713 can be dispensed with as illustrated in FIG. 59(b). The multilayer wiring board assembly component as illustrated in FIG. 59(b) is composed of an insulating resin layer 721 as an insulating substrate component which has adhesivity for interlayer connection and is provided with a conductive layer 722 of a copper foil and the like as an electrode pattern on one surface of the insulating resin layer 711 with a through hole 724 formed passing through the insulating resin layer 721 and the conductive layer 722. The through hole 724 is filled with the conductive resin composition 725 in order to form an IVH (via hole).

In the case of an FPC, the insulating resin layer 721 having adhesivity is formed of a thermoplastic polyimide (TPI) or a thermoplastic polyimide to which a thermosetting property is given. In the case of the use of a thermoplastic polyimide film, taking into consideration the heat resistance of the substrate, it is preferred to use a material having a high glass transition temperature.

The through hole 724 includes a portion 724a which is opened through the insulating resin layer 721 and a portion 724c which is opened through the conductive layer 722. The bore diameter of the portion 724b is a conventional via hole diameter while the bore diameter of the portion 724b is smaller than the bore diameter of the portion 724a passing through the insulating resin layer 721.

The conductive resin composition 725 is prepared by mixing a resin binder and a metal powder having electrical conductivity with a viscous agent including a solvent in the form of a paste, and used to fill the through hole 724 from the insulating resin layer 721 by squeezing to completely stop the hole.

The conductive resin composition 725 is used to make electric contact with the conductive layer 722 by means of the rare surface 722a of the conductive layer 722 rather than the outer surface of the conductive layer 722 therefore, there is no need for provision of the extended portion of the conductive resin composition 725 to extend in the outer direction.

The small hole 724b opened through the conductive layer 722 functions as an air bleeder aperture through which air bubbles are surely exhausted, when filling the hole with the conductive paste, in order to ensure a sufficient contact area between the conductive layer 722 and the conductive resin composition 725. The selection of the center position of this hole 714b is determined in the same manner as described with reference to FIG. 59(a).

While a laser light processing technique or an etching technique can be used for the purpose of forming through holes having the above described profile, i.e., the hole (e.g., 724a) opened through the insulating resin layer and the small opening (e.g., 724b) opened through the conductive layer, it is important for either case to process the copper foil from the bottom surface of the insulating resin layer (i.e., from above in the figure). In the case of the laser light processing technique, after removing the insulating resin layer located over the small opening (e.g., 724b), the process is performed while sublimating (ablating) or partially melting copper by laser irradiation through the insulating resin layer. On the other hand, in the case of the etching technique, after opening a hole through the insulating resin layer to expose the copper foil at the bottom and coating the copper foil with a resist except for an opening as desired, an etchant including ferric chloride and hydrochloric acid is used as an etchant in which the copper foil member is dipped to melt the copper and form the opening.

Figure 66:
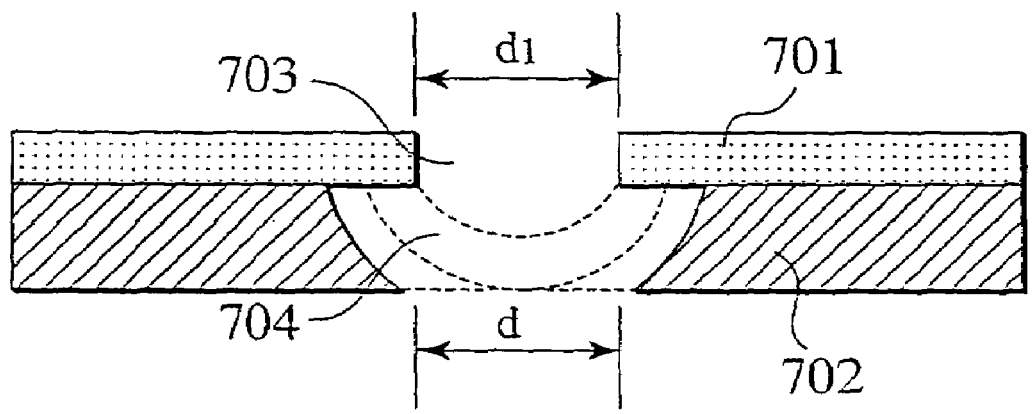
FIG. 66 is an explanatory view for explaining the control of the profile of the wall of a hole by changing the over etching amount and the etching time in the case where the conductive layer is processed by etching.

FIG. 65 is an explanatory view for explaining a small opening which is formed through the conductive layer by a laser boring process with it's profile which is controlled by changing the strength or the scanning pattern of the laser beam. In the case of the laser boring process as illustrated in FIG. 65, it is possible to arbitrarily control the profile of the small opening by changing the strength or the scanning pattern of the laser beam in order so that the opening area gradually decreases from the bottom of the hole. On the other hand, in the case of an etching technique, as illustrated in FIG. 66, it is possible to control the profile of the wall of the hole by changing the over etching amount and the etching time. FIG. 66 is an explanatory view for explaining the control of the profile of the wall of the hole by changing the over etching amount and the etching time in the case where the conductive layer is processed by etching. In the case as illustrated in FIG. 66 where the diameter of the opening "d" of the conductive layer 702 is equal to the bore diameter d1 of the opening 703 of the resist 701, the opening 703 is substantially tapered due to undercutting near the resist when the desired diameter is achieved.

Figure 67:
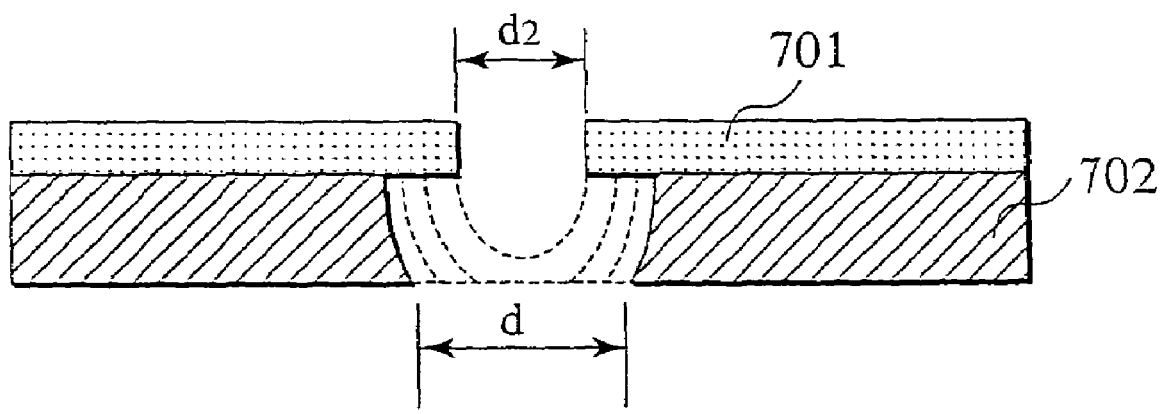
FIG. 67 is also an explanatory view for explaining the control of the profile of the wall of a hole by changing the over etching amount and the etching time in the case where the conductive layer is processed by etching.

On the other hand, FIG. 67 is also an explanatory view for explaining the control of the profile of the wall of the hole by changing the over etching amount and the etching time in the case where the conductive layer is processed by etching. In this case, an opening is formed through the copper foil with a diameter larger than that of the resist by decreasing the diameter d2 of the opening of the resist while increasing the etching time. Since the etching uniformly progresses in the thickness direction due to over etching, the side wall of the opening is formed to be approximately normal to the copper foil.

In the respective embodiments as described above, the description is made on the assumption that the via holes and the small openings of the conductive layer are substantially circular (holes which are symmetrical about their axes). However, even if they are not perfectly circular, the present invention is applicable, as long as the distances between the centroid and the respective points on the perimeter are dispersed within ±30%, by the use of the average value thereof as the radius.

The manufacturing steps of the multilayer wiring board assembly component as described above and the manufacturing steps of the multilayer wiring board assembly by making use of the multilayer wiring board assembly component are applicable in the same manner to the centroid steps of the multilayer wiring board assembly component as illustrated in FIG. 59(b) and the manufacturing steps of the multilayer wiring board assembly by making use of the multilayer wiring board assembly component.

The multilayer wiring board assembly, the multilayer wiring board assembly component and the manufacturing method thereof in accordance with the present invention is not limited to the application to flexible printed circuit boards making use of a polyimide film, but also applicable to a flexible printed circuit board making use of a polyester film, or a rigid type making use of, as an insulating material, an epoxy resin, a woven glass fabric, the aramid nonwoven cloth and the like in the same manner.

As understood from the above explanation, in the case of the multilayer wiring board assembly, the multilayer wiring board assembly component and the manufacturing method thereof in accordance with the embodiments of the present invention, the electrical connection between a conductive layer and a conductive resin composition is made by the use of the differential bore diameter of a through hole between the insulating substrate component and the conductive layer portion thereof, therefore, it is possible to solve the respective problems originating from the requirement of securing the contact area between the conductive layer and the portion of the conductive resin composition located above the conductive layer, and to obtain a thin multilayer wiring board assembly from a general purpose copper plated resin component as a starting item without compromising the electrical connection reliability between the conductive resin composition and the conductive circuit portion and without compromising the smoothness of the substrate. In addition to this, there is another advantage in that the flexibility of designing a manufacturing process is increased.

Next, an embodiment of the printed circuit board having the configuration which is suitable for mounting electric elements will be explained. In what follows, this embodiment will be explained in detail with reference to the accompanied drawings.

Figure 69:
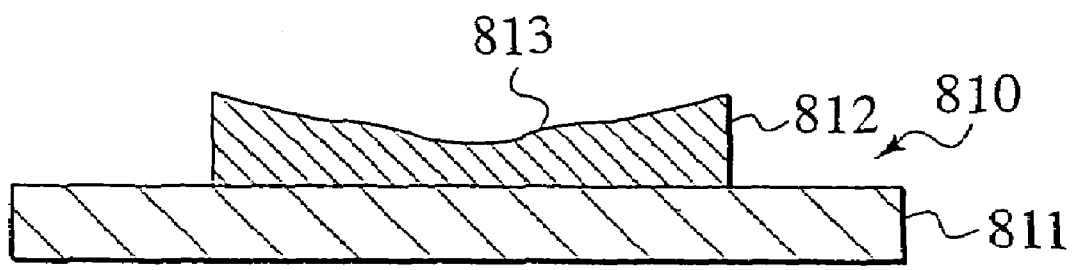
FIG. 69 is a schematic diagram showing a basic embodiment of the printed circuit board in accordance with the present invention.

FIG. 69 is a schematic diagram showing a basic embodiment of the printed circuit board in accordance with the present invention. This printed circuit board 810 is composed of an insulating substrate component 811 on which is formed a conductive layer made of a copper foil or the like as a substrate electrode 812 having an upper surface (the surface of a conductive layer land portion) which is a concave surface 813 in a mortar-like form. This concave surface 813 can be formed by isotropic etching.

Figure 70:
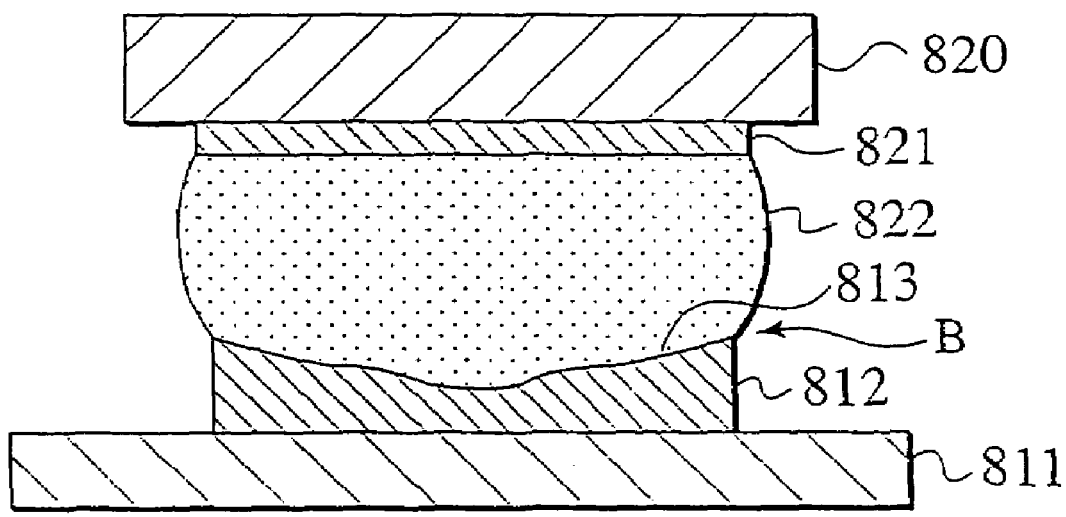
FIG. 70 is a schematic diagram showing an example of mounting a flip chip on the printed circuit board.

FIG. 70 is a schematic diagram showing an example of mounting a flip chip on the printed circuit board 810. An electronic chip element 820 is provided with a chip electrode 821 on the bottom surface to be located opposite the substrate 810.

The electronic chip element 820 is mounted on the substrate 810 with the chip electrode 821 opposing the substrate electrode 812 with a solder bump 822 intervening therebetween.

The solder bump 822 is melted by heating, melt bonded to the chip electrode 821 on one side and melt bonded to the substrate electrode 812 on the other side in order to conform to the concave surface 813 as illustrated in FIG. 70.

By this configuration, the deformation of the locally deformed portion B in the boundary surface between the solder bump 822 and the substrate electrode 812 is alleviated as compared with that in accordance with the prior art technique therefore, stress is prevented from being concentrated in the locally deformed portion B so to improve the connection reliability between the chip 820 and the substrate 810.

The BLR (Board Level Reliability) test has been conducted for evaluating the reliability of implementation by repeatedly applying a thermal shock to the substrate electrode 812 having an upper surface as the concave surface 813 on which a chip is mounted as illustrated in FIG. 70. As a result, the durability to the test was significantly improved compared with the structure as illustrated in FIG. 76.

In the case of a gold bump, a self alignment effect appears while the bump is aligned with the location by means of the concave surface 813 of the substrate electrode 812.

Figure 71:
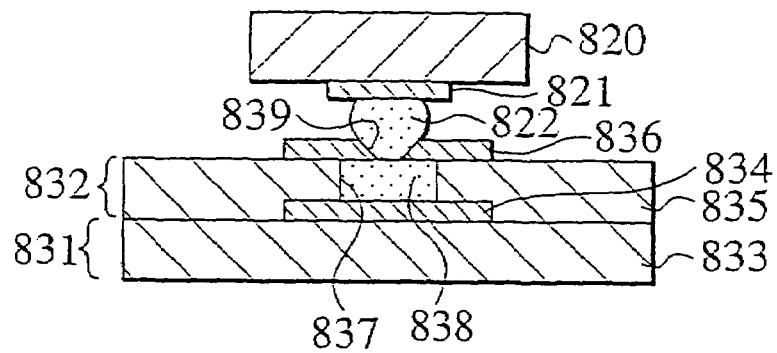
FIG. 71 is a schematic diagram showing another embodiment of the printed circuit board and a flip chip mounted on the printed circuit board in accordance with another embodiment of the present invention.

FIG. 71 is a schematic diagram showing an embodiment of the printed circuit board in accordance with the present invention applied to a multilayer substrate in which interlayer interconnection is achieved by the use of a conductive paste. The multilayer substrate is composed of a substrate 831 and a substrate 832 as laminated together. The substrate 831 comprises an insulating substrate component 833 provided with a conductive layer 834 made of a copper foil or the like while the substrate 832 as the outermost layer (uppermost layer) comprises an insulating substrate component 835 provided with a conductive layer (substrate electrode) 836 made of a copper foil or the like.

The conductive layer 834 and the substrate electrode 836 are electrically connected with each other by means of a conductive paste 838 filling a via hole 837 formed through the insulating substrate component 833. The conductive paste 838 as used may be prepared with a thermosetting resin with which a conductive filler of a silver powder or the like is mixed.

Figure 72:
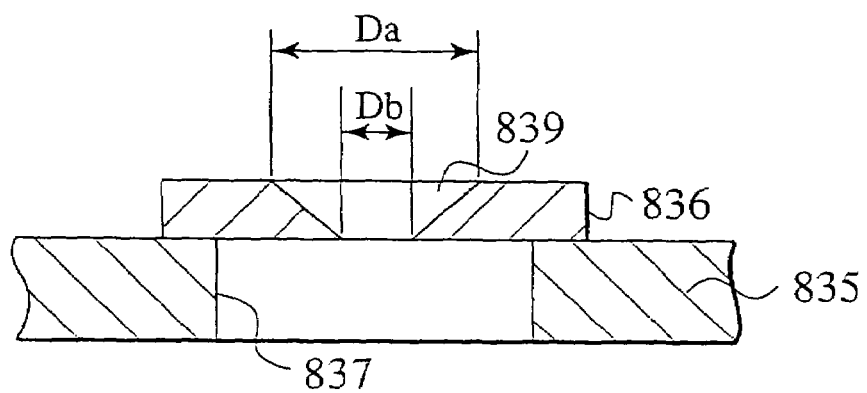
FIG. 72 is an expanded cross sectional view showing the major portion of the other embodiment of the printed circuit board in accordance with the present invention.

The substrate electrode 836 aligned with the via hole 837 is formed with a small opening 839 opened therethrough and functioning as an air ventilation hole during filling of the via hole 837 with the conductive paste. This small opening 839 is formed by isotropic etching from the external surface of the substrate electrode 836 (the upper surface as viewed in FIG. 71) and tapered so that the bore diameter Da near the surface of the substrate electrode 836 is larger than the bore diameter Db near the via hole 837 as illustrated in FIG. 72.

By this configuration, the upper surface of the substrate electrode 836 has a tapered concave surface so that the solder bump 822 for mounting a flip chip flows into the small opening 839 in tapered form when melted by heating and is melt bonded to the small opening 839 while conforming to the tapered internal peripheral surface thereof, therefore, the connection reliability between the chip 820 and the multilayer wiring board assembly is improved in the same manner as in the embodiments as described above.

Figure 73:
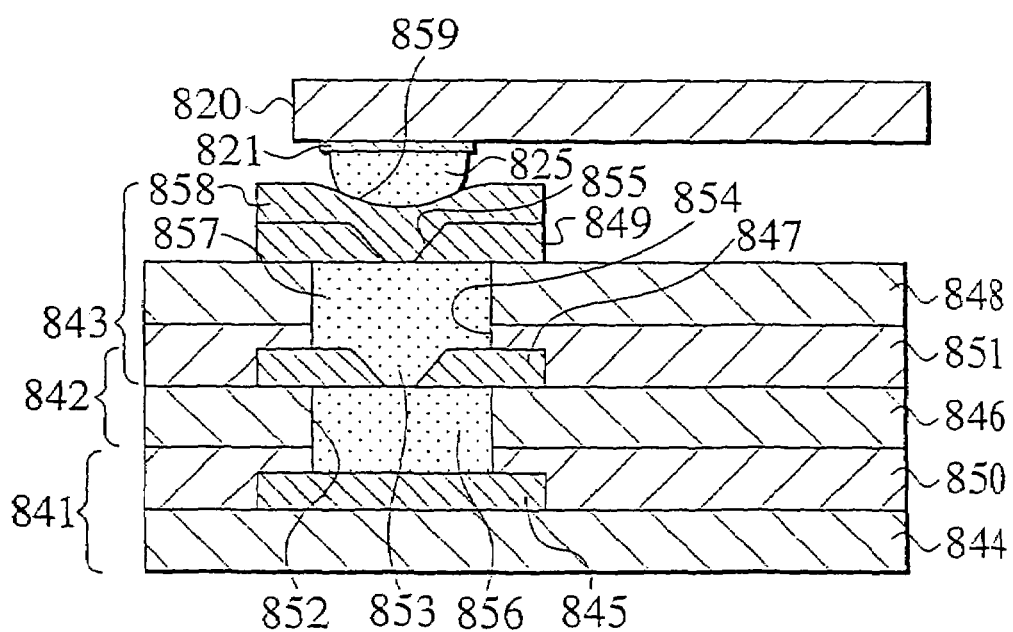
FIG. 73 is a schematic diagram showing a further embodiment of the printed circuit board and a flip chip mounted on the printed circuit board in accordance with the present invention.

FIG. 73 is a schematic diagram showing an embodiment of the printed circuit board in accordance with the present invention applied to a flexible multilayer substrate in which interlayer interconnection is achieved by the use of a conductive paste.

This flexible multilayer substrate is composed of three substrates 841, 842 and 843 laminated in a triple layered structure. The substrate 841 as the first layer (the lowermost layer) comprises a polyimide film 844 as an insulating resin layer provided with a land electrode (inner copper foil) 845 made of a copper foil; the substrate 842 as the second layer (the middle layer) comprises a polyimide film 846 as an insulating resin layer provided with a land electrode (inner copper foil) 847 made of a copper foil; and the substrate 843 as the third layer (the uppermost layer) comprises a polyimide film 848 as an insulating resin layer provided with a land electrode (inner copper foil) 849 made of a copper foil. These substrates are adhesively joined to each other by means of adhesive layers 850 and 851.

The substrate 842 is provided with a via hole 852 through the polyimide film 846 and the adhesive layer 850 and with a small opening 853 through the land electrode 847 in a location aligned with the via hole. Also, the substrate 843 is provided with a via hole 854 through the polyimide film 848 and the adhesive layer 851 and with a small opening 855 through the land electrode 849 in a location aligned with the via hole.

The small openings 853 and 855 in the surfaces of the corresponding land electrodes (upper sides) are tapered and have bore diameters larger than the bore diameters of the via holes respectively.

The via hole 852 or 854 is filled with a conductive paste 856 or 857 through the adhesive layer 850 or 851 by squeezing or the like respectively. The conductive paste 856 serves to establish interlayer interconnection between the first layer and the second layer while the conductive paste 857 serves to establish interlayer interconnection between the second layer and the third layer. The small opening 853 of the internal copper foil (the land electrode 847) accepts the conductive paste 857 of the substrate, just above it due to pressure during the multilayering process therefore, the conductivity and resistance to shearing stress can be improved.

A copper plating layer 858 is formed on the upper surface of the land electrode (the substrate electrode) 849 of the uppermost substrate 843 by electrolytic plating to fill the small opening 855. In the case of the electrolytic plating, the growing speed of the plating is low in the portion where the resistivity is high while the growing speed of the plating is high in the portion where the resistivity is low. When the electrolytic plating is conducted on the upper surface of the land electrode (the substrate electrode) 849, a concave surface 859 is formed on the copper plating layer 858 in the ordinary course of events because the conductive paste 857 as exposed in the small opening 855, has a resistivity that is higher than that of the land electrode 849 of the copper foil.

The chip electrode 821 of the chip 820 to be mounted on the uppermost substrate 843 is provided with a gold bump 825 and is located opposing the concave surface 859 of the copper plating layer 858 with the gold bump 825 intervening therebetween. The concave surface 859 serves to accept the gold bump 825.

By this configuration, even in the case where connection is made by a bump such as the gold bump 825 which is not melted, it is possible to obtain a self alignment effect as automatic alignment occurs between the chip 820 and the substrate 843 therefore, avoiding misalignment between the chip 820 and the substrate 843 after completing the formation.

In the case where connection is made by a solder bump, the solder bump is melted and bonded to the copper plating layer 858 in the form conforming to the concave surface 859 of the copper plating layer 858 therefore, deformation of the locally deformed portion in the boundary surface between the solder bump and the substrate electrode is alleviated compared with that in accordance with the prior art technique. Accordingly, the concentration of stress to the locally deformed portion is alleviated to improve the connection reliability between the chip and the substrate. Furthermore, the solder bump does not contact with the conductive paste 857 filling the via hole 854 but contacts only with the copper plating layer 858 therefore, the solder wetting becomes uniform and is improved.

The copper plating layer 858 may be formed not only by electrolytic plating but also by electroless plating or formed as a metallic layer by sputtering.

Next, with the manufacturing method of manufacturing the flexible multilayer substrate illustrated in FIG. 73 as a representative method, a manufacturing method of manufacturing a printed circuit board for mounting a flip chip will be explained with reference to FIG. 74(*a*) to FIG. 74(*j*).

Figure 74:
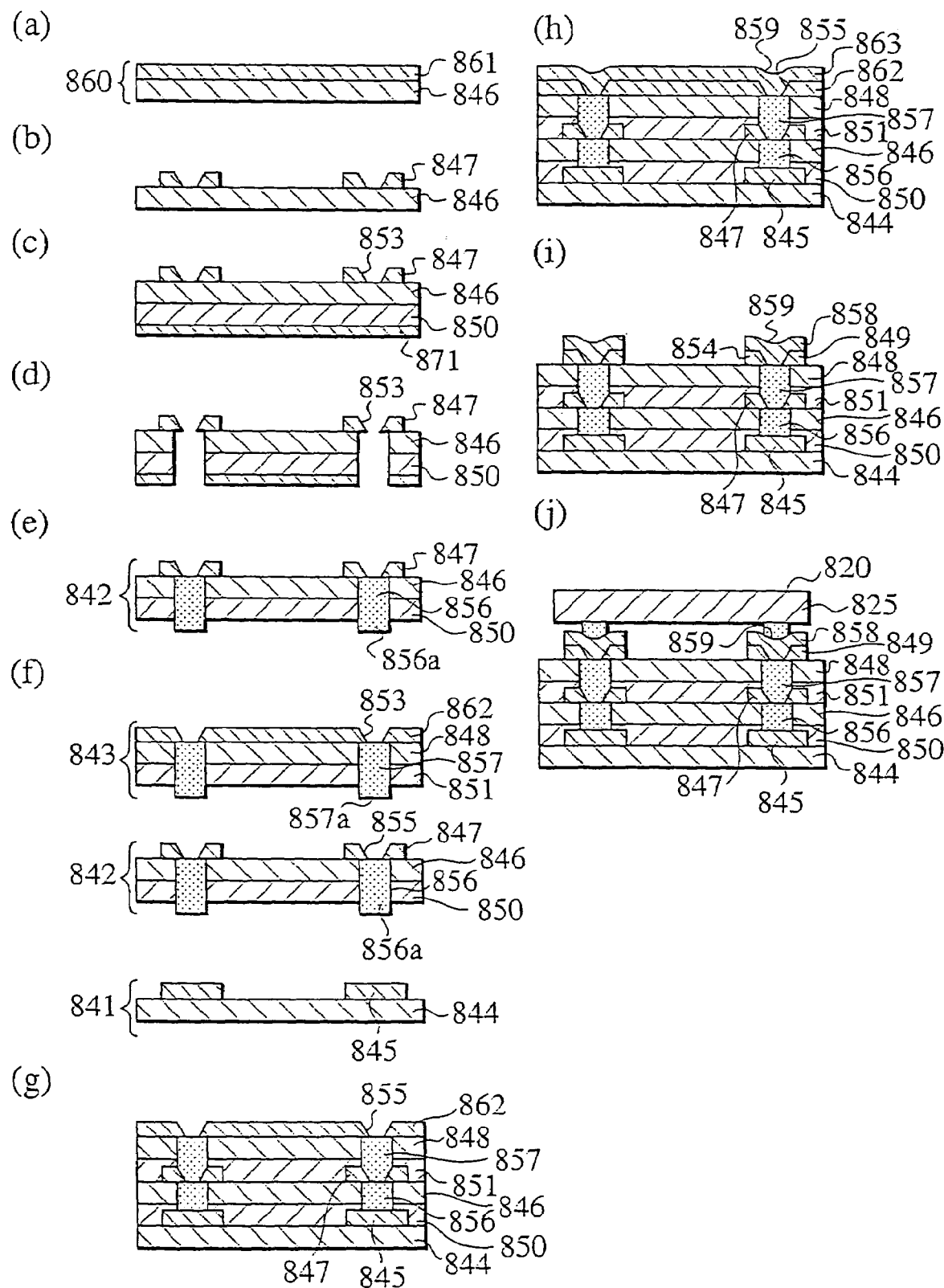
FIG. 74 is a process chart showing the manufacturing process of a printed circuit board in accordance with the present invention and the mounting of a flip chip.

FIG. 74 is a process chart showing the manufacturing process of a printed circuit board in accordance with the present invention and the mounting of a flip chip. As illustrated in FIG. 74(*a*), a copper clad polyimide laminate component (CCL) is used as a starting item and composed of a copper foil 861 formed on one side of a polyimide film 846. A resist for etching is formed on this structure by a photolithography technique followed by forming a circuit (i.e., the formation of a land electrode 847 and the like) and a small opening 853 by chemical etching through the copper foil 861 in the same step.

While the thickness of the copper foil 861 is 18 µm, the small opening 853 is tapered by etching to have an upper opening diameter of about 40 µm and a lower diameter of about 25 µm. Since the profile of the small opening 853 is circular, the wrap-around of the etchant is not good inside of the small opening 853 compared with the etchant near the perimeter (outside of the small opening 853) so an enhanced tapered structure can be formed.

The etchant is prepared as a ferric chloride base water solution. This etchant can be replaced by a water solution of copper chloride, an alkali etchant or the like. The profile of the small opening 853 is changed depending on the kind of etchant and the condition for etching therefore, it is necessary to design the exposure mask for the small opening 853 in accordance with these conditions.

Next, as illustrated in FIG. 74(*c*), an adhesive layer 850 is formed on the polyimide film 846 by a thermoplastic polyimide or a thermoplastic polyimide with a thermosetting property, followed by forming a PET masking tape 871 on the external surface of the adhesive layer 850.

Next, the masking tape 871 is exposed to a laser beam to form a via hole 852 as illustrated in FIG. 74(*d*). The laser light that is used is the third harmonic of a UV:YAG laser (wavelength: 855 nm). Taking into consideration that the copper foil is not processed, it is understood that the via hole can be formed by an excimer laser or a carbon dioxide laser.

Next, a conductive paste 856 is inserted to the via hole 852 through the masking tape 871 by a printing technique followed by removing the masking tape 871 as illustrated in FIG. 74(*e*). An Ag/epoxy resin base filler paste is used as the conductive paste 856. The conductive paste 856 used here may be made of any other conductive paste such as a Cu paste, a carbon paste and so forth in place of such an Ag/epoxy resin base filler paste.

By removing the masking tape 871, a projection 856*a* of the conductive paste 856 is formed beyond the adhesive layer 850 as illustrated in FIG. 74(*e*). The projection 856*a* serves to improve the interlayer interconnection reliability.

As a result, the substrate 842 as the second layer (the middle layer) is completed. On the other hand, as illustrated in FIG. 74(*f*), with a copper clad polyimide laminate component (CCL) equivalent to that used as a starting item of the substrate 842, the substrate 843 as the third layer (the upper layer) is manufactured by the same process as that used for manufacturing the substrate 842 except that the copper foil 862 is formed with the small opening 855 by chemical etching without forming a circuit. Also, with a copper clad polyimide laminate component (CCL) equivalent to that used as a starting item of the substrate 842, the substrate 843 as the first layer (the lower layer) is manufactured by the same process as that used for manufacturing the substrate 842 except that a circuit pattern (the land electrode 845 and the like) is formed of the copper foil 862 by chemical etching without forming the small opening 855.

The substrate 841 as the first layer (the lowermost layer), the substrate 842 as the second layer (the middle layer) and the substrate 843 as the third layer (the uppermost layer) are laminated in this order, aligned with each other, and interlayer bonded to each other by thermal compression with the adhesive layers 850 and 851 in order to form a triple layered substrate as illustrated in FIG. 74(*g*).

Next, with the surface copper foil (the copper foil 862) of this triple layered substrate as an electrode, a copper plating layer 863 is formed on the copper foil 862 by electrolytic plating as illustrated in FIG. 74(*h*). The thickness of the copper plating layer 863 is 5 µm in ordinal flat surfaces (other than the location of the small opening 855). The bottom of the small opening 855 is composed of the conductive paste 857 whose resistivity is higher than that of the copper foil, while the small opening 855 is etching tapered in the form of a mortar with a larger diameter at the upper opening and a smaller diameter at the lower bottom therefore, a concave surface 859 just above the small opening 855 is formed even though the surface is somewhat flattened by electrolytic plating.

Next, the double layer of the surface copper foil (the copper foil 862) and the copper plating layer 863 of the triple layered substrate is processed by chemical etching in order to form a circuit pattern and thereby form the land electrode (the substrate electrode) 849 in a location aligned with the via hole 854 to complete the manufacturing of the triple layered substrate.

When a chip 820 provided with a gold bump 825 was mounted on this triple layered substrate as illustrated in FIG. 74(j), and the triple layered substrate was vertically swayed, as a result, the gold bump 825 was placed in the concave surface 859 and located just above the concave surface 859 to perform a self alignment effect.

Meanwhile, one of the characteristics of the present invention resides in a printed circuit board provided with a substrate electrode having a surface in a concave form in which the surface in a concave form is connected to a bump which is made of gold.

Also, another one of the characteristics of the present invention resides in a printed circuit board for use in a multilayer substrate with interlayer interconnection by means of a conductive paste filling via holes in which a substrate electrode is provided with a small opening therethrough which is a tapered hole having a larger diameter near the surface of the electrode than that near the via hole while the surface of said substrate electrode is coated with a metallic layer which is an electrolytic plating layer having a concave surface corresponding to the small opening.

Furthermore, another one of the characteristics of the present invention resides in the manufacturing method of a printed circuit board including a step of forming a substrate electrode by chemical etching to make the surface profile thereof concave.

Still further, one of the characteristics of the present invention resides in the manufacturing method of manufacturing a printed circuit board for use in a multilayer substrate with interlayer interconnection by means of a conductive paste filling via holes including a step of forming a substrate electrode in a location aligned with the via hole; a step of opening a small opening in said substrate electrode by chemical etching in order so that said small opening is a tapered hole having a larger diameter at the surface of said substrate electrode than a diameter at said via hole; and a step of covering the surface of said substrate electrode with a metallic layer in order to make said metallic layer have a concave surface corresponding to the small opening, wherein said metallic layer is formed by any of electrolytic plating, electroless plating, sputtering or the like; wherein the step of covering the surface of a conductive layer functioning as a substrate electrode with a metallic layer is performed in advance of the substrate electrode formation step, which is thereafter performed by patterning the substrate electrode on the double layer of the conductive layer and the metallic layer; and wherein the substrate electrode is formed in a circuit formation step by chemical etching.

As understood from the above explanation, in the case of the embodiment of the printed circuit board having the configuration which is suitable for mounting electric elements in accordance with the present invention, the surface profile of a substrate electrode is made concave in a mortar form or the like and therefore, when a solder bump is used, the solder bump is melt bonded to the substrate electrode while conforming to the concave surface thereof to alleviate the deformation of and the stress concentration to the locally deformed portion in the boundary surface between the solder bump and the substrate electrode so that the reliability of interlayer interconnection is improved. Also, in the case where a gold bump is used, a self alignment effect appears while the bump is aligned with the concave surface of the substrate electrode.

PRACTICAL INDUSTRIAL APPLICABILITY

As explained above, in accordance with the present invention, the electrical connection between a conductive layer and a conductive resin composition is made by the use of the differential bore diameter of a through hole between the insulating substrate component and the conductive layer portion thereof, therefore, it is possible to solve the respective problems originating from the requirement of securing the contact area between the conductive layer and the portion of the conductive resin composition located above the conductive layer, and to obtain a thin multilayer wiring board assembly from a general purpose copper plated resin component as a starting item without compromising the electrical connection reliability between the conductive resin composition and the conductive circuit portion and without compromising the smoothness of the substrate.

Also, since the conductive resin composition is inserted not only to the insulating substrate component portion and the adhesive layer portion (the via hole) of the through hole but also to the conductive layer portion thereof to fill it therewith, no air hole is formed after lamination therefore, film peeling or separation does not occur even if a reliability test is carried out by exposing the multilayer wiring board assembly to a high temperature. In addition to this, it is possible to increase the contact area between the conductive layer and the conductive paste filling the via hole by the area of the inner peripheral wall of the conductive layer portion.

Also, since the insulating substrate component portion of the through hole has a curved inner wall surface as seen in a vertical cross sectional view, the rare surface of the conductive layer and the inner wall surface of the through hole are continuously connected to each other without forming a rectilinear locally deformed portion, while the air release from the through hole is sufficiently performed during filling of the through hole with the conductive resin composition so that no air bubble remains within the conductive resin composition filling the throughhole, and therefore the electrical connection between the conductive layer and the conductive resin composition filling the via hole becomes highly reliable and stable.

Furthermore, since the electrical connection between the conductive layer and the conductive resin composition filling the through hole is made by the rare surface of the conductive layer with the horizontal cross sectional area of the conductive layer through hole being smaller than the horizontal cross sectional area of the insulating layer through hole while the total area of the inner side wall of the conductive layer through hole is greater than the horizontal cross sectional area of that conductive layer through hole, the electrical contact area between the conductive layer and the conductive resin composition is increased while the contact electric resistance between the conductive layer and the conductive resin composition is decreased.

Still further, since the metallic layer is formed on the conductive layer in order to cover the conductive resin composition exposed to the opening end at the conductive layer with the metallic layer so that the entire surface of the conductive layer is made a uniform metallic surface by the metallic layer, it is possible to avoid deterioration of solder wetting due to the resin component of the conductive paste and the problems encountered during mounting of electric components on the surface of the conductive layer.

In addition to this, with respect to the formation of the above described through hole, there is another advantage in that the flexibility of designing a manufacturing process is increased.

Furthermore, in accordance with the printed circuit board having the configuration which is suitable for mounting electric elements in accordance with the present invention, the surface profile of a substrate electrode is made concave in a mortar form or the like and therefore, when a solder bump is used, the solder bump is melt bonded to the substrate electrode while conforming to the concave surface thereof to alleviate the deformation of and the stress concentration to the locally deformed portion in the boundary surface between the solder bump and the substrate electrode so that the reliability of interlayer interconnection is improved. Still further, in the case where a gold bump is used, a self alignment effect appears while the bump is aligned with the concave surface of the substrate electrode.

What is claimed is:

1. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection,
wherein said through hole has a bore diameter at said conductive layer which is smaller than a bore diameter at said insulating substrate component, and wherein both the portion of said through hole passing through said insulating substrate component and the portion of said through hole passing through said conductive layer are filled with said conductive resin composition.

2. A multilayer wiring board assembly comprising a plurality of multilayer wiring board assembly components each of which is constructed as set forth in claim 1 and are laminated and joined together.

3. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection,
wherein said through hole has a bore diameter at said conductive layer which is smaller than a bore diameter at said insulating substrate component and said adhesive layer, and wherein the portion of said through hole passing through said insulating substrate component, the portion of said through hole passing through said adhesive layer and the portion of said through hole passing through said conductive layer are filled with said conductive resin composition.

4. A multilayer wiring board assembly comprising a plurality of multilayer wiring board assembly components each of which is constructed as set forth in claim 3 and are laminated and joined together.

5. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection,
wherein said through hole has a bore diameter at said conductive layer which is smaller than a bore diameter at said insulating substrate component, and wherein the inner wall surface of said through hole at said insulating component portion has a curved profile as seen in a vertical cross section view.

6. A multilayer wiring board assembly comprising a plurality of multilayer wiring board assembly components each of which is constructed as set forth in claim 5 and are laminated and joined together.

7. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection,
wherein said through hole has a bore diameter at said conductive layer which is smaller than a bore diameter at said insulating substrate component and said adhesive layer, and wherein the inner wall surface of said through hole at said insulating component portion has a curved profile as seen in a vertical cross section view.

8. A multilayer wiring board assembly comprising a plurality of multilayer wiring board assembly components each of which is constructed as set forth in claim 7 are laminated and joined together.

9. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection,
wherein said through hole comprising an insulating layer through hole which is opened through said insulating component, at least one conductive layer through hole which is opened through said conductive layer in order to communicate with said insulating layer through hole, wherein the horizontal cross sectional area of said conductive layer through hole is smaller than the horizontal cross sectional area of said insulating layer through hole while the total area of the inner side wall of said conductive layer throughhole is larger than the horizontal cross sectional area of said conductive layer through hole, and
wherein both said insulating layer through hole and said conductive layer through hole are filled with said conductive resin composition.

10. A multilayer wiring board assembly comprising a plurality of multilayer wiring board assembly components each of which is constructed as set forth in claim 9 are laminated and joined together.

11. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole comprising an insulating layer through hole which is opened through said insulating component and said adhesive layer, at least one conductive layer through hole which is opened through said conductive layer in order to communicate with said insulating layer through hole, wherein the horizontal cross sectional area of said conductive layer through hole is smaller than the horizontal cross sectional area of said insulating layer through hole while the total area of the inner side wall of said conductive layer through hole is larger than the horizontal cross sectional area of said conductive layer through hole, and wherein both said insulating layer through hole and said conductive layer through hole are filled with said conductive resin composition.

12. A multilayer wiring board assembly comprising a plurality of multilayer wiring board assembly components each of which is constructed as set forth in claim 11 are laminated and joined together.

13. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole comprising an insulating layer through hole which is opened through said insulating component, at least one conductive layer through hole which is opened through said conductive layer in order to communicate with said insulating layer through hole, wherein said insulating layer through hole and said conductive layer through hole are filled with the conductive resin composition in order that the total contact area of said conductive resin composition with said conductive layer in the case where said conductive layer through hole is formed is larger than that in the case where the formation of said conductive layer through hole is dispensed with.

14. A multilayer wiring board assembly comprising a plurality of multilayer wiring board assembly components each of which is constructed as set forth in claim 13 are laminated and joined together.

15. A multilayer wiring board assembly component comprising: an insulating substrate component; a conductive layer formed on one surface of said insulating substrate component in the form of an electrode pattern; a through hole opened through said insulating component and said conductive layer and has a bore diameter at said conductive layer which is smaller than a bore diameter at said insulating substrate component; a conductive resin composition with which said through hole is filled in order to make interlayer interconnection; and a metallic layer formed on the surface of said conductive layer in order to cover said conductive resin composition exposed through an opening of said through hole in said conductive layer.

16. A multilayer wiring board assembly comprising a plurality of multilayer wiring board assembly components each of which is constructed as set forth in claim 15 are laminated and joined together.

17. A multilayer wiring board assembly comprising a plurality of multilayer wiring board assembly components which are laminated and joined together and each of which comprising: an insulating substrate component; a conductive layer formed on one surface of said insulating substrate component in the form of an electrode pattern; a through hole opened through said insulating component and said conductive layer and has a bore diameter at said conductive layer which is smaller than a bore diameter at said insulating substrate component; and a conductive resin composition with which said through hole is filled in order to make interlayer interconnection, wherein a metallic layer is formed on the surface of said conductive layer in order to cover said conductive resin composition exposed through an opening of at least the most outer through hole of the through holes of said insulating components in the corresponding the conductive layer.

18. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, wherein said conductive resin composition is composed of a resin binder, metal particles dispersed in said resin binder, and wherein the bore diameter of said through hole at said conductive layer is larger than the maximum diameter of said metal particles and smaller than three times the maximum diameter of said metal particles.

19. A multilayer wiring board assembly comprising a plurality of multilayer wiring board assembly components each of which is constructed as set forth in claim 18 are laminated and joined together.

20. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the bore diameter of said through hole at said conductive layer is larger than the maximum diameter of said metal particles and smaller than three times the maximum diameter of said metal particles.

21. A multilayer wiring board assembly comprising a plurality of multilayer wiring board assembly components each of which is constructed as set forth in claim 20 are laminated and joined together.

22. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is larger than 1/10 and smaller than 1/2 of a bore diameter at said insulating substrate component.

23. A multilayer wiring board assembly comprising a plurality of multilayer wiring board assembly components each of which is constructed as set forth in claim 22 are laminated and joined together.

24. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is larger than 1/10 and smaller than 1/2 of a bore diameter at said insulating substrate component.

25. A multilayer wiring board assembly comprising a plurality of multilayer wiring board assembly components each of which is constructed as set forth in claim 24 are laminated and joined together.

26. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, and wherein the center position of said through hole at said insulating component falls within said through hole at said conductive layer.

27. A multilayer wiring board assembly comprising a plurality of multilayer wiring board assembly components each of which is constructed as set forth in claim 26 are laminated and joined together.

28. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the center position of said through hole at said insulating component falls within said through hole at said conductive layer.

29. A multilayer wiring board assembly comprising a plurality of multilayer wiring board assembly components each of which is constructed as set forth in claim 28 are laminated and joined together.

30. A multilayer wiring board assembly component comprising: an insulating substrate component; a conductive layer formed on one surface of said insulating substrate component in the form of an electrode pattern; and a conductive resin composition with which is filled a through hole passing through said insulating substrate component and said conductive layer in order to make interlayer interconnection, wherein said through hole has a bore diameter at said conductive layer which is smaller than a bore diameter at said insulating substrate component, and wherein the bore diameter of said through hole at the surface of said conductive layer facing said insulating component is larger than the bore diameter of said through hole at the opposite surface of said conductive layer which is not facing said insulating component.

31. A multilayer wiring board assembly comprising a plurality of multilayer wiring board assembly components each of which is constructed as set forth in claim 30 are laminated and joined together.

32. A multilayer wiring board assembly component comprising: an insulating substrate component; a conductive layer formed on one surface of said insulating substrate component in the form of an electrode pattern; an adhesive layer formed on the other surface of said insulating substrate component; and a conductive resin composition with which is filled a through hole passing through said insulating substrate component, said adhesive layer and said conductive layer in order to make interlayer interconnection, wherein said through hole has a bore diameter at said conductive layer which is smaller than a bore diameter at said insulating substrate component and said adhesive layer, and wherein the bore diameter of said through hole at the surface of said conductive layer facing said insulating component is larger than the bore diameter of said through hole at the opposite surface of said conductive layer which is not facing said insulating component.

33. A multilayer wiring board assembly comprising a plurality of multilayer wiring board assembly components each of which is constructed as set forth in claim 32 are laminated and joined together.

34. A printed circuit board for use in a multilayer substrate in which interlayer interconnection is established by a conductive paste with which a via hole is filled, wherein a substrate electrode is provided and located in order to be aligned with said via hole, and wherein a small opening is opened in said substrate electrode as a tapered hole having a larger diameter at the surface of said substrate electrode than a diameter at said via hole.

35. A printed circuit board for use in a multilayer substrate in which interlayer interconnection is established by a conductive paste with which a via hole is filled, wherein a substrate electrode is provided and located in order to be aligned with said via hole; wherein a small opening is opened in said substrate electrode as a tapered hole having a larger diameter at the surface of said substrate electrode than a diameter at said via hole; wherein the surface of said substrate electrode is covered with a metallic layer; and wherein the surface location of said metallic layer corresponding to said small opening is made concave.

* * * * *